(12) United States Patent
Isogai et al.

(10) Patent No.: US 6,188,093 B1
(45) Date of Patent: Feb. 13, 2001

(54) PHOTOELECTRIC CONVERSION DEVICES AND PHOTOELECTRIC CONVERSION APPARATUS EMPLOYING THE SAME

(75) Inventors: Tadao Isogai; Satoshi Suzuki, both of Yokohama (JP)

(73) Assignee: Nikon Corporation, Tokyo (JP)

( * ) Notice: Under 35 U.S.C. 154(b), the term of this patent shall be extended for 0 days.

(21) Appl. No.: 09/146,323

(22) Filed: Sep. 2, 1998

(30) Foreign Application Priority Data

Sep. 2, 1997 (JP) .................................................... 9-237195
Sep. 13, 1997 (JP) .................................................... 9-268149

(51) Int. Cl.[7] ........................ H01L 27/148; H01L 31/068
(52) U.S. Cl. .......................... 257/230; 257/233; 257/258; 257/223; 257/292
(58) Field of Search .................................... 257/230, 233, 257/258, 223, 292

(56) References Cited

U.S. PATENT DOCUMENTS

| | | | |
|---|---|---|---|
| 4,942,474 | 7/1990 | Akimoto et al. | 358/213.11 |
| 5,043,783 | 8/1991 | Matsumoto et al. | 357/30 |
| 5,172,249 | 12/1992 | Hashimoto | 358/482 |
| 5,471,515 | 11/1995 | Fossum et al. | 377/60 |
| 5,625,210 | 4/1997 | Lee et al. | 257/292 |
| 5,844,264 | * 12/1998 | Shinji | 257/223 |
| 5,847,381 | * 12/1998 | Isogai | 257/292 |
| 5,942,774 | * 8/1999 | Isogai | 257/292 |
| 5,962,882 | * 8/1999 | Sin | 257/223 |

FOREIGN PATENT DOCUMENTS 8-033833   2/1996   (JP) .

OTHER PUBLICATIONS

U.S. application No. 08/606,995, filed Feb. 26, 1996.

Ishida et al., The Development of a 1.6 M Pixel Amplification Type Image Sensor BCAST, The Journal of the Institute of Image Information and Television Engineers, vol. 51, No. 2, 1997, pp. 211–218 (English Abstract and Figure Captions).

Shinohara et al., *Development of a Bipolar–type Area Sensor BASIS,* Video Information Industrial, the Video Information Editorial Dept., May 1989, pp. 41–56. (Translation attached of relevant portions as marked.).

* cited by examiner

*Primary Examiner*—Jerome Jackson, Jr.
(74) *Attorney, Agent, or Firm*—Klarquist Sparkman Campbell Leigh & Whinston LLP

(57) ABSTRACT

A photoelectric conversion device comprises a semiconductor substrate, a same-dopant-type semiconductor layer, a photodiode having a charge-accumulation region, a JFET (which has a gate region, a source region, a channel region, and a drain region, the drain region electrically connected to the substrate 100), a transfer gate for transferring a charge from the photodiode to the gate region, and a reset drain having a charge-drain region for draining excess charges generated by the photodiode, the reset drain also controlling the electric potential of the gate region. Two overflow-control regions are included, one at the boundary between the charge-accumulation region and the charge-drain region within the device, one at the boundary between the charge-accumulation region and the charge-drain region of an adjacent device. Two reset gates are also provided, one at the boundary between the JFET gate and the reset drain within a device and one at the boundary between the JFET gate and a reset drain of an adjacent device. The layer is preferably more lightly doped relative to the substrate, such that sensitivity to longer wavelengths is increased. When used as a pixel in a pixel matrix, the device (and each pixel) may be surrounded by filled trenches extending downward from the top surface of the layer. The trenches may be filled so as to decrease the resistance between the substrate and the layer, and so as to reduce or eliminate cross-talk between pixels.

17 Claims, 35 Drawing Sheets

PHOTOELECTRIC CONVERSION DEVICES AND PHOTOELECTRIC CONVERSION APPARATUS EMPLOYING THE SAME

FIELD OF THE INVENTION

The present invention relates to photoelectric conversion devices and photoelectric conversion apparatus employing such photoelectric conversion devices. More particularly, the invention pertains to photoelectric conversion devices and photoelectric conversion apparatus designed both for high production yield, even in apparatus with large numbers of pixels, and for increased performance, such as increased signal-to-noise ratio and increased sensitivity, particularly to longer wavelengths.

BACKGROUND

Amplifying photoelectric conversion devices increase the sensitivity of the photoelectric conversion process by amplifying, within each pixel, the signal generated by each pixel.

FIGS. 45 through 48 are schematic diagrams showing a conventional photoelectric conversion device, as disclosed in Ishida et al., "The Development of 1.6 Million-pixel Amplification Type Image Sensor BCAST," *The Journal of the Institute of Image Information and Television Engineers* (*Japan*), Vol. 51, No. 2, pp. 211–218 (1997). FIG. 45 is a plan view; FIG. 46 is a cross-sectional view taken along the X1-X2 line shown in FIG. 45; FIG. 47 is a cross-sectional view taken along the Y1-Y2 line of FIG. 45; and FIG. 48 is a cross-sectional view taken along the Y3-Y4 line of FIG. 45.

As shown in FIGS. 45 through 48, this conventional photoelectric conversion device includes a photodiode 1 for generating and accumulating an electric charge (hereinafter referred to simply as a charge) in response to incident light. A junction field-effect transistor (JFET) 2 receives (at the gate region thereof) the charge from the photodiode 1 and amplifies and outputs the charge. A transfer gate 3 transfers the charge generated and accumulated in the photodiode 1 to the gate region of the JFET 2. A reset drain 4 controls the electric potential of the gate region of the JFET 2. A reset gate 5 controls the electrical connection between the gate region of the JFET 2 and the reset drain 4.

The photodiode 1, the JFET 2, and the reset drain 4 are formed in an N-type well region 11 formed on a P-type semiconductor substrate 10. The transfer gate 3 and the reset gate 5 are formed above the N-type well region 11, separated from the N-type well region 11 by an insulating film.

As shown in FIGS. 47 and 48, the photodiode 1 has a P-type charge-accumulation region 12 formed in the N-type well region 11 on the P-type semiconductor substrate 10, and a high-density N-type semiconductor layer 13 formed on the P-type charge-accumulation region 12 and near the top surface of the semiconductor. Thus a buried photodiode having an NPNP vertical overflow drain structure (or more precisely, an NPN buried photodiode, and a PNP overflow drain) is formed, as considered in the direction from the semiconductor surface toward the semiconductor substrate 10.

The JFET 2 has a P-type gate region 15 formed in the N-type well region 11. The JFET 2 also has an N-type source region 14 and an N-type channel region 17, both of which are formed in the P-type gate region 15. The JFET 2 further has an N-type drain region 16, formed opposite the source region 14 with the channel region 17 between, as shown in FIGS. 46 and 47.

As shown in FIG. 45, the N-type drain region 16 of the JFET 2 extends around the entire photoelectric conversion device, and it thus becomes the boundary region between any two adjacent photoelectric conversion devices. The N-type drain region 16 is continuous with the high-density N-type semiconductor layer 13 lying near the top surface of the photodiode 1 and the N-type well region 11, as shown in FIGS. 46 through 48. Accordingly, the N-type regions 11 and 13, in the PN junction which constitutes the photodiode 1, are electrically connected to the N-type drain region 16 of the JFET 2.

The P-type gate region 15 of the JFET 2 sandwiches the N-type channel region 17 from above and below. This structure can reduce the substrate-bias effect, and can increase the gain of the source follower action, while reducing variation in the gain.

The transfer gate 3 consists of a gate electrode positioned above the boundary between the P-type charge-accumulation region 12 and the P-type gate region 15 of the JFET 2, and separated from the boundary by an insulating film, as shown in FIG. 47. The transfer gate 3 transfers the charge accumulated in the P-type charge-accumulation region 12 of the photodiode 1 to the P-type gate region 15 of the JFET 2.

Thus, the P-type charge-accumulation region 12, the transfer gate 3, and the P-type gate region 15 of the JFET 2 together constitute a P-channel MOS transistor.

The reset drain 4 has a P-type charge-drain region 18 formed in the N-type well region 11, as shown in FIGS. 46 and 48. The reset drain 4 controls the electric potential of the P-type gate region 15 of the JFET 2 via the reset gate 5.

The reset gate 5 consists of a gate electrode positioned above the boundary between the P-type gate region 15 of the JFET 2 and the P-type charge-drain region 18. The gate electrode is separated from the boundary region by an insulating film, as shown in FIG. 46. The reset gate 5 controls the electrical connection between the P-type gate region 15 of the JFET 2 and the P-type charge-drain region 18 of the reset drain 4.

The P-type gate 15 of the JFET 2, the reset gate 5, and the P-type charge-drain region 18 of the reset drain 4 together constitute a P-channel MOS transistor.

The conventional photoelectric conversion device also has a transfer gate interconnection 20, a reset gate interconnection 21, a relay interconnection 23, a reset drain interconnection 24, a vertical signal line 22, and a drain interconnection 25, as shown in the figures.

FIGS. 49 through 52 illustrate a portion of a conventional photoelectric conversion apparatus that uses the photoelectric conversion device(s) of FIGS. 45–48 as pixels arranged in a matrix. FIG. 49 is a plan view; FIG. 50 is a cross-sectional view taken along the X1-X2 line shown in FIG. 49; FIG. 51 is a cross-sectional view taken along the Y1-Y2 line shown in FIG. 49; and FIG. 52 is a cross-sectional view taken along the Y3-Y4 line shown in FIG. 49.

In this conventional photoelectric conversion apparatus, the N-type source regions 14 of the JFETs 2 in each column of the pixel matrix are connected in common to the associated vertical signal line 22 in the vertical scanning direction.

The N-type drain regions 16 of the JFETs 2 of each pixel are continuous around the pixels and from pixel to pixel, extending like a lattice surrounding the pixels, as shown in FIG. 49. The N-type drain regions 16 of each column are each connected in common, in the vertical scanning direction, to the associated drain interconnection 25 via a contact hole 32 (FIG. 49) formed in the interlayer insulating film 33 (FIG. 50). The drain interconnections 25 are connected in common to another interconnection (not shown) at the top end and at the bottom end of the pixel matrix.

The drain interconnections 25 are formed for the purpose of supporting or reinforcing the diffusion layer of the N-type drain regions 16 with metal interconnections in order to reduce (or shunt) the resistance, and they are required for a photoelectric conversion apparatus having a sufficiently large number of pixels (for example, 500 to 1000 pixels in both the horizontal and vertical directions). If the number of pixels is relatively small, the drain interconnections 25 may be omitted.

As shown in FIG. 49, the transfer gates 3 in each row are connected in common, in the horizontal scanning direction, to the associated transfer gate interconnection 20. The reset gates 5 in each row are similarly connected in common, also in the horizontal scanning direction, to the associated reset gate interconnection 21.

As shown in FIGS. 50 and 52, the charge-drain regions 18 of the reset drains 4 in each row are connected in common, in the horizontal scanning direction, to the associated reset drain interconnection 24. This connection is made for each charge-drain region 18 via a contact hole 30 formed in the interlayer insulating film 33, a relay interconnection 23, and a relay interconnection hole 31. The reset drain interconnection 24 also functions as a light-blocking layer for blocking light incident to areas other than the photodiode 1 (FIG. 49).

FIG. 53 is a circuit diagram of the conventional photoelectric conversion apparatus. An individual photoelectric conversion device includes the circuit elements within the broken line in FIG. 53. Each photoelectric conversion device, which functions as a pixel, comprises a photodiode 1, a JFET 2, a transfer gate 3, a reset drain 4, and a reset gate 5. The N-type region of the photodiode 1 is connected to the drain region D of the JFET 2, as shown in FIGS. 45 through 48. The P-type charge-accumulation region 12 of the photodiode 1, the transfer gate 3, and the gate region 15 of the JFET 2 together constitute a P-channel MOS transistor. The gate region 15 of the JFET 2, the reset gate 5, and the reset drain 4 together likewise constitute a P-channel MOS transistor.

Although not shown in FIG. 53, the photodiode 1, as explained above, has a vertical overflow drain structure that functions to allow any excess charge to overflow to the P-type semiconductor substrate.

The source regions S of the JFETs 2 in each column of the pixel matrix are connected in common to one of the vertical signal lines 22a–22d.

The drain regions D of the JFETs 2 of all the pixels are connected in common to the drain voltage source VD by the N-type diffusion layer, formed in a lattice as shown in FIGS. 49 through 52, which becomes the N-type drain region 16, and by the drain interconnections 25 (FIGS. 49 and 50).

The transfer gates 3 in each row are each connected in common, in the horizontal scanning direction, to a respective one of the transfer gate interconnections 20a–20c which are connected to a vertical scanning circuit 7. The vertical scanning circuit 7 supplies driving pulses φTG1–φTG3 respectively to the transfer gate interconnections 20a–20c, each of the driving pulses φTG1–φTG3 thus activating all of the transfer gates 3 in a respective row.

The reset gates 5 in each row are connected in common, in the horizontal scanning direction, to a respective one of the reset gate interconnections 21a–21c, which in turn are connected in common at the left and right ends of the pixel matrix. (Only the left end is shown in FIG. 53.) Accordingly, all the reset gates are activated at the same time by a driving pulse φRG.

The reset drains 4 in each row are connected in common, in the horizontal scanning direction, to a respective one of the reset drain interconnections 24a–24c, which are connected to the vertical scanning circuit 7. The vertical scanning circuit 7 supplies driving pulses φRD1–φRD3, respectively, to the reset drain interconnections 24a–24c, each pulse activating the reset drains 4 in a respective row.

The sources S of the JFETs 2 in each column are connected in common to a respective one of the vertical signal lines 22a–22d. Each of the vertical signal lines 22a–22d is connected at one end to a respective one of the photosignal output storage capacitors CS1–CS4 via a respective one of the associated photosignal output transfer MOS transistors TS1–TS4. The capacitors CS1–CS4 are connected, along with the outputs of the output transfer MOS transistors TS1–TS4, to a horizontal signal line (i.e., the signal output line) 27a, via a respective one of the horizontal selection MOS transistors THS1–THS4.

Each of the vertical signal lines 22a–22d is also connected, at the same one end, to a respective one of the dark-output storage capacitors CD1–CD4, via a respective one of the dark-output transfer MOS transistors TD1–TD4. The dark-output storage capacitors CD1–CD4 and the dark-output transfer MOS transistors TD1–TD4 are further connected to a horizontal signal line (i.e., the dark output line) 27b, via a respective one of the horizontal selection MOS transistors THD1–THD4.

The MOS transistors TS1–TS4 and the MOS transistors TD1–TD4 are activated respectively by driving pulses φTS and φTD. A horizontal scanning circuit 8 supplies driving pulses φH1–φH4, which activate the MOS transistors THS1–THS4, respectively, and, in parallel, the MOS transistors THD1–THD4, respectively.

The horizontal signal lines 27a and 27b are connected respectively to the output buffer amplifiers 28a and 28b, and to the horizontal signal line reset MOS transistors TRHS and TRHD. The reset MOS transistors TRHS and TRHD are activated by a driving pulse φRH. The horizontal signal lines 27a and 27b have parasitic capacitances CHS and CHD, respectively.

The vertical signal lines 22a–22d are also connected respectively to the vertical signal line reset MOS transistors TRV1–TRV4, and to the constant-current sources 26a–26d that are in turn connected to a low-potential voltage source VCS. The reset MOS transistors TRV1–TRV4 for the vertical signal lines 22a–22d are activated by a driving pulse φRV.

FIG. 54 is a timing chart showing the operation of the conventional photoelectric conversion apparatus shown in FIG. 53. Since the transfer gate 3 and the reset gate 5 of each photoelectric conversion device (each unit pixel of the apparatus) are of the P-channel-type as shown in FIGS. 45 through 48, the polarities of the driving pulses φTG1–φTG3 and the driving pulse φRG are opposite to the polarities of the rest of the pulses. Accordingly, when the pulses φTG1–φTG3 and φRG are at a low level, the associated transfer gates 3 and the reset gates 5 are in the connected state (ON state); when these pulses are at a high level, the transfer gates 3 and the reset gates 5 are in the disconnected state (OFF state).

In FIG. 54, the periods t11 through t15 show the readout operation for the first-row pixels. The periods t21 through t25 are for the second-row pixels. The periods t31 through t35 are for the third-row pixels.

In the interval t11, a current (i.e., the first) row is selected and the JFETs 2 of the first row are initialized. In the interval t12, source-follower action occurs, based on charge present at the gates of the first-row JFETS 2 after initialization. In the interval t13, signal charges are transferred from the first-row photodiodes 1 to the associated JFETs 2. In interval t14, source-follower action occurs based on the charges present at the gates of the first-row JFETS 2 after the signal charges are transferred to the first-row JFETs 2. These four operations (in t11 through t14) are performed within the period of a horizontal retrace line. In interval t15, a video signal is output.

More specifically, at the beginning of t11, the driving pulse φRD1 is raised to a high level, while the driving pulses φRD2 and φRD3 are kept at a low level, whereby a high-level voltage is applied to the reset drains 4 of the first-row pixels, and a low level voltage is applied to the reset drains 4 of the second-row and third-row pixels. At this time (t11), driving pulse φRG is and has been low, and the reset gates 5 of all the pixels are and have been in the ON state (i.e., connected state). Accordingly, the high-level voltage is transferred to the gate regions of the JFETs 2 of the first-row pixels, while the low-level voltage is transferred to the gate regions of the JFETs 2 of the second-row and third-row pixels, via the reset gates 5. As a result, the first-row JFETs 2 are turned on (that is, selected), and the JFETs 2 of the second and later rows are turned off (that is, not selected).

At the end of t11, the driving pulse φRG is raised to the high level, and the reset gates 5 of all the pixels are shut off, whereby the gate regions of the JFETs 2 of each row are placed into a floating state, while maintaining their respective ON (i.e., selected) or OFF (i.e., non-selected) states. In other words, the gate regions of the JFETs 2 of the selected row (i.e., the first row in this case) are reset to the high-level initial state, and the gate regions of the JFETs 2 of the non-selected rows are reset to the low-level initial state.

At the beginning of t12, the driving pulse φRV is changed to the low level, and the reset transistors TRV1–TRV4 are turned off, which causes the first-row JFETs 2 to perform a source-follower action. In the interval t12, the driving pulse φTD is kept at the high level, and the dark-output transfer MOS transistors TD1–TD4 are in the ON state (i.e., the connected state). Consequently, the initialized voltages (i.e., dark-output voltages), which represent the electric potentials of the gate regions of the JFETs 2 immediately after the initialization, are supplied to the dark-output storage capacitors CD1–CD4.

At the beginning of t13, the driving pulse φTG1 is changed to the low level, while the driving pulses φTG2 and TG3 are kept at the high level, whereby the transfer gates 3 of the first-row pixels are turned on. Signal charges generated and accumulated in the photodiodes 1 of the first-row pixels are thus transferred to the gate regions of the first-row JFETs 2. The voltage of the gate region of each first-row JFET 2 changes, immediately after the charge transfer, by an amount represented by the fraction: (transferred signal charge)/(gate capacitance). In this example, the voltage increases.

At the end of t13, the driving pulse φTGL is raised to the high level, and the transfer gates 5 are turned off, whereby the first-row photodiodes 1 start generating and accumulating new signal charges by photoelectric conversion. In FIG. 54, tLI indicates the charge-accumulation time of the photodiode.

At the beginning of t14, as at t12, the driving pulse φRV is changed to the low level, and the reset transistors TRV1–TRV4 are turned off, which causes the first-row JFETs 2 to perform source-follower action. In the interval t14, the driving pulse φTS is kept at the high level, and the photosignal output transfer MOS transistors TS1–TS4 are in the ON state (i.e., the connected state). Consequently, output voltages, which represent the electric potentials of the gate regions of the JFETs 2 after the receipt of the transferred charges, are supplied to the photosignal output storage capacitors CS1–CS4.

The constant-current sources 26a–26d apply a load to the JFETs 2 in the intervals t12 and t14 in order to control the activation points and the operation speeds of the JFETs 2.

The charge-amplification rate of the source-follower action is defined by the ratio of the photosignal output storage capacitance CS (of the respective output storage capacitor) to the gate capacitance Cg of each JFET 2 (CS/Cg), and it is possible to obtain an amplification rate as high as several hundred to one thousand or more.

Because the source-follower action of the JFETs of this conventional example are performed row-by-row within a horizontal-retrace-line period, the amplification time can be increased as compared with a photoelectric conversion apparatus in which the charge is amplified pixel-by-pixel in synchrony with the horizontal scanning based on, for example, the driving pulses φH1–φH4. Consequently, the capacitance of the photosignal output storage capacitors CS1–CS4 and the dark-output storage capacitors CD1–CD4 can be made larger, which can narrow the operational bandwidth of the source-follower action by a factor of $\frac{1}{10}$ to $\frac{1}{100}$. Thus, the noise due to amplification can be substantially reduced.

At t15, the horizontal scanning circuit 8 outputs driving pulses φH1–φH4 successively, which cause the charges accumulated in the photosignal output storage capacitors CS1–CS4, and in the dark-output storage capacitors CD1–CD4, to be transferred to the horizontal signal line 27a (the photosignal output line), and to the horizontal signal line 27b (the dark-output line), respectively. The potential of these lines 27a and 27b are output, via the output buffer amplifiers 28a and 28b, from output terminals VOS and VOD as video signals. The driving pulse φRH is triggered successively in order to reset the horizontal signal lines 27a and 27b.

The video signals obtained from the output terminals VOS and VOD are subjected to a subtraction operation by an external arithmetic unit (not shown) in order to remove the dark component. In other words, the video signal output from the output terminal VOD, which contains only a dark component, is subtracted from the video signal output from the output terminal VOS, which contains a photosignal component and a dark component. As a result of this substraction (VOS−VOD), a video signal representing only the photosignal component can be extracted.

The dark component contained in both VOS and VOD includes a fixed-pattern noise component due to variation of the threshold voltage of each JFET 2, a reset noise component generated in the channel region under the reset gate 5 when the gate region of each JFET 2 is reset (or initialized) via the reset drain 4 and the reset gate 5, and a 1/f noise component generated during the source-follower action by the JFET 2 and the constant-current sources 26a–26d.

By subtracting VOD from VOS, the noise components listed above are removed, and a video signal containing only a photosignal component can be obtained, and the S/N ratio is improved.

The readout operation for the first pixel row during the periods t11 through t15 is repeated for the second and third pixel rows in the periods t21 through t25 and t31 through t35, respectively.

The photoelectric conversion apparatus shown in FIGS. 49 through 53 employs a plurality of conventional photoelectric conversion devices (shown in FIGS. 45 through 48) arranged in a matrix. Each device has a vertical overflow drain structure, and employs a buried photodiode. Therefore, dark current, afterimage, reset noise, blooming, and smear are reduced. In addition, the narrow-bandwidth source-follower action of the JFET 2, using the photosignal output storage capacitance and the dark-output storage capacitance as a load, can increase the charge-amplification rate, while reducing the noise during the amplification process. The subtraction of VOD from VOS can reduce the fixed-pattern noise component due to the variation of the threshold voltage of each JFET 2, the reset noise component generated when the gate region of each JFET 2 is reset (or initialized), and the 1/f noise component generated during the source-follower action.

The conventional photoelectric conversion apparatus shown in FIGS. 49 through 53 thus has the advantage that a highly sensitive video signal can be obtained with a reduced noise component (i.e., an improved S/N ratio). However, this conventional photoelectric conversion apparatus, using the photoelectric conversion devices shown in FIGS. 45–48 arranged in a matrix, has the disadvantage that the production yield is low.

In the conventional photoelectric conversion apparatus shown in FIGS. 49–52, drain interconnections 25 are formed for the purpose of preventing the drain voltages applied to the JFETs 2 from varying excessively among the pixels. If drain interconnections are not used, and a drain voltage is applied to the JFET 2 of each pixel only from the periphery of the pixel matrix via the diffusion layer that becomes the drain region 16, a potential drop occurs due to significant parasitic resistance, causing the drain voltage applied to the JFETs 2 to vary excessively among the pixels.

The drain interconnections 25 and the vertical signal lines 22 are formed in the same manufacturing process step. First, a metal layer, which is the material of the interconnection, is deposited. Then, vertical signal lines 22 and drain interconnections 25 are formed by a photolithography/etching process including a pattern-transfer step and an etching step. The two types of lines are formed in the vertical scanning direction (that is, the vertical direction in FIG. 49), parallel to each other, with a relatively narrow gap between any two adjacent lines. Accordingly, a particle whose size is equal to or greater than the gap between the lines may adhere to adjacent lines during the photolithography/etching process. If such a particle adheres, two adjacent lines are connected to each other, and a short-circuit mode malfunction occurs, which causes the production yield to drop.

Furthermore, the charge-drain region 18 of the reset drain 4 is connected to the reset drain interconnection 24 via a contact hole 30, a relay interconnection 23, and a relay connection hole 31, all of which are formed in the interlayer insulating film 33. This structure is made by repeating photolithography/etching steps and the steps of depositing an insulating film and a metal layer. During these steps, a particle whose size is greater than the diameter of the contact hole 30 or the relay connection hole 31 may adhere to the sides of the contact hole 30 or the relay interconnection hole 31. In this case, the electrical connection between the reset drain 4 and the reset drain interconnection 24 is damaged by the attached particle, which causes an open-mode malfunction.

An open-mode malfunction prevents the JFET 2 from being properly controlled. In such a malfunction, the JFET 2, which is normally ON, keeps on supplying pseudo signals from its source region to the vertical signal line 22. In other words, if a faulty electrical connection to the reset drain 4 occurs even at a single point, not only the corresponding pixel, but also the entire column of pixels including the corresponding pixel in which the faulty connection occurred, generates defective video signals, causing a defective vertical line in the resultant image. This open-mode defect also results in decreased production yield.

These two different types of defects become significant as the number of photoelectric conversion devices arranged in the matrix increases. Especially, if 500 to 1000 or more pixels are aligned in both the horizontal and vertical directions in a photoelectric conversion apparatus, these defects cause the production yield to drop significantly.

Another example of a known solid-state image sensor is disclosed in Shinohara et al., "Development of a Bipolar-type Area Sensor BASIS", published in *VIDEO INFORMATION INDUSTRIAL*, the Video Information Editorial Dept., Sangyo Kaihatsu Kikou Kabushiki Kaisya, May 1989, pp. 41–46. This bipolar solid-state image sensor will be briefly explained with reference to FIGS. 55 through 59. FIG. 55 is a schematic plan view of this solid-state image sensor. FIG. 56 is a cross-sectional view taken along the X11-X12 line shown in FIG. 55. FIG. 57 is a cross-sectional view taken along the X13-X14 line shown in FIG. 55. FIG. 58 is a cross-sectional view taken along the Y11-Y12 line shown in FIG. 55. FIG. 59 is a circuit diagram showing the basic structures of the pixel and the readout circuit of the solid-state image sensor. In FIG. 58, only a single pixel is illustrated.

The conventional bipolar solid-state image sensor shown in FIGS. 55 through 58 has a base consisting of a high-density (high dopant density) N-type semiconductor substrate 301 and a low-density epitaxial layer (N-type semiconductor layer 302). Multiple pixels are arranged in a two-dimensional matrix, together with associated readout circuits, in and on the base.

As shown in FIG. 59, each pixel comprises an npn-type bipolar transistor Tr, a PMOSFET 303, and a capacitor Cox formed on the bipolar transistor Tr.

Each readout circuit includes a capacitor Ct for temporarily storing a voltage output from the emitter of the bipolar transistor Tr. A transfer MOSFET 304, controlled by a driving pulse φT, connects the capacitor Ct to a vertical output line VL. A reset MOSFET 305 resets the vertical output line VL.

The operation of the pixel consists of a charge-accumulation step, a readout step, and a reset step.

At the end of the reset step, when a reverse bias has been applied between the base and the emitter of the bipolar transistor Tr, charge-accumulation starts. As holes generated in response to incident light are accumulated in the base region of the bipolar transistor Tr, the base voltage VB rises, and the depletion layer between the base and the collector of the bipolar transistor Tr decreases.

Next, the reset MOSFET 305 is turned off, whereby the emitter of the bipolar transistor Tr is placed in a floating state. The driving pulse φR of the horizontal driving line HL is then raised to the positive level, thus raising the base voltage in the positive direction by capacitive coupling via the capacitor Cox. Thus a forward bias is applied between the base and the emitter of the bipolar transistor Tr. At this point in time, the readout action starts.

The emitter voltage VE, which has a capacitive load, approaches the base voltage until the potential difference reaches a certain value by the end of readout action. The change of the base voltage during the charge-accumulation step is thus reflected at the emitter terminal of the bipolar transistor Tr.

The reset step includes a pair of reset actions. The first reset action comprises turning on the PMOSFET 303 by setting the driving pulse φR low. This grounds the base of the bipolar transistor Tr. The second reset action comprises setting the driving pulse φVC to positive, and grounding the emitter of the bipolar transistor Tr while raising the driving pulse φR to the positive. As a result, the base of the bipolar transistor Tr is raised to positive, a forward bias is applied between the base and the emitter, and the base potential drops due to the recombination of electrons and holes. When the voltage φR returns to the ground level, the reset action terminates, and the next charge-accumulation starts.

FIGS. 55 through 58 illustrate the pixel structure of the conventional solid-state image sensor. The bipolar transistor Tr comprises a P-type diffusion region 306, which functions as the base, a high-density N-type diffusion region 307, which functions as the emitter, and an N-type semiconductor substrate 301 and an N-type semiconductor layer 302, which constitute a collector. A metal layer 308 is formed as a collector electrode on the bottom surface of the substrate 301. Accordingly, the bipolar transistor Tr is a device that is activated by a voltage applied from the metal layer 308, via the high-density N-type semiconductor substrate 301 and the low-density N-type semiconductor layer 302, in that order.

The pixel structure also includes a polysilicon relay interconnection 309 from high-density N-type diffusion region 307 to an Al (aluminum) interconnection 310 (which interconnection corresponds to the vertical output line VL). A high-density N-type diffusion region 311, positioned between any two adjacent pixels, functions as a pixel-separating region. A polysilicon interconnection 312 (corresponding to the horizontal driving line HL) drives the P-type diffusion region 306 (the base of the bipolar transistor Tr of each pixel) by capacitive coupling across an oxide-film capacitor Cox.

The polysilicon interconnection 312 also functions as the gate electrode of the PMOSFET 303. The PMOSPET 303 is positioned in the pixel boundary, and the polysilicon interconnection 312 becomes the gate of the PMOSFET 303.

The Al interconnection 310 is placed above the polysilicon interconnection 312 in order to block incident light. If the gate (i.e., the polysilicon interconnection 312) of the PMOSFET 303 is turned on, the bases (i.e., the P-type diffusion layers 306) of adjacent bipolar transistors Tr are electrically connected. If the gate of the PMOSFET 303 is turned off, the N-type diffusion region 311 functions as a pixel-separating region. A portion of the polysilicon interconnection 312 which overlaps the P-type diffusion region 306 (i.e., the base of the bipolar transistor Tr) forms part of the capacitor Cox. Isolating regions are formed by an SiO2 film 313 and a LOCOS 314.

As has been mentioned earlier, in the conventional bipolar solid-state image sensor, the bipolar transistor Tr is activated by a voltage applied via the high-density N-type semiconductor substrate 301 and the low-density semiconductor layer 302, in this order.

Only N-type diffusion regions 311 are formed between adjacent pixels in order to separate these pixels. Although the N-type diffusion region 311 can reduce the crosstalk between two adjacent pixels, such reduction requires the use of the low-density N-type semiconductor layer 302. The low-density N-type semiconductor layer 302 has a high resistance which negatively affects activation of the transistor Tr by a voltage applied via the high-density N-type semiconductor substrate 301 and the low-density semiconductor layer 302.

Further, in the conventional bipolar solid-state image sensor, in order to spread the detection sensitivity toward the long wavelength side, the impurity concentration of the N-type semiconductor layer 302 must be decreased, and the thickness of the depletion layer between the P-type base (i.e., P-type diffusion layer 306) and the N-type collector (i.e., N-type semiconductor layer 302) must be increased. However, because of the reduced impurity concentration of the N-type semiconductor layer 302, the resistance of this N-type layer becomes high, and the voltage supplied from the N-type semiconductor substrate 301 is not sufficiently transferred through the N-type semiconductor layer 302. This degrades the performance of the bipolar transistor Tr and increases the variation in the production process, decreasing production yield. As a whole, the quality of the solid-state image sensor deteriorates.

This situation applies not only to the bipolar solid-state image sensor shown in FIGS. 55 through 59, but also to any solid-state image sensor that has a base consisting of a first conductive-type higher-density semiconductor substrate and a first conductive-type lower-density semiconductor layer formed on the substrate, with a pixel matrix in and on the base, with each pixel including a device to which a voltage is applied via the semiconductor substrate and the semiconductor layer, in that order.

In a solid-state image sensor, the impurity concentration of the first conductive-type semiconductor layer may need to be decreased for various reasons, in addition to increasing the sensitivity to long wavelengths and decreasing cross-talk between pixels.

SUMMARY OF THE INVENTION

The present invention was conceived in order to overcome the above problems in the conventional art. It is an object of the invention to provide photoelectric conversion apparatus with both high performance (including but not limited to increased sensitivity to long wavelengths, high signal-to-noise ratio, high resistance to effects of excess charge, cross-talk, etc.) and high production yield.

In order to achieve these objects, a photoelectric conversion device according to the invention includes at least (1) a photodiode for generating and storing a charge (a signal charge) in response to incident light; (2) a junction field-effect transistor (JFET) for receiving the signal charge from the diode and amplifying the signal charge, and (3) a reset drain structured and arranged so as to reset the JFET and so as to drain excess charge from the photodiode. Using the reset drain as the overflow drain frees the substrate for use as a signal conduit, instead of as an overflow drain alone. The substrate is preferably used as a part of the path by which a drain voltage is applied to the JFET. This eliminates the need for a drain interconnection to the JFET in a large pixel array, thereby allowing improved yield and aperture ratio.

The photodiode is preferably a buried type photodiode, with a buried lateral overflow-control region for conducting excess charge to the reset drain. The buried photodiode provides a low-noise, low dark-current, and high performance photoelectric conversion device.

The device preferably comprises two overflow-control regions, positioned such that when multiple devices are arranged in a matrix in a photoelectric conversion apparatus, the first overflow-control region guides excess charge in the device to the reset drain within the device, while the second overflow-control region guides excess charge in the device to a reset drain in an adjacent device within the same column.

In a matrix of devices, the reset drains and the photodiodes alternate in the vertical (column) direction, with each adjacent reset drain/photodiode pair linked by an overflow-control region. Thus dual-channel overflow protection is provided in every device. Overflow protection is thus more reliable and may be provided, for a given device, through the reset drains of adjacent devices, if an open-mode defect or other defect occurs.

Overflow protection is also available even when the reset drain of a particular device is set high. Overflow protection is thus provided without reliance upon the substrate for a vertical overflow-protection structure, allowing use of a conductive-type semiconductor substrate opposite the charge-generation region, with a resulting decrease in leakage to the substrate. The substrate is also available for use as a signal conduit, as mentioned above, rather than merely an overflow conduit.

Each device preferably also includes two reset gates positioned such that when multiple devices are arranged in a matrix in a photoelectric conversion apparatus, the first reset gate is positioned and arranged so as to electrically connect the JFET of a device to the reset drain of that device, and the second reset gate is positioned and arranged so as to electrically connect the JFET of that device to the reset drain of an adjacent device within the same row. The reset drains and JFETS preferably alternate along a row, with reset gates linking each adjacent reset drain/JFET pair.

Linking the reset drains and JFETs along a row allows control of the reset voltage of a given JFET (of a given JFET gate) even if an open-mode defect occurs at that JFET. Such linking also allows the use of fewer connecting holes connecting the reset drains to the rest drain interconnect in a pixel matrix. One connecting hole for every 2–20 reset drains within a row allows increased production yield without any reduction in performance.

The device of the invention may also include filled trenches in the spaces between devices in a pixel array. The trenches may be used in combination with pixels formed in a base comprising a higher-density semiconductor substrate with a lower-density semiconductor layer formed thereon.

The trenches may be filled with material, as will described below, such that (1) resistance decreases between the higher-density semiconductor substrate and the lower density semiconductor layer formed thereon, and (2) cross-talk between pixels decreases. The reduced resistance allows the substrate to adequately convey to the JFET drain a voltage applied to the substrate. The reduced cross-talk provides an improved, more noise-free signal. The use of a lower-density semiconductor layer allows greater sensitivity to longer wavelengths.

The preferred method of making the trenches includes a CMP step to remove fill material from above the trench.

The above and other objects, features, and advantages of the present invention will be apparent from the detailed description given below by way of non-limiting exemplary embodiments of the present invention, with reference to the following drawings:

DETAILED DESCRIPTION

Figure 1:
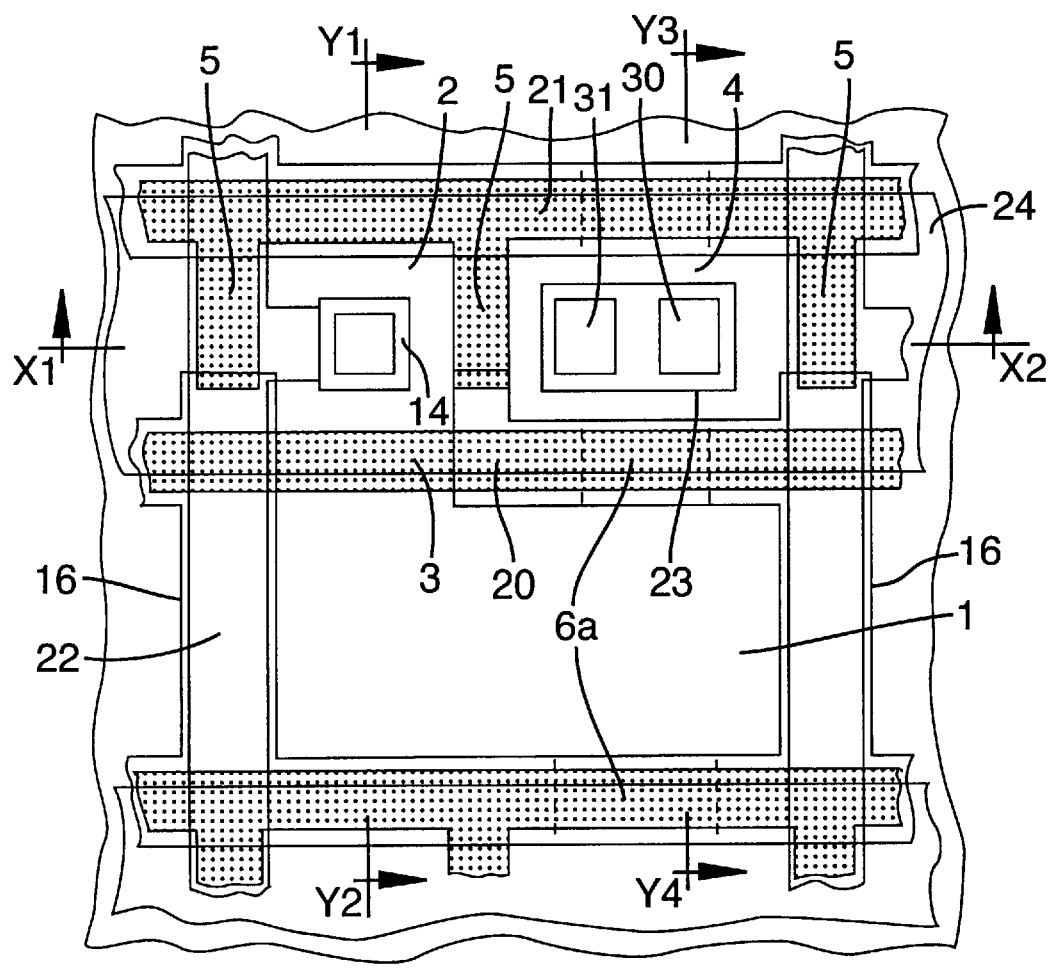
FIG. 1 is a plan view of a photoelectric conversion device of a first illustrative embodiment of the invention.

A photoelectric conversion device according to the invention generally includes a first conductive-type semiconductor substrate and a first conductive-type semiconductor layer formed on the substrate. The photoelectric conversion device also comprises a photodiode and a junction field-effect transistor (JFET). The photodiode generates and accumulates an electric charge in response to incident light. The JFET receives the electric charge generated by the photodiode at a gate region of the JFET, and outputs a signal corresponding to this electric charge received at the gate region.

The photoelectric conversion device also comprises a transfer gate, a reset drain, an overflow-control region, and a reset gate. The transfer gate has a gate electrode formed above the first conductive-type semiconductor layer separated therefrom by an insulating film. The transfer gate transfers the electric charge generated and accumulated by the photodiode to the gate region of the JFET.

The reset drain has a second conductive-type charge-drain region formed in the first conductive-type semiconductor layer. The reset drain controls the electric potential of the gate region of the JFET and also drains excess electric charge generated by the photodiode.

The overflow-control region is formed in a boundary region between a charge-accumulation region of the photodiode and the charge-drain region of the reset drain in the first conductive-type semiconductor layer. The overflow-control region guides the excess electric charge generated by the photodiode to the charge-drain region of the reset drain.

The reset gate has a gate electrode formed above the first conductive-type semiconductor layer and separated therefrom via an insulating film. The reset gate controls the electrical connection between the gate region of the JFET and the charge-drain region of the reset drain.

The portion of the device along a direction upward from within the semiconductor substrate to the drain region of the JFET is made of the same conductive-type semiconductor, and the elements included in this portion are electrically connected with each other.

If multiple photoelectric conversion devices are arranged in a matrix in order to form a photoelectric conversion apparatus, and if a drain electrode is formed over the rear surface of the semiconductor substrate, then a drain voltage can be supplied from this drain electrode to all of the JFETs, via the semiconductor substrate. This arrangement can eliminate the drain interconnection while greatly reducing parasitic resistance. As a result, malfunctions caused by short circuits between the drain interconnection and the vertical signal lines are obviated, and production yield is increased.

The photodiode has a lateral overflow drain structure, i.e., the reset drain for draining the excessive charge generated by the photodiode, and the overflow-control region for guiding the excessive charge to the reset drain, are aligned in the lateral direction (the direction parallel to the surface of the semiconductor substrate). This arrangement can reduce blur, including blooming and smear.

According to one aspect of the invention, the first conductive-type semiconductor substrate may be a high-density first conductive-type semiconductor substrate. A voltage drop due to parasitic resistance can thus be avoided. With a pixel matrix consisting of a matrix of photoelectric conversion devices, even if a drain voltage is supplied to each of the JFETs from a drain electrode formed around (at the edges of) the matrix on the top surface of the semiconductor via the high-density semiconductor substrate, the typical voltage drop due to parasitic resistance does not occur because the substrate is a high-density first conductive-type semiconductor substrate. Thus, drain interconnects are not required, and the step of forming an electrode on the rear surface of the semiconductor substrate may be eliminated, and the manufacturing process simplified. The production yield is improved by elimination of the drain interconnections.

Preferably, the photodiode is of a buried type, and a high-density first conductive-type semiconductor layer is continuously formed so as to cover the top surface of the second conductive-type charge-accumulation region of the photodiode and the top surface of the peripheral area surrounding the photodiode. The overflow-control region is preferably a first or second conductive-type semiconductor region formed inside the semiconductor.

In addition to an increased production yield and a simplified manufacturing process, there is another advantage of using the buried photodiode, in that the dark current is reduced because the depletion layer of the PN junction does not reach the top surface of the semiconductor.

Again, the high-density first conductive-type semiconductor layer extends so as to cover the top surface of the second conductive-type charge-accumulation region of the photodiode and the top surface of the peripheral area surrounding the photodiode, and the overflow-control region is formed inside the semiconductor, whereby a buried photodiode having a lateral overflow drain structure is built in.

This lateral overflow structure can reduce blur, such as blooming and smear. Also, the dark current can be reduced because the depletion layer of the PN junction is inside the semiconductor. In addition, there is no charge left in the photodiode after the accumulated charge is transferred (perfect transfer or perfect depletion). As a result, ideal image quality can be obtained by greatly reducing after-image and reset noise.

According to another aspect of the invention, a photoelectric conversion apparatus is provided, that comprises a plurality of the photoelectric conversion devices summarized above, arranged in a two-dimensional matrix. Each device is used as a pixel. This apparatus also comprises a plurality of vertical signal lines, each being provided to one of the columns of the pixel matrix; a vertical scanning circuit for selecting a specific row of the pixel matrix and transferring signals from the respective pixels in the selected row to the associated vertical signal lines; and a horizontal scanning circuit for successively scanning the vertical signal lines in the horizontal direction and transferring the signals from the scanned vertical lines to associated horizontal signal lines.

For the reasons given above, the drain interconnection can be eliminated, and malfunctions due to short-circuits between the vertical signal line and the drain interconnection can thereby be eliminated. As a result, the production yield is increased.

Furthermore, the manufacturing process of this photoelectric conversion apparatus can be simplified compared with a conventional apparatus, while the dark current, afterimages, and reset noise can be reduced by using buried-type photodiodes in the pixel matrix.

According to another aspect of the invention, a photoelectric conversion apparatus comprises a plurality of the photoelectric conversion devices summarized above, arranged in a two-dimensional pixel matrix. The gate regions of the JFETs and the charge-drain regions of the reset drains (of the photoelectric conversion devices in each row of the pixel matrix) are arranged alternately in the horizontal scanning direction, with boundary regions located between each of the gate regions and the adjacent charge-drain regions. The reset gates are formed above the boundary regions between the alternating gate regions (of the JFETs) and charge-drain regions (of the reset drains) in the horizontal scanning direction, separated from the boundary regions by the insulating film. The reset gates in each row are connected in common by a reset gate interconnection at least in the horizontal scanning direction, and the charge-drain regions of the reset drains in each row are connected in common in the horizontal scanning direction by a reset drain interconnection.

This arrangement can achieve the same effect as the previous arrangement, namely, the production yield is improved by eliminating the drain interconnections and preventing short-circuits between the vertical signal line and the drain interconnection. The manufacturing process is also simplified, while the dark current, after-images, and reset noise can be reduced by use of buried photodiodes.

Further, in this photoelectric conversion apparatus, a plurality of MOS transistors, each consisting of a gate region of the JFET, a reset gate, and a charge-drain region of the reset drain, are connected in series in the horizontal scanning direction. Upon turning on the reset gate, all the gate regions of the JFETs and the charge-drain regions of the reset drains, which are alternately arranged in the horizontal scanning direction, are electrically connected via the reset gates. Accordingly, even if an open-mode defect (e.g., a faulty connection to the reset drain) occurs in a certain pixel, the gate region of the junction field-effect transistor of that pixel can be correctly controlled by the reset drain of other pixels arranged in the horizontal scanning direction via the MOS transistors. Consequently, image defects appearing as vertical blank lines can be reduced, and the production yield is increased.

Contact holes are formed in the insulating film extending over the reset drains. Two or more photoelectric conversion devices preferably share a single contact hole, and the charge-drain regions of the reset drains of these devices are connected in common to the reset drain interconnection via the single contact hole.

To be more precise, each of the contact holes is preferably allocated to two or more photoelectric conversion devices aligned in the horizontal scanning direction, and the charge-drain regions of the reset drains of these devices are connected in common in the horizonal direction via the associated contact hole. This arrangement differs from the conventional apparatus in which each contact hole is allocated to one of the photoelectric conversion devices.

In general, contact holes in a semiconductor integrated circuit (including a photoelectric conversion apparatus) are likely to cause open-mode defects, which interrupt correct electrical connections, and short-circuit-mode defects, which cause random electrical connections of the elements away from the target point due to the inaccuracy of the pattern of the underlayer (i.e., the semiconductor regions and the interconnection formed under the contact hole). Accordingly, by reducing the number of contact holes for connecting the reset drains, the number of short-circuit-mode defects can be reduced, and the production yield is increased.

Preferably, a contact hole is used in common by two to twenty photoelectric conversion devices arranged in the horizontal scanning direction. The charge-drain regions of the reset drains of two to twenty photoelectric conversion devices are thus connected in common in the horizontal scanning direction.

Although the short-circuit-mode defects can be decreased by reducing the number of contact holes, it is not preferable to simply reduce the number of contact holes without limit. A contact hole per two to twenty devices is preferable.

If a plurality of photoelectric conversion devices having very few or no contact holes communicating with the reset drains are connected in series in the horizontal scanning direction, then the gate regions of those JFETs located in the middle of the row must be controlled via a relatively large number of MOS transistors connected in series in the horizontal scanning direction. In such a case, the parasitic resistance and the parasitic capacitance increase and, as a result, the speed of operation slows down. Furthermore, if a defect occurs at two or more MOS transistors in this channel, none of the JFETs located in between the defective MOS transistors can be properly controlled, and the production yield drops greatly.

Accordingly, a contact hole is preferably allocated to two to twenty devices in order to connect the charge-drain regions of the reset drains of these devices in common in the horizontal direction. In this case, the operation speed is not adversely affected, and the production yield can be kept high.

Preferably, the charge-accumulation regions of the photodiodes and the charge-drain regions of the reset drains of the photoelectric conversion devices in each column of the pixel matrix are arranged alternately in the vertical scanning direction, with boundary regions between each of the charge-accumulation regions and the adjacent charge-drain regions. The overflow-control regions are formed in the boundary regions between the alternately arranged charge-accumulation regions and the charge-drain regions in the vertical scanning direction. In such a configuration, the drain interconnections are eliminated, and the production yield is improved by preventing short-circuits between the vertical signal line and the drain interconnection. Also, the manufacturing process is simplified, while dark current, after-images, and reset noise can be reduced by the buried photodiode.

An overflow-control region can be formed in the boundary region between any pair of charge-accumulation and charge-drain regions adjacent in the vertical scanning direction.

If light of a high intensity strikes the photodiode of a certain pixel, and if an excessive amount of electric charge is generated, the excessive charge is guided to the reset drains located on both sides of the photodiode via the overflow-control regions also provided on both sides of the photodiode in the vertical scanning direction. Thus, the overflow operation for a photodiode can be performed in two adjacent channels. Accordingly, even if one of the two channels is temporarily interrupted by a structural limitation or by operation of a driving pulse, the other channel can continuously perform overflow operation, whereby blur (e.g., blooming or smear) can be reduced.

According to another aspect of the invention, a photoelectric conversion apparatus (solid-state image sensor) comprises a base consisting of a first conductive-type higher-density semiconductor substrate and a first conductive-type lower-density semiconductor layer formed on said substrate; a plurality of pixels is formed in the base, each pixel including a device activated by a voltage applied via the first conductive-type higher-density semiconductor substrate and the first conductive-type lower-density semiconductor layer in this order. Filled trenches are formed in the base from the top surface of the first conductive-type lower-density semiconductor layer between any two adjacent pixels. Each of the trenches is filled with one or more types of materials such that (1) the resistance between the first conductive-type higher density semiconductor substrate and the surface region of the first conductive-type lower-density semiconductor layer is reduced, and (2) crosstalk between pixels is reduced.

In this context, the terms "higher-density" and "lower-density" are used in a sense of relative comparison between the first conductive-type semiconductor substrate and the same conductive-type semiconductor layer formed on the substrate, not in the sense of some absolute impurity concentration. Accordingly, the impurity concentration of the first conductive-type higher-density semiconductor substrate does not have to be absolutely high, but it is higher than that of the semiconductor layer formed on it.

Because the trench, which is formed from the top surface of the first conductive-type semiconductor layer in the boundary between two adjacent pixels, is filled with one or more materials, the resistance between the first conductive-type semiconductor substrate and the surface region of the first conductive-type semiconductor layer decreases, and the potential drop between these two becomes small, depending on the properties of the filling materials. The crosstalk between pixels can also be reduced. In addition, even if the impurity concentration of the first conductive-type lower-density semiconductor layer is lowered for any of various reasons such as to improve long-wavelength sensitivity, the device of each pixel can still receive a sufficient drain voltage. The quality of the solid-state image sensor can thus be kept high, even with increased sensitivity.

The bottom of the trench reaches the top surface of the first conductive-type higher-density semiconductor substrate, or may go deeper inside the substrate. Alternatively, the bottom of the trench may not reach the top surface of the first conductive-type higher-density semiconductor substrate. If the bottom of the trench reaches or extends beyond the top surface of the first conductive-type semiconductor substrate, the crosstalk-reduction effect and the resistance reduction effect can be further increased according to the properties of the one or more filling materials. Even if the trench does not reach the top surface of the first conductive-type semiconductor substrate, the crosstalk-reduction effect and the resistance reduction effect can be still achieved, depending on the depth of the trench, while trench formation is easier. If trenches can be formed easily, the production yield is improved over a design employing trenches that are more difficult to form. In addition, the width of the trench can be decreased.

Each of the trenches may be filled with only a single type of conductive material that has a conductivity with respect to the first conductive-type lower density semiconductor layer (i.e., a material that provides an ohmic or near-ohmic contact between itself and the first conductive-type lower density semiconductor layer). This material may be a highly conductive material such as a metal or, alternatively, a semiconductor or polysilicon that contains a first conductive-type impurity. Either can reduce the effective resistance to a voltage supplied to the device of each pixel via the first conductive-type semiconductor layer.

Each of the trenches may be filled with an insulator and the above-mentioned conductive material that has a conductivity with respect to the first conductive-type lower density semiconductor layer. Preferably, the above-mentioned conductive material is installed along the inner surface of the trench, and an insulator fills the rest of the space in the trench. Alternatively, an insulator is formed along the inner surface of the trench, except for the bottom and the area near the opening of the trench, and the conductive material that has a conductivity with respect to the first conductive-type lower density semiconductor layer fills the rest of the space in the trench.

Any of these examples as to the filling materials and their positions are effective to reduce the crosstalk and the resistance.

As has been mentioned, the conductive material filled in the trench is, for example, polysilicon containing a first conductive-type impurity. There are many other materials suitable to the above-mentioned conductive material having a conductivity with respect to the first conductive-type semiconductor layer, which are apparent to those skilled in the art.

Preferably, the inner wall of the trench is surrounded by a first conductive-type diffusion layer inside the base. This first conductive-type diffusion layer promotes the resistance reduction effect. If polysilicon is used as a filling material, then the diffusion layer is formed by annealing the base after the trenches are filled with the polysilicon.

The first conductive-type lower-density semiconductor layer is preferably an epitaxial layer. Of course, the first conductive-type semiconductor layer is not limited to an epitaxial layer.

The device or element included in each pixel that receives a signal voltage via the substrate is preferably an amplifying device. In this case, a signal charge generated through photoelectric conversion in response to incident light is accumulated in the amplifying device installed in each pixel, and an amplified signal representing the accumulated charge is output. Thus, the sensitivity of the solid-state image sensor is improved.

According to another aspect of the invention, methods are provided for manufacturing the trenches for the solid-state image sensor summarized above. A preferred embodiment of the method comprises the steps of forming the trenches in the base, forming one or more layers on the base so as to fill up the trench, (the one or more layers being made of different materials), and removing portions of the one or more layers that extend out of the trenches by a CMP (Chemical Mechanical Polishing) method.

After one or more layers are formed so as to fill up the trenches, the excess portion of the layers extending outside the trenches is preferably removed by single CMP step, without overetching the layers inside of the trenches. The top surfaces of the filled-up trenches can be made even and planar by CMP, which allows subsequently formed aluminum (Al) interconnections to be formed reliably in a later step, resulting in improved production yield.

The illustrative embodiments of the invention will now be described with reference to the attached drawings. Identical numerical symbols denote the same elements, and the explanation for these elements will not be repeated.

First Illustrative Embodiment

Figure 2:
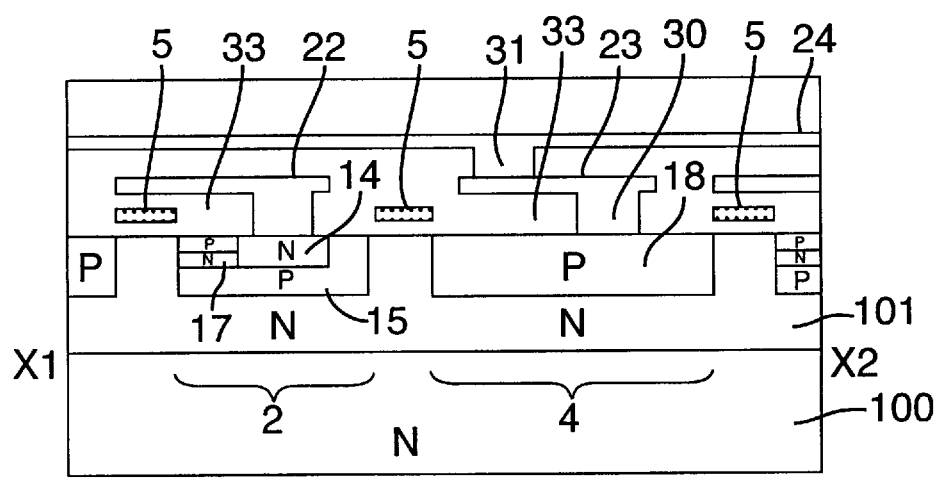
FIG. 2 is a cross-sectional view taken along the X1-X2 line shown in FIG. 1.
Figure 3:
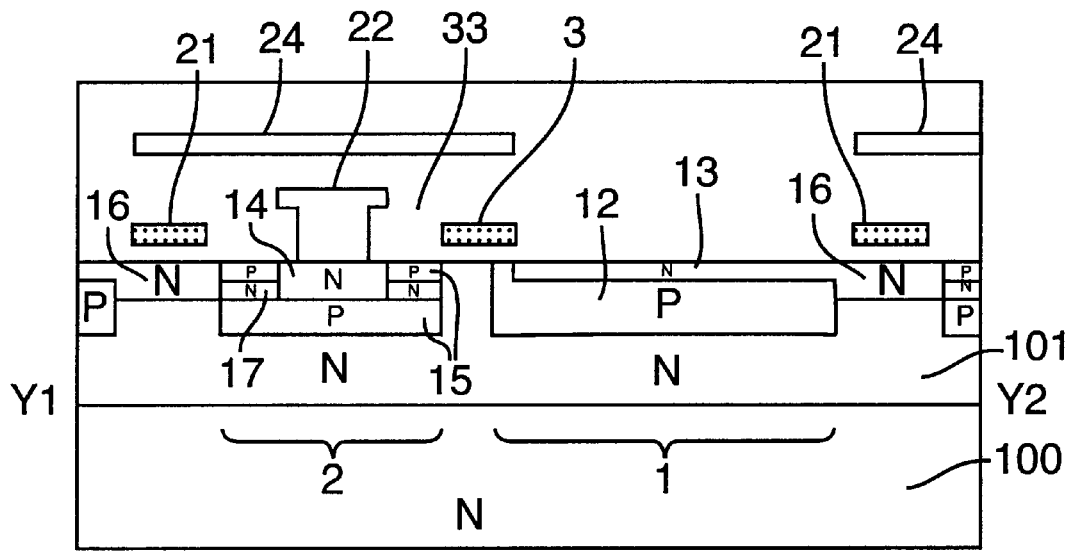
FIG. 3 is a cross-sectional view taken along the Y1-Y2 line shown in FIG. 1.
Figure 4:
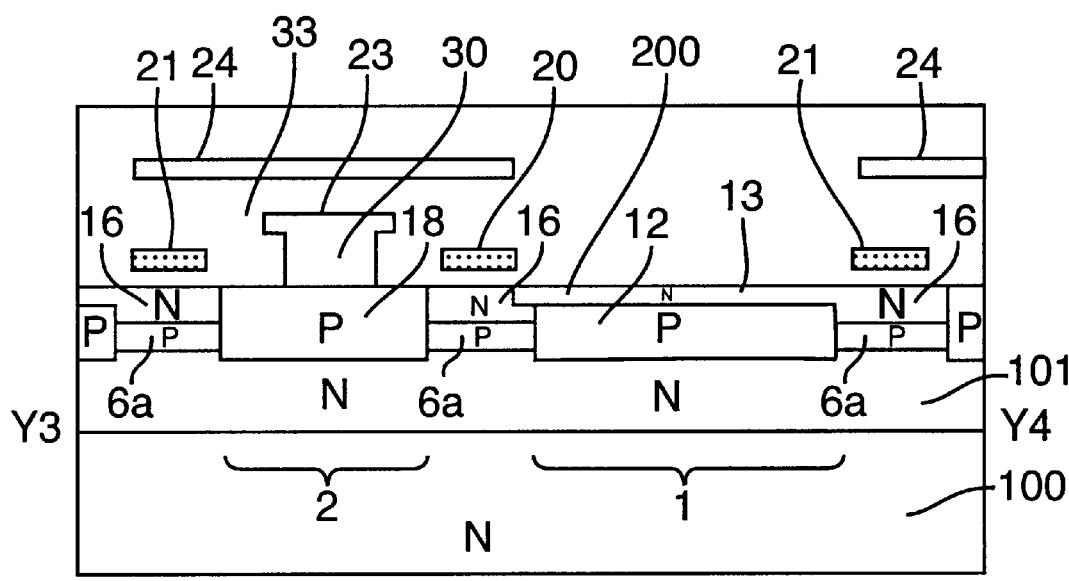
FIG. 4 is a cross-sectional view taken along the Y3-Y4 line shown in FIG. 1.

FIGS. 1–4 show a photoelectric conversion device according to a first illustrative embodiment of the invention. FIG. 1 is a plan view. FIG. 2 is a cross-sectional view taken along the X1-X2 line of FIG. 1. FIG. 3 is a cross-sectional view taken along the Y1-Y2 line of FIG. 1. FIG. 4 is a cross-sectional view taken along the Y3-Y4 line of FIG. 1.

The photoelectric conversion device shown in FIGS. 1–4 comprises a buried photodiode 1 for generating and accumulating an electric charge (hereinafter referred to as a "charge") in response to incident light. A junction field-effect transistor (hereinafter referred to as a JFET) 2 receives the charge from the photodiode 1 at its gate region, amplifies the charge, and outputs the amplified charge. A transfer gate 3 transfers the charge generated by the photodiode 1 to the gate region of the JFET 2. A reset drain 4 controls the electric potential of the gate region of the JFET 2, and, as will be explained below, also removes excess charge generated by the photodiode 1. An overflow-control region 6a guides the excess charge generated by the photodiode 1 to the reset drain 4. A reset gate 5 controls the electrical connection between the gate region of the JFET 2 and the reset drain 4.

The photodiode 1, the JFET 2, the reset drain 4, and the overflow-control region 6a are formed in the N-type semiconductor layer 101, itself formed on a high-density N-type semiconductor substrate 100. The transfer gate 3 and the reset gate 5 are formed over the N-type semiconductor layer 101, separated by an insulating film.

As shown in FIGS. 3 and 4, the photodiode 1 includes a P-type charge-accumulation region 12, formed in the N-type semiconductor layer 101 over the high-density N-type semiconductor substrate 100. The photodiode 1 also includes a high-density N-type semiconductor region 13, which covers most of the P-type charge-accumulation region 12 and extends along the top surface of the semiconductor, as shown in FIGS. 3 and 4. The photodiode 1 generates and accumulates a charge in response to incident light.

As shown in FIGS. 2 and 3, the JFET 2 has a P-type gate region 15 formed in the N-type semiconductor layer 101. The JFET 2 also includes an N-type source region 14 and an N-type channel region 17, both of which are formed in the P-type gate region 15. The JFET 2 further includes an N-type rain region 16 aligned with the source region 14, with the channel region 17 between them. The JFET 2 receives the charge from the photodiode 1 at the gate region 15, amplifies this charge, and outputs the amplified charge.

As shown in FIG. 1, the N-type drain region 16 of the JFET 2 extends along the periphery of the photoelectric conversion device, except for the surface areas of the semiconductor directly below the transfer gate 3 and the reset gate 5. The N-type drain region 16 functions as a boundary between any two adjacent photoelectric conversion devices arranged in the matrix.

The N-type drain region 16 is continuous with the high-density N-type semiconductor region 13. The N-type regions (13, 101) of the PN junction in the photodiode 1 and the N-type drain region 16 of the JFET 2 are thus electrically connected to each other. The N-type drain region 16 is also electrically connected to the high-density N-type semiconductor substrate 100 via the N-type semiconductor layer 101 (FIG. 3).

The P-type gate region 15 of the JFET 2 sandwiches the N-type channel region 17 from above and below. This structure increases the gain of the source-follower action and, at the same time, reduces variation in the gain.

The transfer gate 3 is a gate electrode formed above the boundary region between the P-type charge-accumulation region 12 of the photodiode 1 and the P-type gate region 15 of the JFET 2, separated from the boundary region by an insulating film, as shown in FIG. 3. The transfer gate 3 transfers the charge accumulated in the P-type charge-accumulation region 12 of the photodiode 1 to the P-type gate region 15 of the JFET 2.

The P-type region (i.e., the P-type charge-accumulation region 12) of the PN junction of the photodiode 1, the transfer gate 3, and the P-type gate region 15 of the JFET 2 together constitute a P-channel MOS transistor.

The reset drain 4 has a P-type charge-drain region 18 formed in the N-type semiconductor layer 101, as shown in FIGS. 2 and 4. The reset drain 4 removes excess charge generated by the photodiode 1, and controls the electric potential of the P-type gate region 15 of the JFET 2.

The reset gates 5 are gate electrodes formed above the boundary region(s) between the P-type gate region 15 of the JFET 2 and the P-type charge-drain region 18 of the reset drain 4 (above each such boundary region, even across pixel boundaries), separated from the boundary region by an insulating film, as shown in FIG. 2. The reset gates 5 control the electrical connection between the P-type gate region 15 of the JFET 2 and the P-type charge-drain region 18 of the reset drain 4.

The P-type gate region 15 of the JFET 2, the adjacent reset gate 5, and the P-type charge-drain region 18 of the reset drain 4 together constitute a P-channel MOS transistor.

The overflow-control region 6a is a P-type semiconductor region formed in the boundary region between the P-type charge-accumulation region 12 of the photodiode 1 and the P-type charge-drain region 18 of the reset drain 4 inside the semiconductor, as shown in FIG. 4. The overflow-control region 6a controls the overflow of excess charge by guiding excess charge generated by the photodiode 1 to the charge-drain region 18 of the reset drain 4. The overflow-control region 6a is covered with a high-density N-type semiconductor region 16, which is identical to (i.e., continuous with) the N-type drain region 16 of the JFET 2, and extends along the top surface of the semiconductor.

A P-channel JFET 200 is thus effectively formed (FIG. 4) in which the high-density N-type semiconductor region 16 and the N-type semiconductor layer 101 act as a gate region, the P-type charge-accumulation region 12 of the photodiode 1 acts as a source region, the P-type overflow-control region 6a acts as a channel region, and the P-type charge-drain region 18 of the reset drain acts as a drain region.

During the normal operation of the photodiode 1, the P-channel JFET 200 is in the OFF state. However, if a positive charge (i.e., holes) accumulating in the P-type charge-accumulation region 12 exceeds a predetermined value, (i.e., if the electric potential of the P-type charge-accumulation region 12 exceeds a prescribed level) the P-channel JFET 200 is put into the ON state. In other words, the potential change in the accumulation region 12 (which is a source region of the JFET 200) changes the potential difference between the gate and the source of the JFET 200. When the potential difference exceeds the threshold voltage of the JFET 200, the JFET 200 is in the ON state.

The excess charge generated by the photodiode 1 flows out from the P-type charge-accumulation region 12 into the P-type charge-drain region 18 of the reset drain 4 via the overflow-control region 6a. The excess charge is drained by the reset drain interconnection 24 via a reset drain contact hole 30 (formed in an interlayer insulating film 33), a relay interconnection 23, and a relay connection hole 31.

The high-density N-type semiconductor region 16 (identical to and continuous with the N-type drain region 16 of the JFET 2) formed over the overflow-control region 6a at or near the top surface of the semiconductor is continuous with the high-density N-type semiconductor region 13 formed in the top surface of the photodiode 1. Accordingly, the top surface of the P-type charge-accumulation region 12 of the photodiode 1 and its surroundings are covered with the high-density N-type semiconductor regions 13 and 16, whereby a buried-type photodiode is achieved.

The high-density N-type semiconductor regions 13 and 16 do not reach the edge of the photodiode 1 closest to the transfer gate 3, and they do not extend below the transfer gate 3, as shown in FIG. 3. However, the performance of a buried photodiode (that is, the reduced dark-current characteristics due to the non-depletion of the top surface of the semiconductor) is maintained. This is achieved because, during the period of accumulation of the signal charge due to photoelectric conversion in the photodiode 1, a high-level control-pulse voltage is applied to the transfer gate 3. This places the gate in the OFF state and excites electrons near the semiconductor surface in the region of the transfer gate 3, forming a temporary high-density N-type semiconductor region.

The photoelectric conversion device shown in FIGS. 1–4 thus has both a lateral overflow drain structure and, at the same time, a buried photodiode. This is possible because the overflow-control region 6a is positioned within the semiconductor, and because the high-density semiconductor regions 13 and 16 are formed on the surface area.

In contrast, in a conventional lateral overflow drain structure that controls the overflow operation using a conventional MOS gate electrode, the semiconductor surface surrounding the photodiode and positioned at the end of the MOS gate electrode is depleted and, consequently, dark current can flow in this area.

As explained above, the photodiode 1 is of a buried-type and has a JFET-type lateral overflow drain structure. This photodiode 1 has the same effect as the conventional buried-type photodiode shown in FIGS. 45 through 48 having a vertical overflow drain structure, being able to reduce blur, such as blooming and smear. In addition, because the depletion layer generated at the PN junction does not reach the semiconductor surface due to the buried structure, the dark current is reduced. Since no charge is left in the photodiode 1 after the charge has been transferred to the gate region (perfect transfer or perfect depletion), ideal image quality can be achieved by reducing after-image and reset noise.

It is preferable to form the P-type charge-accumulation region 12 of the photodiode 1 and the P-type overflow-control region 6a in the same manufacturing step in order to prevent any discontinuity in the impurity concentration at the connection between the P-type charge-accumulation region 12 of the photodiode 1 and the P-type overflow-control region 6a (that is, to prevent an extremely high-density P-type region from occurring due to the overlapping of these two regions). Manufacturing the charge-accumulation region 12 and the overflow-control region 6a in the same step can simplify the overall manufacturing process and promote perfect depletion of the P-type charge-accumulation region 12.

The arrangement of the transfer gate interconnection 20, the reset gate interconnection 21, the relay interconnection 23, the reset drain interconnection 24, and the vertical signal line 22 is also shown in FIGS. 1 through 4.

As has been explained, in the photoelectric conversion device of the first illustrative embodiment, the N-type drain region 16 of the JFET 2 is electrically connected to the high-density N-type semiconductor substrate 100. Accordingly, if a plurality of photoelectric conversion devices are arranged in a matrix to constitute a photoelectric conversion apparatus, and if a drain voltage is supplied to each JFET 2, from a drain electrode (not shown) formed around the pixel matrix, via the high-density N-type semiconductor substrate 100, the voltage drop due to parasitic resistance can be avoided. This is because the high-density semiconductor substrate 100 is one hundred times (or more) as thick as the high-density diffusion layer 16, and the parasitic resistance is thus greatly reduced.

This structure allows the drain interconnection 25 used in the conventional photoelectric conversion apparatus (shown in FIGS. 49 through 52) to be omitted, whereby short-circuits between the drain interconnection 25 and the vertical signal line 22 are eliminated, and the production yield is thus increased.

Omitting the drain interconnection 25 further allows the vertical signal line 22 to be formed around each photoelectric conversion device (that is, in the boundary region between pixels) and, as a result, the light-receiving aperture ratio and the sensitivity are improved.

In this first illustrative embodiment, the P-type semiconductor substrate 10 used in the conventional photoelectric conversion device (shown in FIGS. 45 through 48) is replaced by the N-type semiconductor substrate 100, which is of an opposite conductive type. Therefore, a charge (i.e., holes) generated in the deep portion of the photodiode 1 by photoelectric conversion may be accumulated in the P-type charge-accumulation region 12 of the photodiode 1 without being absorbed by the semiconductor substrate, whereby the sensitivity (especially to light of longer wavelengths) is improved.

Second Illustrative Embodiment

Figure 5:
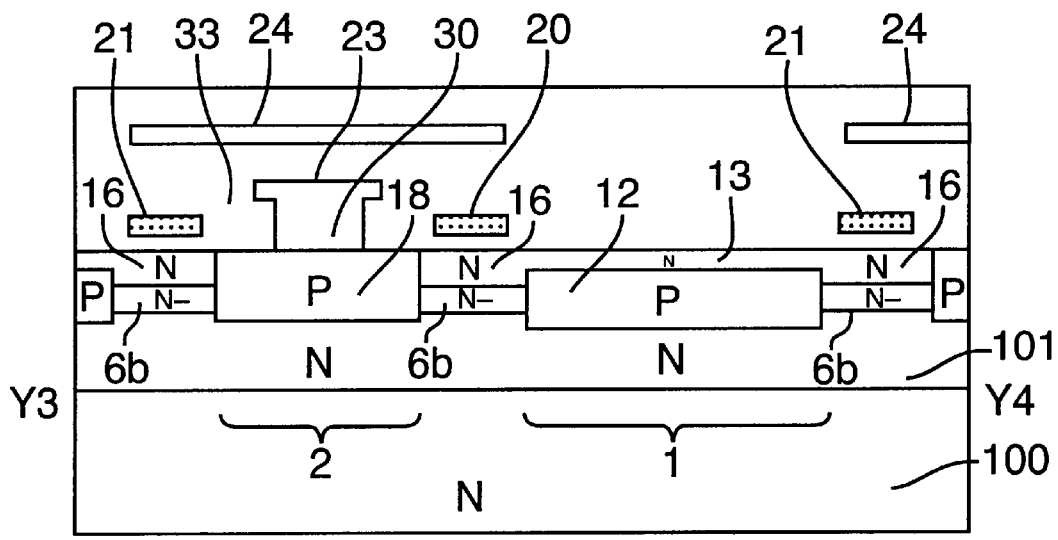
FIG. 5 is a partial cross-sectional view of a photoelectric conversion device of a second illustrative embodiment of the invention.

FIG. 5 is a partial cross-sectional view of a photoelectric conversion device according to a second illustrative embodiment of the invention. This photoelectric conversion device differs from the first illustrative embodiment shown in FIGS. 1 through 4 with respect to the cross-sectional structure taken along the Y3-Y4 line (FIG. 4). The rest of the structure is the same as the first illustrative embodiment.

As shown in FIG. 5, the overflow-control region 6b of the photoelectric conversion device of the second embodiment consists of a low-density N-type semiconductor region, which differs from that of the first embodiment.

As in the first illustrative embodiment, the overflow-control region 6b is covered with a high-density N-type semiconductor region 16 (which is identical to the N-type drain region 16 of the JFET 2) extending along the top surface of the semiconductor. The high-density N-type semiconductor region 16 is connected to the high-density N-type semiconductor region 13 which covers the photodiode 1 and extends along the top surface of the semiconductor.

The photodiode 1 is thus a buried photodiode, having a PNP lateral overflow drain structure, and it can thus achieve ideal image quality with very little dark current, after-image, and reset noise, while also reducing blur, such as blooming and smear.

With the PNP lateral overflow structure, when the potential difference between the charge-accumulation region 12 and the charge-drain region 18 of the reset drain 4 exceeds a predetermined value, then a punch-through phenomenon occurs in the PNP structure, and overflow action occurs in which the excessive charge flows into the reset drain.

The overflow operation thus depends on the electric potential of the charge-drain region 18 of the reset drain 4. This electric potential takes on two values, a high level and a low level, in order to control the JFET 2. However, the potential stays at the low level most of the time during actual operation, and the overflow-control region 6b is so designed that the overflow action (or the punch-through phenomenon) occurs with respect to this low-level voltage.

Thus, the overflow operation of the photoelectric conversion device of this illustrative embodiment can be controlled by adjusting the voltage of the low-level control signal of the driving pulse to be applied to the charge-drain region 18 of the reset drain 4.

If a photoelectric conversion apparatus comprises a plurality of photoelectric conversion devices of this illustrative embodiment, arranged in a matrix, then the drain interconnection can be omitted, as in the first illustrative embodiment. Consequently, any defects caused by short-circuits between the drain interconnection and the vertical signal line are eliminated, whereby the production yield is improved.

Third Illustrative Embodiment

Figure 6:
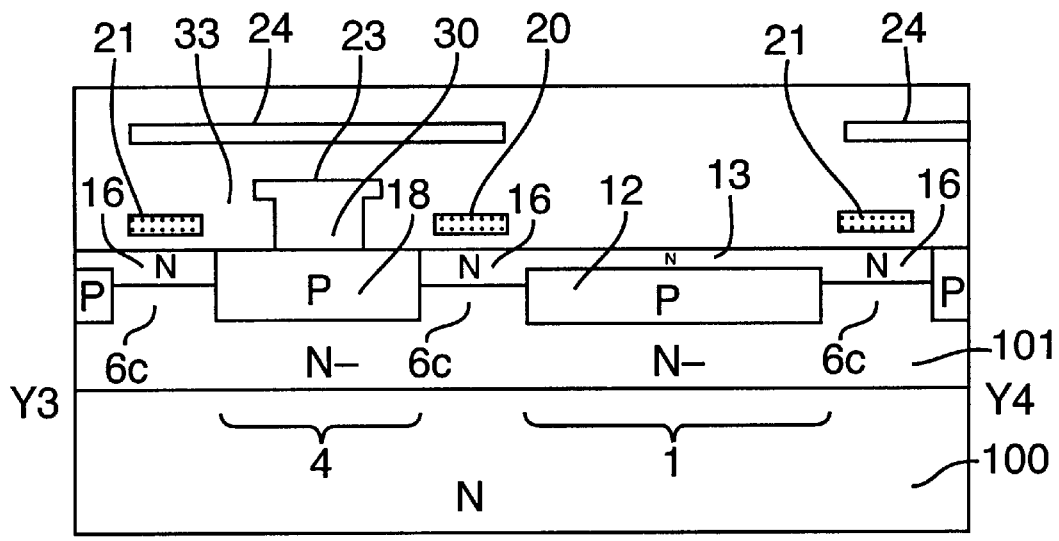
FIG. 6 is a partial cross-sectional view of a photoelectric conversion device of a third illustrative embodiment of the invention.

FIG. 6 is a partial cross-sectional view of a photoelectric conversion device according to a third illustrative embodiment of the invention. This photoelectric conversion device differs from the first illustrative embodiment shown in FIGS. 1 through 4 mainly with respect to the cross-sectional structure taken along the Y3-Y4 line (FIG. 4). The rest of the structure is substantially the same as the first illustrative embodiment.

As shown in FIG. 6, the photoelectric conversion device of the third illustrative embodiment has a low-density N-type semiconductor layer 101. An overflow-control region 6c consists of a portion of the low-density N-type semiconductor layer 101. This feature differs from the first illustrative embodiment.

As in the first illustrative embodiment, the overflow-control region 6c is covered with a high-density N-type semiconductor region 16 (which is identical to the N-type drain region 16 of the JFET 2) extending along the top surface of the semiconductor. The high-density N-type semiconductor region 16 is connected to the high-density N-type semiconductor region 13 which covers the photodiode 1 and extends along the top surface of the semiconductor.

The photodiode 1 is thus a buried photodiode, having a PNP lateral overflow drain structure, and can achieve ideal image quality with very little dark current, after-image, and reset noise, while also reducing blur, such as blooming and smear.

Because the low-density N-type semiconductor layer 101 serves as the overflow-control region 6c, the manufacturing process is simplified.

By using the low-density N-type semiconductor layer 101, the thickness of the depletion layer of the PN junction between the P-type charge-accumulation region 12 of the photodiode 1 and the N-type semiconductor region 101 increases in the z-direction and, consequently, crosstalk between any two adjacent photodiodes 1 decreases during photoelectric conversion.

If a photoelectric conversion apparatus comprises a plurality of photoelectric conversion devices of this illustrative embodiment arranged in a matrix, then the drain interconnection can be omitted, as in the first illustrative embodiment. Consequently, any defects caused by short-circuits between the drain interconnection and the vertical signal line are eliminated, and the production yield is improved.

Fourth Illustrative Embodiment

Figure 7:
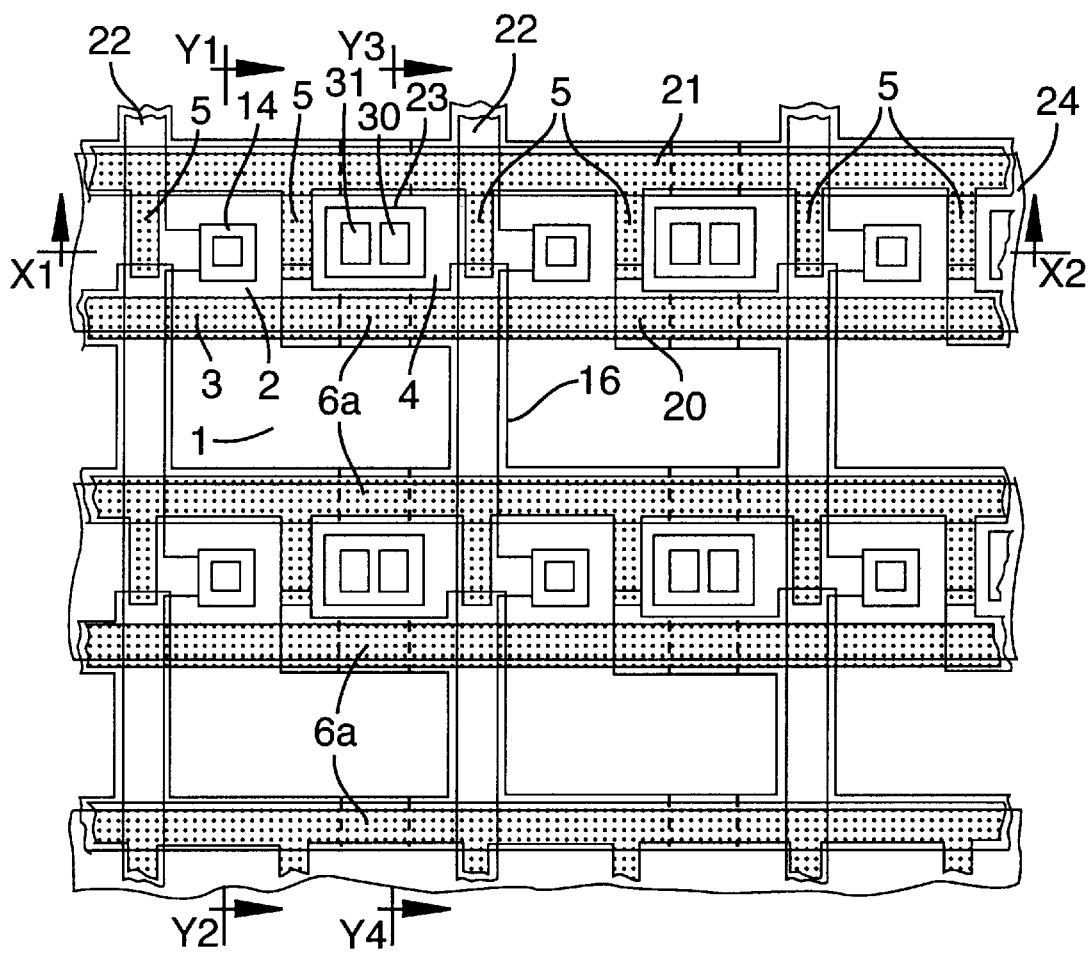
FIG. 7 is a plan view of a photoelectric conversion apparatus of a fourth illustrative embodiment of the invention.
Figure 8:
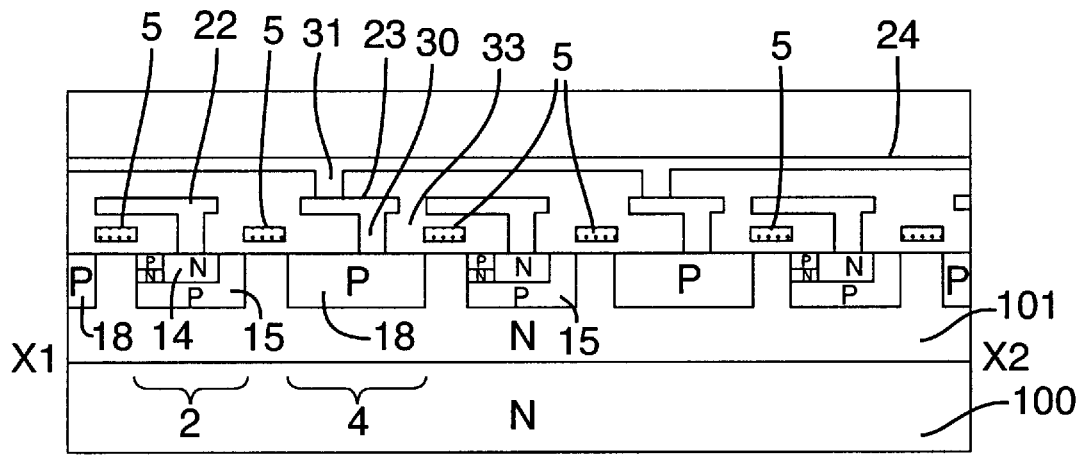
FIG. 8 is a cross-sectional view taken along the X1-X2 line shown in FIG. 7.
Figure 9:
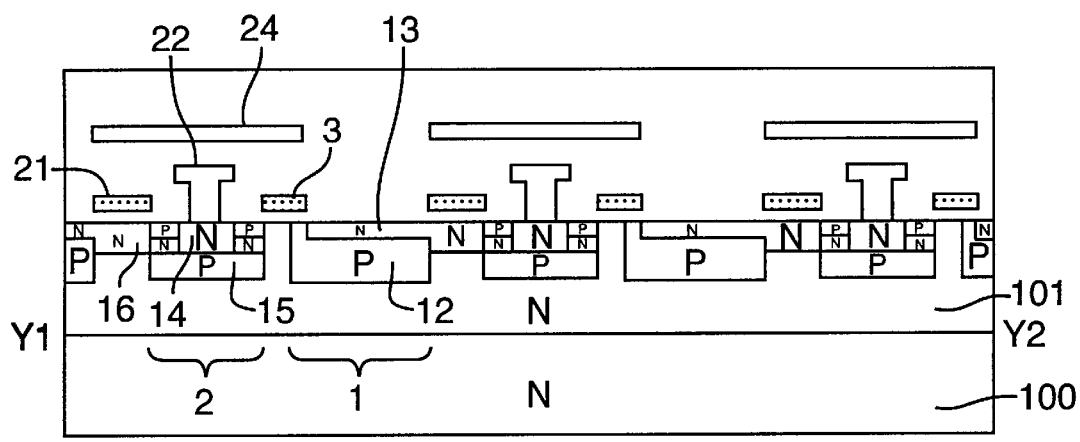
FIG. 9 is a cross-sectional view taken along the Y1-Y2 line shown in FIG. 7.
Figure 10:
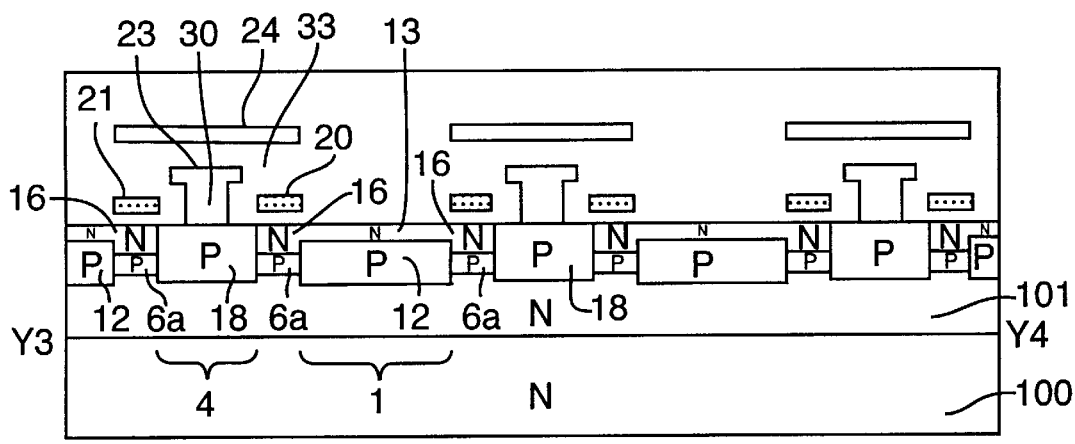
FIG. 10 is a cross-sectional view taken along the Y3-Y4 line shown in FIG. 7.

FIGS. 7 through 10 illustrate portions of a photoelectric conversion apparatus according to a fourth illustrative embodiment of the invention. The apparatus employs a plurality of photoelectric conversion devices according to the first illustrative embodiment (shown in FIGS. 1 through 4) as pixels arranged in a two-dimensional matrix. FIG. 7 is a plan view. FIG. 8 is a cross-sectional view taken along the X1-X2 line of FIG. 7. FIG. 9 is a cross-sectional view taken along the Y1-Y2 line of FIG. 7. FIG. 10 is a cross-sectional view taken along the Y3-Y4 line of FIG. 7.

Although the photoelectric conversion apparatus of this illustrative embodiment uses the photoelectric conversion devices shown in FIGS. 1 through 4 as pixels, the photoelectric conversion devices shown in FIGS. 5 and 6 may alternatively be used as pixels, to achieve the same or similar effects.

As shown in FIG. 7, the N-type source regions 14 of the JFETs 2 in each column of the pixel matrix are connected in common to one of the vertical signal lines 22 in the vertical scanning direction.

The N-type drain region 16 of the JFET 2 extends around the pixel, except for the area in which the transfer gate 3 and the reset gate 5 are formed. The N-type drain region 16 of each JFET 2 is electrically connected to the high-density N-type semiconductor substrate 100 via the N-type semiconductor layer 101 (FIG. 9), and receives a drain voltage, via the high-density N-type semiconductor substrate 100, from a drain electrode (not shown) that is formed around the matrix. In this arrangement, the drain interconnection 25, used in the conventional photoelectric conversion apparatus shown in FIGS. 49 through 52, is omitted.

The drain electrode may alternatively be formed on the rear surface of the high-density N-type semiconductor substrate 100, instead of being formed around the pixel matrix. This also allows the drain interconnection 25 to be eliminated.

By eliminating the drain interconnection 25, the vertical signal lines 22, which are placed above the photoelectric conversion devices in the conventional apparatus (FIG. 49), can be formed in the boundary between any two adjacent columns of the pixel matrix, as shown in FIG. 7. This allows the light-receiving aperture ratio to be increased.

As shown in FIG. 7, the transfer gates 3 in each row are connected in common, in the horizontal scanning direction, to the transfer gate interconnection 20. The reset gates 5 in each row are connected in common, also in the horizontal scanning direction, to the reset gate interconnection 21.

The charge-drain regions 18 of the reset drains 4 are connected in common, also in the horizontal scanning direction, to the reset drain interconnection 24. The connection from each region 18 to the interconnection 24 is made via a contact hole 30 (formed in the interlayer insulating film 33), a relay interconnection 23, and a relay connection hole 31. The reset drain interconnection 24 also functions as a light-blocking film for preventing incident light from striking the semiconductor area except for at the photodiode 1 (FIG. 7).

As shown in FIG. 8, the P-type gate regions 15 of the JFETs 2 and the P-type charge-drain regions 18 of the reset drains 4 are positioned within each pixel so as to alternate in the horizontal scanning direction (i.e., the lateral direction in FIG. 8) across multiple pixels. Reset gates are formed above the boundaries between any two adjacent such regions, the gates separated from the boundary region by an insulating film.

In the conventional apparatus (FIGS. 49 through 52), a single reset gate 5 is provided on one side of the JFET in each pixel. In contrast, in the photoelectric conversion apparatus according to the fourth illustrative embodiment, reset gates 5 are provided on both sides of each JFET, providing two reset gates, one to each side of each JFET, in every pixel. A plurality of P-channel MOS transistors, each consisting of a P-type gate region 15 of JFET 2, a reset gate 5, and a P-type charge-drain region 18 of reset gate 4, are thus linked, in series, in the horizontal scanning direction (FIG. 8).

When the reset gates 5 of each row are turned on, the P-type gate regions of the JFET 2 and the P-type charge-drain regions 18 of the reset drains are electrically connected to each other.

Accordingly, even if an open-mode defect occurs and interrupts the electrical connection between the reset drain interconnection 24 and a particular reset drain 4, the gate region of the JFET 2 of that pixel can be appropriately controlled by the reset drains 4 of other pixels connected in the horizontal scanning direction via the series-connected MOS transistors.

In the vertical scanning direction (i.e., in the lateral direction in FIG. 10), the P-type charge-accumulation regions 12 of the photodiodes 1 alternate with the P-type charge-drain regions 18, in each column of the pixel matrix. Overflow-control regions 6a are formed in the boundaries between any two adjacent regions.

Two overflow-control regions 6a thus sandwich each photodiode in each pixel, from both sides in the vertical scanning direction. If high intensity light strikes the photodiode 1 of a certain pixel, and if an excessive charge is generated, the two overflow-control regions 6a which are placed on both sides of that pixel can guide the excessive charge to the adjacent reset drains 4. Thus, the overflow operation for each photodiode 1 is performed using two channels.

Figure 11:
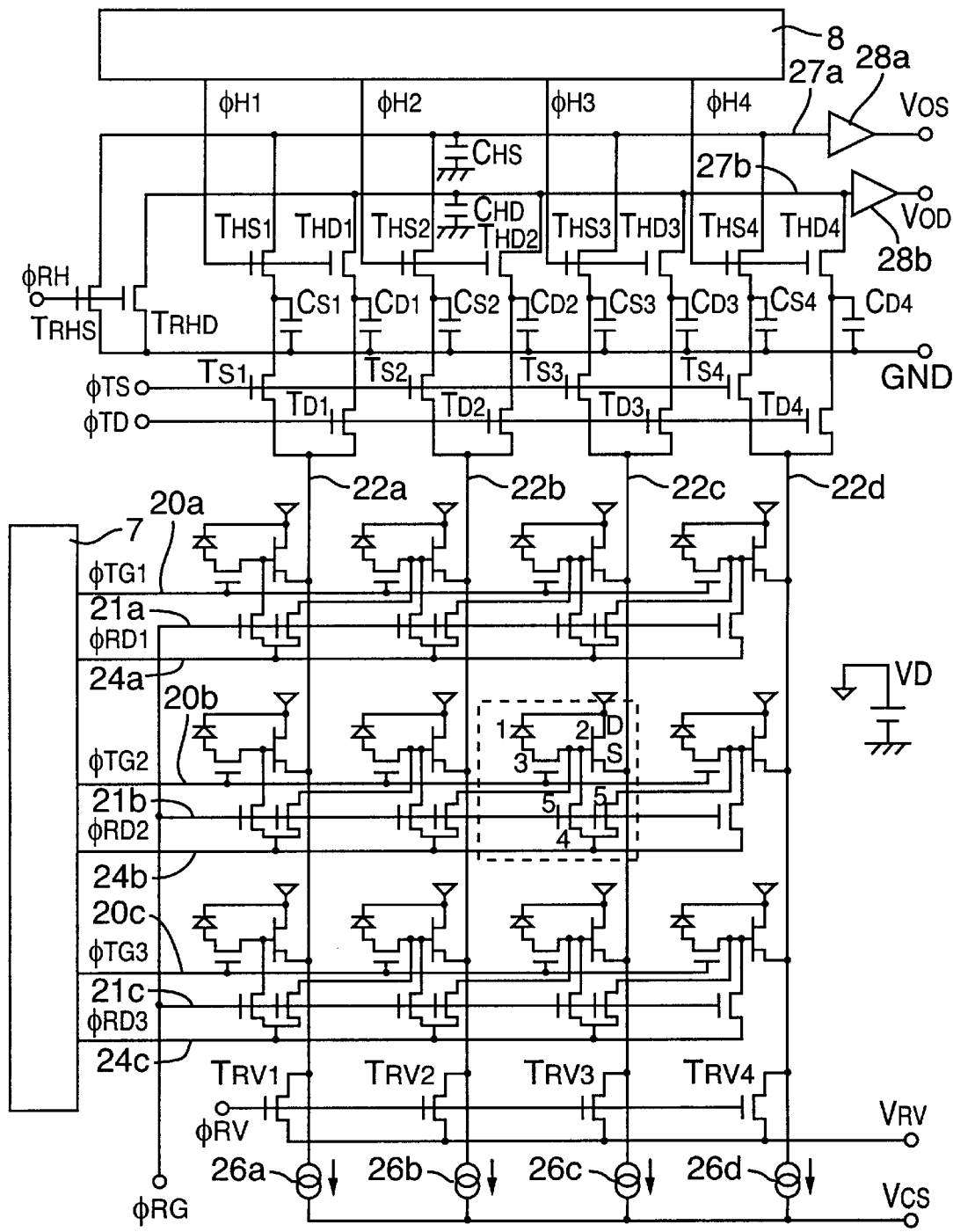
FIG. 11 is a circuit diagram of a photoelectric conversion apparatus the major portions of which are shown in FIGS. 7 through 10.

FIG. 11 is a circuit diagram of the photoelectric conversion apparatus of the fourth illustrative embodiment of FIGS. 7 through 10.

In FIG. 11, each photoelectric conversion device, which is a unit pixel in the apparatus, comprises a photodiode 1, a JFET 2, a transfer gate 3, a reset drain 4, and two reset gates 5. (An example unit pixel is shown within dashed line in FIG. 11.) The N-type region of the photodiode 1 is connected to the drain region D of the JFET 2. The P-type region of the photodiode 1, the transfer gate 3, and the gate region of the JFET 2 constitute a P-channel MOS transistor. Furthermore, a plurality of P-channel MOS transistors, each consisting of the gate region of the JFET 2, one of the reset gates 5, and the reset drain 4, are connected in series in the horizontal scanning direction, and two such MOS transistors are allocated to each pixel.

Although not shown in FIG. 11, the photodiode 1 has a lateral overflow drain structure, in which two overflow-control regions (corresponding to the regions 6a shown in FIGS. 1 through 4 and FIGS. 7 through 10) and a reset drain 4 are arranged in the lateral direction. Excess charge generated by the photodiode 1 is thus guided to the adjacent reset drains 4 through two channels. The excess charge is finally absorbed into the vertical scanning circuit 7 via a respective one of the reset drain interconnections 24a–24c.

The source regions S of the JFETs 2 in each column are connected in common to one of the vertical signal lines 22a–22d.

The drain regions D of the JFETs 2 of all the pixels are connected in common to the drain voltage source VD via the high-density N-type semiconductor substrate 100, which is electrically connected to the N-type drain region 16.

The transfer gates 3 in each row of the pixel matrix are connected in common to one of the transfer gate interconnections 20a–20c in the horizontal scanning direction. The transfer gate interconnections 20a–20c are connected to the vertical scanning circuit 7. Driving pulses φTG1–φTG3 are output from the vertical scanning circuit 7 to the respective transfer gate interconnections 20a–20c, and each pulse activates the transfer gates 3 of a respective associated row.

The reset gates 5 in each row of the pixel matrix are connected in common to one of the reset gate interconnections 21a–21c in the horizontal scanning direction. All of the reset gate interconnections 21a–21c are connected in common at the left and/or right end of the pixel matrix, and a driving pulse φRG activates all the reset gates 5 at the same time.

The reset drains 4 in each row of the pixel matrix are connected in common to one of the reset drain interconnections 24a–24c in the horizontal scanning direction, and are finally connected to the vertical scanning circuit 7. Driving pulses φRD1–φRD3 are output from the vertical scanning circuit 7 to the respective reset drain interconnections 24a–24c, and each pulse activates the reset drains 4 of the associated row.

One end of each of the vertical signal lines 22a–22d is connected both to one of the photosignal-output storage capacitors CS1–CS4, via one of the photosignal-output transfer MOS transistors TS1–TS4, and to the horizontal signal line (i.e., the signal output line) 27a, via one of the horizontal selection MOS transistors THS1–THS4.

The one end of each of the vertical signal lines 22a–22d is also connected both to one of the dark-output storage capacitors CD1–CD4, via one of the dark-output transfer MOS transistors TD1–TD4, and to the horizontal signal line (i.e., the dark-output line) 27b, via one of the horizontal selection MOS transistors THD1–THD4.

The transfer MOS transistors TS1–TS4 and TD1–TD4 are activated by the driving pulses φTS and φTD, respectively. The horizontal selection MOS transistors THS1–THS4 and THD1–THD4 are successively activated by the respective driving pulses φH1–φH4, supplied from the horizontal scanning circuit 8.

The horizontal signal lines 27a and 27b are connected to the output buffer amplifiers 28a and 28b, and to the reset MOS transistors TRHS and TRHD, respectively. The reset MOS transistors TRHS and TRHD for the horizontal signal lines are activated by a driving pulse φRH. The horizontal signal lines 27a and 27b have parasitic capacitances CHS and CHD, respectively.

The vertical signal lines 22a–22d are connected to the reset MOS transistors TRV1–TRV4, and to the constant-current sources 26a–26d, respectively. The reset MOS transistors TRV1–TRV4 for the vertical signal line are activated by a driving pulse φRV. When in the ON state, the reset MOS transistors TRV1–TRV4 connect the respective vertical signal lines 22a–22d to a reset voltage source VRV.

Figure 12:
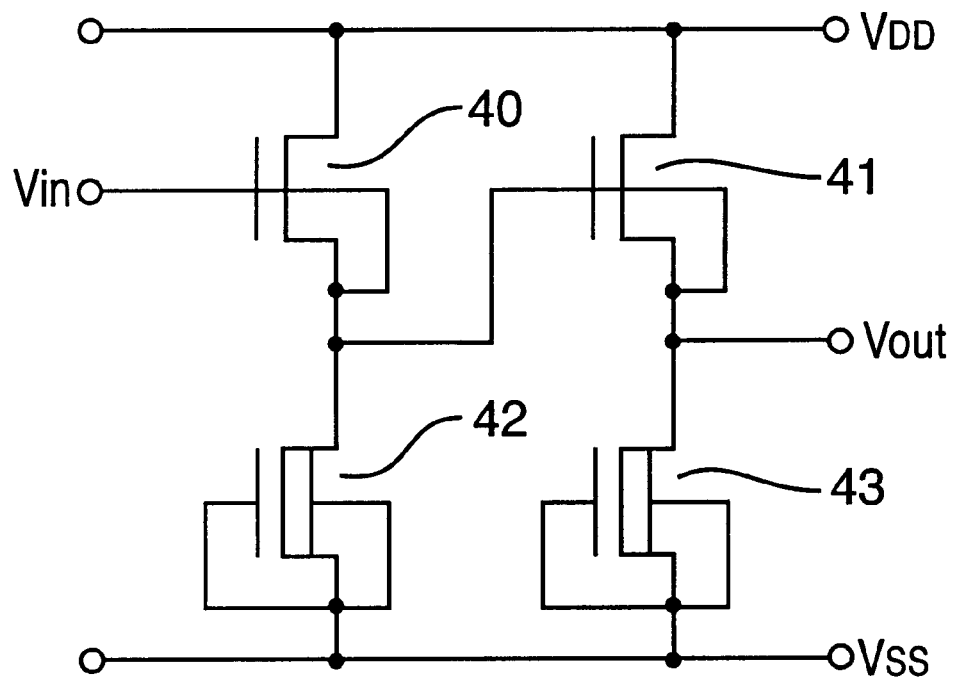
FIG. 12 is a circuit diagram showing an example of an output buffer amplifier as shown in the circuit diagram of FIG. 11.
Figure 13:
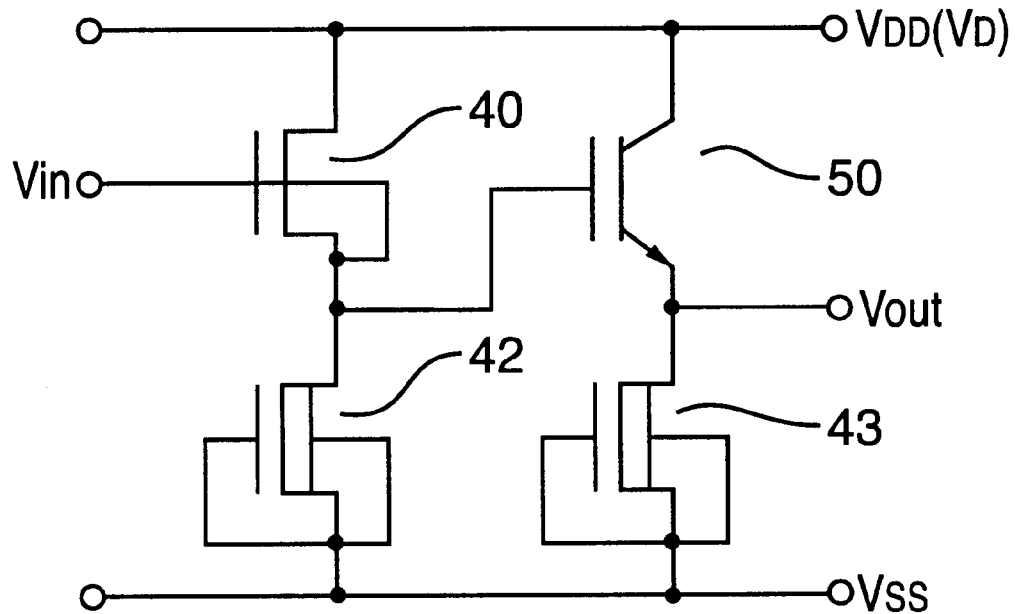
FIG. 13 is a circuit diagram of another example of an output buffer amplifier.

FIGS. 12 and 13 are circuit diagrams of examples of output buffer amplifiers useful as output buffer amplifiers 28a and 28b in the photoelectric conversion apparatus of FIG. 11.

The output buffer amplifier 28 can be constructed as a two-stage source-follower amplifier, using MOS transistors 40–43, as shown in FIG. 12.

Alternatively, the MOS transistor 41 shown in FIG. 12 may be replaced by a bipolar transistor 50. In this case, the output buffer transistor 28 is constructed as a source-follower-plus-emitter-follower type buffer amplifier, as shown in FIG. 13.

The photoelectric conversion apparatus of this embodiment employs as a substrate the high-density N-type semiconductor substrate 100. Accordingly, the bipolar transistor 50 shown in FIG. 13 can use a portion of the N-type semiconductor substrate 100 as its collector region. In this case, the drain-voltage source VD for the JFETs 2 of the pixels is used in common as a collector-voltage source for the bipolar transistor 50.

In general, a bipolar transistor has a relatively large transconductance Gm, as compared with a MOS transistor, for the same electric power. Therefore, the output buffer amplifier shown in FIG. 13 has higher operation speed, as compared with the one shown in FIG. 12, and reduced electric power consumption.

Figure 14:
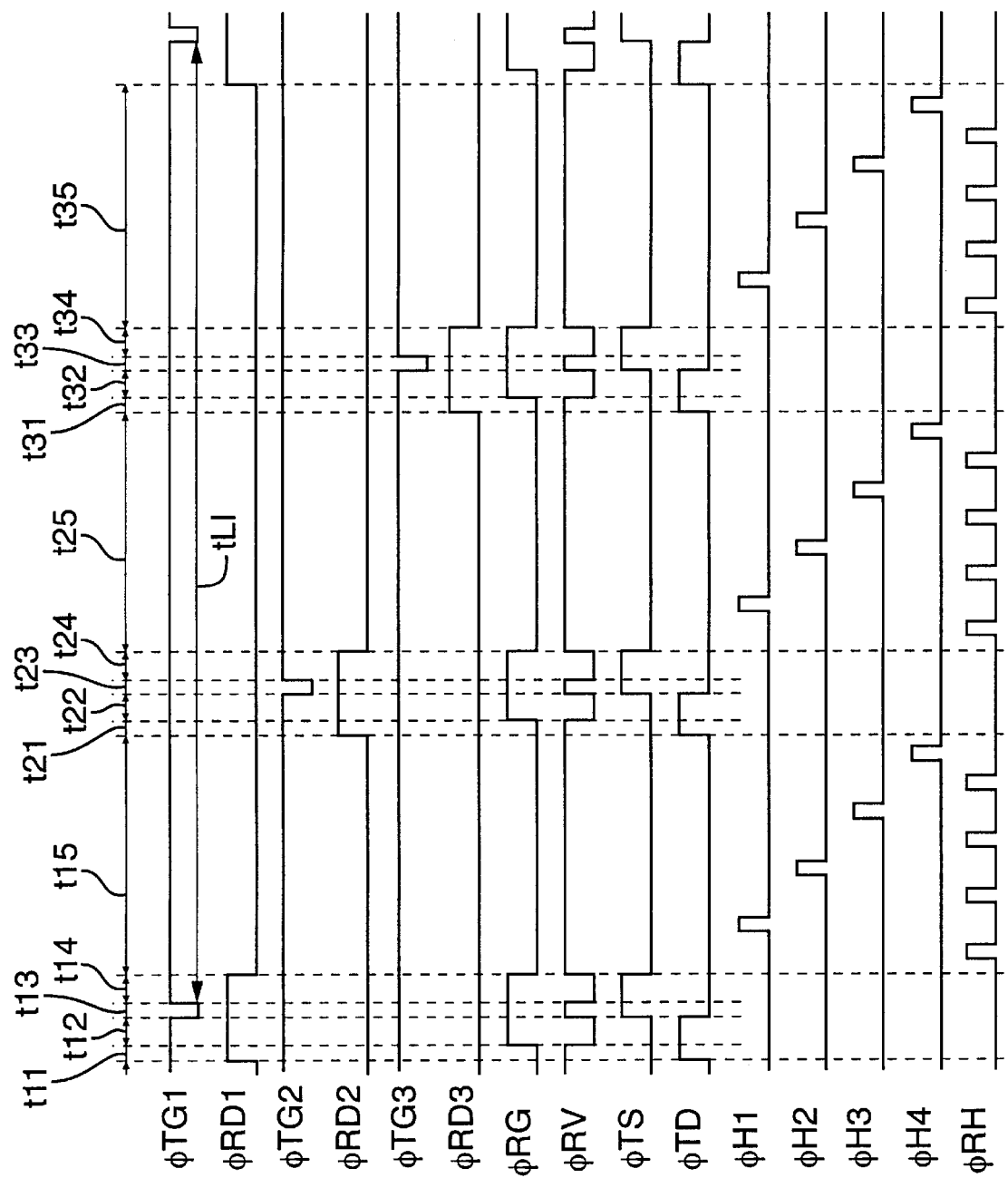
FIG. 14 is a timing chart illustrating the operation of the photoelectric conversion apparatus shown in FIG. 11.

FIG. 14 is a timing chart for the operation of the photoelectric conversion apparatus shown in FIG. 11. Since the transfer gate 3 and the reset gate 5 of each photoelectric conversion device (i.e., each unit pixel) are of the P-channel type, as shown in FIGS. 1 through 4, the polarities of the driving pulses φTG1–φTG3 and φRG are opposite to the polarities of the rest of the pulses. When the pulses φTG1–φTG3 and φRG are at the low level, the associated transfer gates 3 and the reset gates 5 are in the ON state, while when these pulses are at the high level, the associated gates are in the OFF state.

In the timing chart of FIG. 14, the first-row pixels are read out in the periods t11 through t15. The second-row pixels and third-row pixels are read out in the periods t21 through t25 and t31 through t35, respectively.

In interval t11, the current row (i.e., the first row) is selected and the JFETs 2 of the selected row are initialized. Interval t12 corresponds to the source-follower action of the first-row JFETs 2 after initialization, interval t13 corresponds to the transfer of the signal charges from the first-row photodiodes 1 to the JFETs 2, and interval t14 corresponds to the source-follower action of the first-row JFETs 2 after signal charge transfer. These four operations (in t11–t14) are performed within a period of a horizontal retrace line. In interval t15, a video signal is output.

More specifically, at the beginning of t11, the driving pulse φRD1 is changed to a high level, while the driving pulses φRD2 and φRD3 are kept at a low level, whereby a high-level voltage is applied to the reset drains 4 of the first-row pixels, while a low-level voltage is applied to the reset drains 4 of the second-row and third-row pixels. Upon application of the low-level driving pulse φRG, this high-level voltage is transferred to the gate regions of the JFETs 2 of the first-row pixels, while the low-level voltage is transferred to the gate regions of the JFETs 2 of the second-row and third-row pixels, via the respective reset gates 5, which are already in the ON state. Thus, the first-row JFETs 2 are selected (in the ON state), and the JFETs 2 of the second and later rows are not selected (in the OFF state).

At the end of t11, the driving pulse φRG is changed to the high level, and the reset gates 5 of all the pixels are turned off, placing the gate regions of the JFETs 2 into a floating state, while maintaining their ON (selected) state or OFF (non-selected) state. In other words, the gate regions of the JFETs 2 of the selected rows are initialized to the high-level voltage, and the gate regions of the JFETs 2 of the non-selected rows are initialized to the low-level voltage.

As has been described, in this photoelectric conversion apparatus shown in FIG. 11, a plurality of P-channel MOS transistors, each consisting of a gate region of a JFET 2, a reset gate 5, and a reset drain 4, are connected in series in the horizontal scanning direction. Accordingly, even if an open-mode defect occurs in a certain pixel and causes an electrical disconnection between the certain pixel's reset drain 4 and the associated reset drain interconnection 24, the gate region of the JFET 2 of the certain pixel can be correctly controlled during time t11 by other reset drains 4 via the MOS transistors. In this manner, the gate regions of the selected pixel row are correctly reset (or initialized) to the high-level voltage, and the gate regions of the non-selected pixel rows are correctly reset (or initialized) to the low-level voltage.

At the beginning of t12, the driving pulse φRV is changed to the low level, and the reset transistors TRV1–TRV4 are turned off, so that the JFETs 2 of the first pixel row begin source-follower action. In interval t12, the driving pulse φTD is set to the high level, and the dark-output transfer MOS transistors TD1–TD4 are in the ON state. A dark-output voltage, which corresponds to the electric potential of the gate region of each JFET 2 immediately after initialization, is thus applied to the dark-output storage capacitors CD1–CD4.

At the beginning of t13, the driving pulse φTG1 is changed to the low level, while the driving pulses φTG2 and φTG3 are kept at the high level, and the transfer gates 3 of the first-row pixels are turned on. This causes the signal charges generated and accumulated in the photodiodes 1 of the first-row pixels to be transferred to the associated gate regions of the JFETs 2. The electric potential of the gate region of each JFET 2 changes, immediately after the signal charge has been transferred (i.e., increases in this case), by the fraction expressed by (transferred signal charge)/(gate capacitance).

At the end of t13, the driving pulse φTG1 is changed to the high level and the transfer gates 3 are turned off, whereby the first-row photodiodes 1 start the next photoelectric conversion operation and accumulation of the next signal charge. In FIG. 14, tLI thus denotes the electric charge-accumulation time of the photodiode 1.

At the beginning of t14, the driving pulse φRV is changed to the low level, and the reset transistors TRV1–TRV4 are turned off, whereby the first-row JFETs 2 again begin source-follower action. In interval t14, the driving pulse φTS is at the high level, and the photosignal output transfer MOS transistors TS1–TS4 are in the ON state. Thus a photosignal-output voltage, corresponding to the electric potential of the gate region of each JFET 2 immediately after the signal charge is transferred to the gate region, is applied to the photosignal-output storage capacitors CS1–CS4.

The constant-current sources 26a–26d act as loads on the source-follower action in intervals t12 and t14. The constant-current sources 26a–26d thus control the activation point and the operation speed of the JFETs 2.

The charge-amplification rate of the source-follower action is defined by the ratio of the photosignal-output storage capacitance CS to the gate capacitance Cg of the JFET (the ratio CS/Cg). In this illustrative embodiment, an amplification rate as high as several hundred to several thousands can be achieved.

Because the source-follower action is performed for each pixel row within a period of a horizontal retrace line, the amplification time can be increased, as compared with a photoelectric conversion apparatus in which the charge is amplified for each pixel in synchrony with the horizontal scan (based on, for example, driving pulses φH1–φH4). In addition, by increasing the capacitance values of the photosignal-output storage capacitor CS1–CS4 and the dark-output storage capacitors CD1–CD4, the operational bandwidth of the source-follower action can be reduced by a factor of 1/10 to 1/100. Consequently, the noise inevitably generated during amplification can be greatly reduced.

In interval t15, the horizontal scanning circuit 8 outputs driving pulses φH1–φH4 successively. The driving pulses φH1–φH4 cause the charges accumulated in the photosignal-output storage capacitors CS1–CS4 and the dark-output storage capacitors CD1–CD4 to be transferred to the horizontal-signal output line 27a and the horizontal dark-output line 27b, respectively. The potential of these output lines 27a and 27b are finally output as video signals, from the output terminals VOS and VOD, via the output buffer amplifiers 28a and 28b. In t15, the driving pulse φRH is also triggered successively in order to reset the horizontal signal lines 27a and 27b.

The video signals output from the output terminals VOS and VOD are supplied to an external arithmetic-processing circuit (not shown), and subjected to a subtraction operation. That is, the video signal output from VOD, which contains only a dark component, is subtracted from the video signal output from VOS, which contains both a photosignal component and a dark component. As a result of the subtraction (VOS-VOD), a video signal which represents the photosignal component is extracted.

The dark component contained in both VOS and VOD includes a fixed-pattern noise component due to variation in the threshold voltage of each JFET 2, a reset noise component generated in the channel region under the reset gate 5 during the initialization of the gate region of the associated JFET 2 via the reset drain 4 and the reset gate 5, and a 1/f noise component generated during the source-follower action by the JFET 2 and the constant-current sources 26a–26d.

Subtracting VOD from VOS produces a video signal containing only a photosignal component, from which the noise component is removed. The S/N ratio is thus improved.

The readout operation for the first-row pixels performed in the periods t11 through t15 is repeated in the periods t21 through t25 and t31 through t35 for the second-row and third-row pixels, respectively.

The reset drain driving pulses (φRD1–φRD3) are at the low level during most of the time from periods t11 through t15. When the reset drain driving pulses (φRD1–φRD3) are at the low level, the excessive charge generated by the photodiode 1 flows into the low-level reset drain 4 via the overflow-control region 6a.

However, during the periods t11 through t14, the driving pulse φRD1 is at the high level. The overflow action to the first-row reset drains 4 is thus temporarily interrupted (or its state changes). The same problem applies to the overflow operations for the second-row and third-row reset drains during the periods t21 through t24 and t31 through t34.

In order to overcome this problem, the overflow action is performed for each photodiode using two channels in the vertical scanning direction in this embodiment (shown in FIGS. 7 through 10). Even if the overflow action is interrupted in one of the two channels, it is correctly performed in the other channel, so that blur, such as looming and smear, can be reduced.

In summary, as explained above, the photoelectric conversion apparatus of this fourth illustrative embodiment (shown in FIGS. 7 through 11) uses a plurality of photoelectric conversion devices of the first embodiment (FIGS. 1 through 4) arranged in a matrix. Each device comprises a photodiode 1, a transfer gate 3, a reset drain 4, two reset gates 5, and two overflow-control regions 6a. Each device employs a buried photodiode having a lateral overflow drain structure, in order to reduce the dark current, after-image, reset noise and blooming or smear.

In addition, the narrow-bandwidth source-follower action of the JFET 2, with the photosignal-output storage capacitance and the dark-output storage capacitance as loads, can achieve a high charge-amplification rate, while reducing the noise during the amplification.

Furthermore, the subtraction of VOD from VOS can reduce (1) the fixed-pattern noise component due to variation in the threshold voltage of each JFET 2, (2) the reset noise component generated during the initialization of the gate region of the JFET 2, and (3) the 1/f noise component generated during the source-follower action.

Thus a highly sensitive video signal with low noise (i.e., higher S/N ratio) can be obtained, as compared to the conventional photoelectric conversion apparatus (FIGS. 49 through 53).

Because the drain interconnection is eliminated from this photoelectric conversion apparatus, short-circuit-mode defects between the drain interconnection and the vertical signal line can be avoided, and the production yield is increased.

Further, even if an open-mode defect causing a faulty connection between the reset drain and the reset drain interconnection occurs, the gate region of each JFET is correctly controlled, whereby vertical blank lines appearing in the resultant image are reduced, and production yield is increased.

Also, the sensitivity of the apparatus is improved because the light-receiving aperture ratio is increased, with the absence of drain interconnections.

The charge generated in the deep portion of the photodiode 1 by photoelectric conversion can also be accumulated in the P-type charge-accumulation region 12 of the photodiode 1 itself, without being absorbed by the semiconductor substrate. Accordingly, the sensitivity to light, especially light having a long wavelength, is improved.

Fifth Illustrative Embodiment

Figure 15:
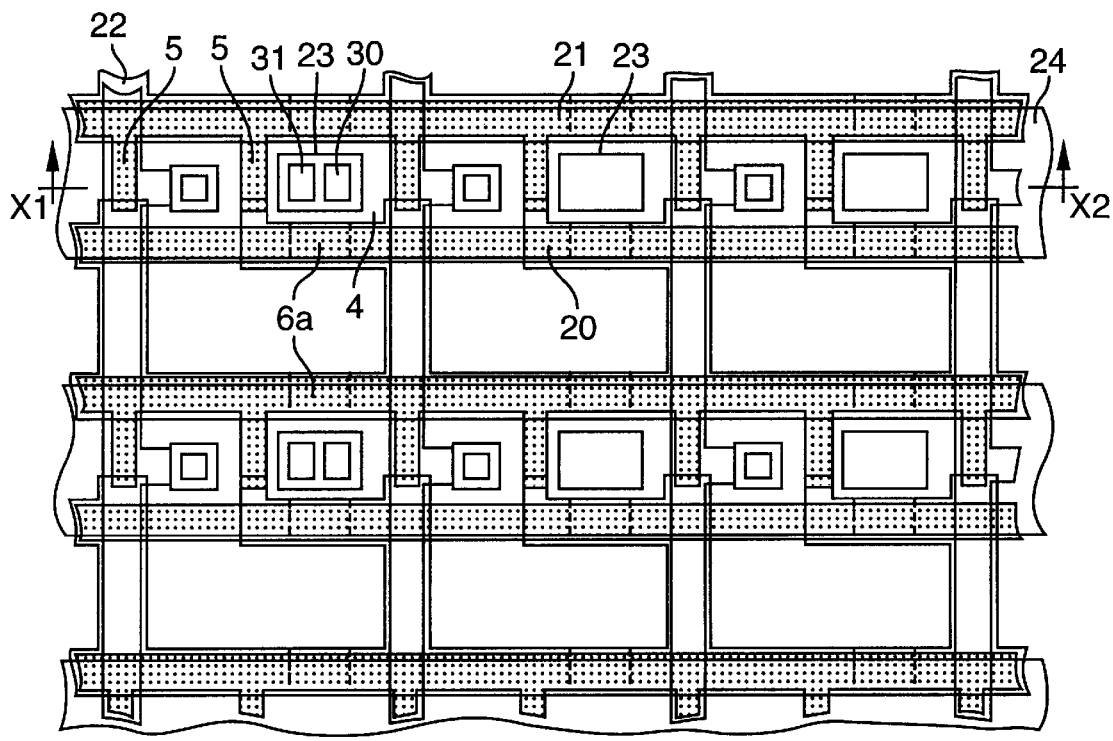
FIG. 15 is a plan view of a photoelectric conversion apparatus of a fifth illustrative embodiment of the invention.
Figure 16:
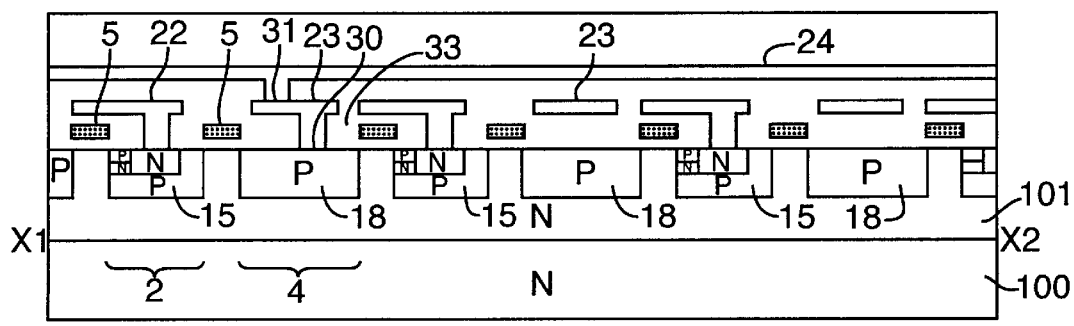
FIG. 16 is a cross-sectional view taken along the X1-X2 line shown in FIG. 15.

FIGS. 15 and 16 illustrate portions of a photoelectric conversion apparatus according to a fifth illustrative embodiment of the invention. FIG. 15 is a plan view. FIG. 16 is a cross-sectional view taken along the X1-X2 line shown in FIG. 15.

A major difference between the photoelectric conversion apparatus of this embodiment (shown in FIGS. 15 and 16) and that of the fourth illustrative embodiment (shown in FIGS. 7 through 10) lies in the electrical connection between the reset drain 4 and the reset drain interconnection 24.

In the photoelectric conversion apparatus of this embodiment, shown in FIGS. 15 and 16, a contact hole 30 and a relay connection hole 31, formed in order to connect the charge-drain region 18 of the reset drain 4 to the reset drain interconnection 24, are shared in common by a plurality of (e.g., two to twenty) photoelectric conversion devices arranged in the horizontal scanning direction. This arrangement differs from the photoelectric conversion apparatus of the fourth embodiment shown in FIGS. 7 through 10.

In general, contact holes and connection holes formed in a semiconductor integrated circuit (including a photoelectric conversion apparatus) are likely to cause at least two types of defects. One type of defect, termed an open-mode defect, interrupts correct electrical connections as discussed above. The other type of defect, termed a short-circuit-mode defect, causes random electrical connections of the circuit elements at a position away from the target point, due to the inaccuracy of the pattern of the underlayer (i.e., the inaccuracy of the semiconductor regions and of the interconnection formed under the contact hole).

For example, if the pattern of the gate interconnection 20 or the reset gate interconnection 21 shown in FIG. 15 varies from the designed pattern due to particles adhering to the lines during the manufacturing process, these interconnections are likely to be short-circuited to the relay interconnection 23 via a contact hole 30.

In this fifth illustrative embodiment, the number of contact holes 30 for connection to the reset drain 4 and the number of relay connection holes 31 for connection to the relay interconnection are reduced. Accordingly, the frequency of short-circuit-mode defects decreases, and the production yield is improved.

In a pixel having no direct connection between the reset drain 4 and the reset drain interconnection 24, the gate region 15 of the JFET 2 of that pixel is correctly controlled by the reset drains 4 of other pixels in the same row (in the horizontal scanning direction) that are electrically connected to the reset drain interconnection 24 via the MOS transistors connected in series. (As described above with respect to the fourth illustrative embodiment, each such MOS transistor comprising a gate region 15 of a JFET 2, a reset gate 5, and a charge-drain region 18 of a reset drain 5.)

The same applies to the overflow operation. In a pixel whose reset drain 4 is not connected to the reset drain interconnection 24, the excessive charge flowing out of the photodiode 1 into the disconnected reset drain 4 is guided to the reset drains 4 of other pixels in the same row via the plurality of MOS transistors, and is further guided to the reset drain interconnection 24 from connected reset drains 4.

In this manner, a plurality of photoelectric conversion devices arranged in the horizontal scanning direction share a contact hole 30 for connection to the reset drain 4 and a connection hole 31.

If the total number of contact holes 30 for connection to the reset drain 4 and the number of relay connection holes 31 are determined so that each hole is shared by two photoelectric conversion devices, then the short-circuit-mode defect occurrence rate is reduced to one half (½) of the rate in the device of the fourth illustrative embodiment. If three devices share one hole, then the short-circuit defect occurrence rate is reduced to one third (⅓). With four devices per hole, the short-circuit defect occurrence rate is reduced to one fourth (¼). However, it is undesirable to reduce the number of contact holes 30 and relay connection holes 31 too much (e.g., to as much as one hundred devices per hole).

If too many horizontally consecutive photoelectric conversion devices do not have contact holes to their reset drains 4, the gate regions of the JFETs positioned in the middle of the consecutive group must be controlled via many MOS transistors connected in series in the horizontal scanning direction. In such a case, the parasitic resistance and the parasitic capacitance in the serially connected MOS channels increases sufficiently that the operation speed slows down. Another reason not to severely reduce the number of contact holes 30 and relay connection holes 31 is that, if two or more defects occur in the MOS transistors in the consecutive group, all the JFETs located between these two MOS transistors are put out of control, and the production yield decreases abruptly.

For these reasons, the preferable numbers of contact holes 30 and relay-connection holes 31 are such that each hole is shared by two to twenty devices. Within this range, the operation speed is not unduly adversely affected, and short-circuit defects are reduced, while other defects remain adequately low so that production yield can be kept high.

Sixth Illustrative Embodiment

Figure 17:
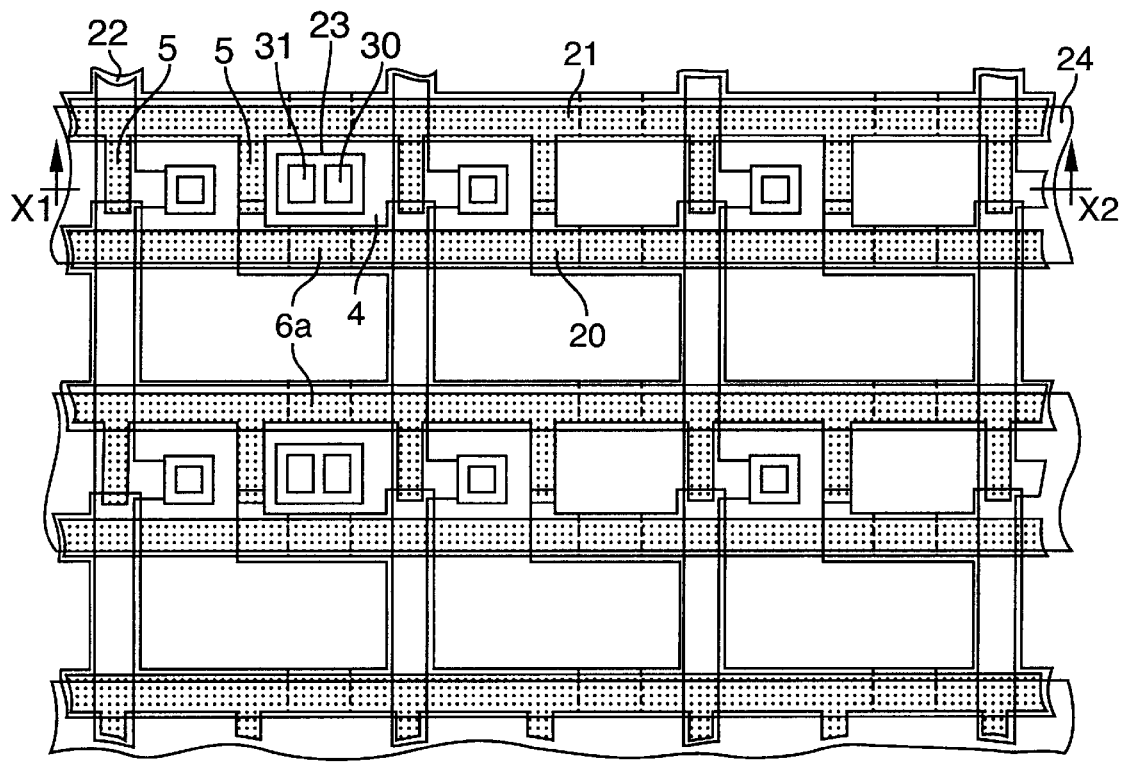
FIG. 17 is a plan view of a photoelectric conversion apparatus of a sixth illustrative embodiment of the invention.
Figure 18:
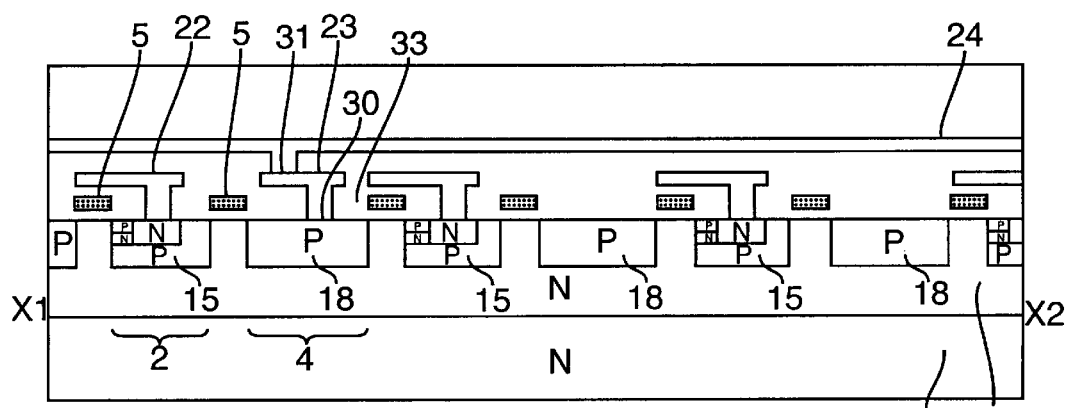
FIG. 18 is a cross-sectional view taken along the X1-X2 line shown in FIG. 17.

FIGS. 17 and 18 illustrate portions of a photoelectric conversion apparatus according to a sixth illustrative embodiment of the invention. FIG. 17 is a plan view. FIG. 18 is a cross-sectional view taken along the X1-X2 line shown in FIG. 17.

The photoelectric conversion apparatus of this embodiment differs from that of the fifth illustrative embodiment shown in FIGS. 15 and 16 in the method for forming the relay interconnection 23.

In this embodiment, in addition to the reduced number of contact holes 30 and relay connection holes 31, the number of relay interconnections 23 is also selected so that relay interconnections are formed only where contact holes 30 and relay connection holes are formed. Each relay connection is thus shared by a plurality of (e.g., two to twenty) photoelectric conversion devices arranged in the horizontal scanning direction. This differs from the photoelectric conversion apparatus of the fifth embodiment shown in FIGS. 15 and 16. This means that the number of relay interconnections 23 is greatly reduced as compared with the conventional apparatus.

In general, the vertical signal lines 22 and the relay interconnections 23 are formed in the same manufacturing step. In particular, after the deposition of a metal film, which is an interconnection material, pattern transfer and etching are performed using a photolithography/etching technique in order to form the vertical signal lines 22 and relay interconnections 23.

If the layout of the vertical signal lines 22 and the relay interconnections 23 is dense, some vertical lines 22 may contact the adjacent relay interconnections 23, causing short-circuit-mode defects. This results in decreased production yield.

In this embodiment, the number of relay interconnections 23 is reduced, and the interconnection structure is thus simplified. Consequently, the frequency of short-circuit-mode defects decreases, and the production yield increases.

In a pixel in which a relay interconnection (with associated contact holes) is not present, the JFET can be correctly controlled in the same manner as in the fifth embodiment (FIGS. 15 and 16), and the overflow operation is similarly appropriately performed.

Circuit Diagram for Fifth and Sixth Illustrative Embodiments

Figure 19:
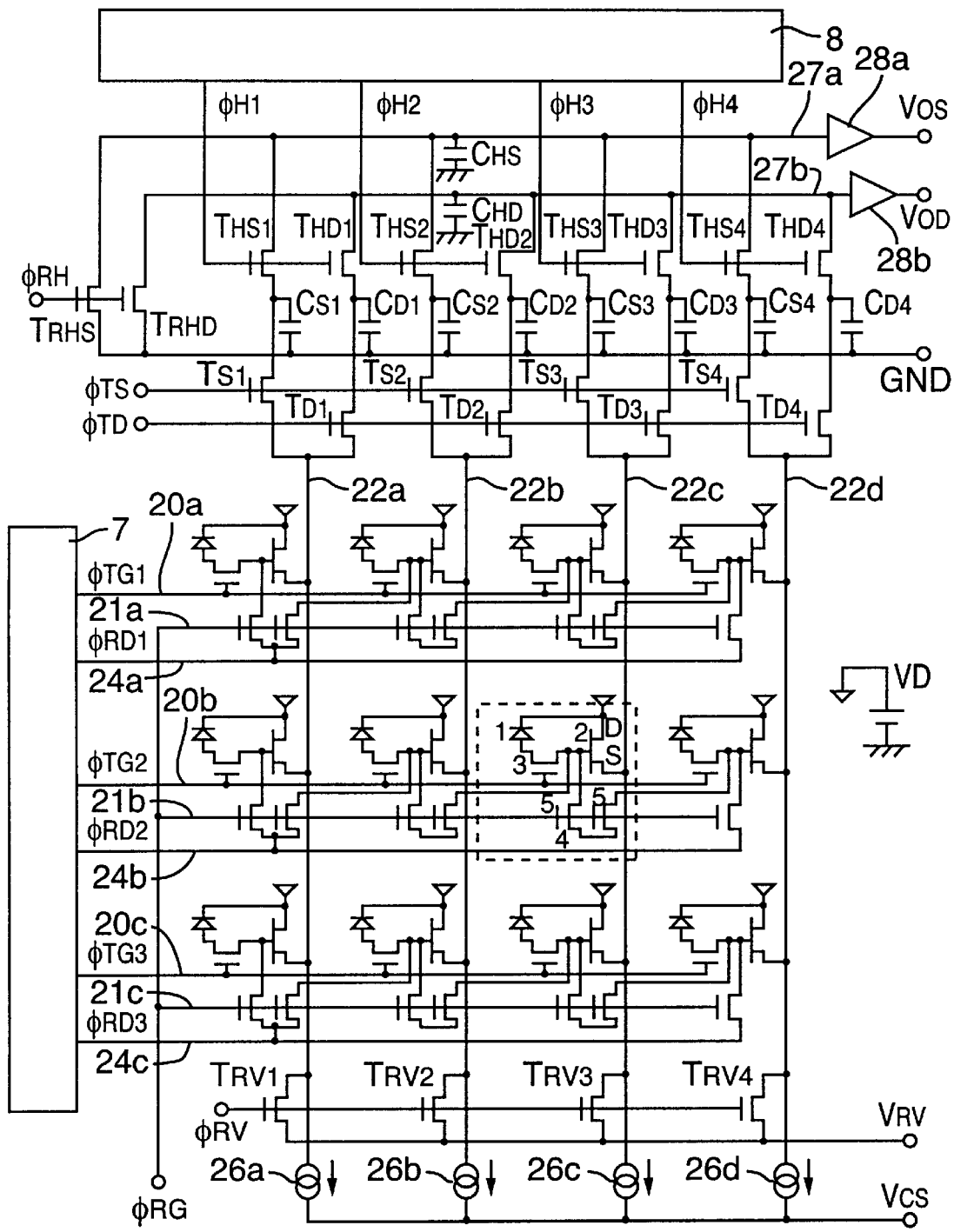
FIG. 19 is a circuit diagram of a photoelectric conversion apparatus the major portions of which are shown in FIGS. 15 and 16, or in FIGS. 17 and 18.

FIG. 19 is a circuit diagram of the photoelectric conversion apparatus of the fifth illustrative embodiment (FIGS. 15 and 16) and of the sixth illustrative embodiment (FIGS. 17 and 18).

The difference between the circuit of FIG. 19 and that of the fourth illustrative embodiment shown in FIG. 11 lies in the nature of the electrical connection between the reset drain 4 of each photoelectric conversion device (i.e., each unit pixel) and the associated reset drain interconnection (i.e., one of the reset drain interconnections 24a–24c).

In FIG. 19, the reset drains 4 of a plurality of photoelectric conversion devices (i.e., unit pixels) arranged in the horizontal scanning direction are connected in common to one of the reset drain interconnections 24a–24c, which is a major difference from the apparatus shown in FIG. 11. This is because each of the contact holes 30, each of the relay interconnections 23, and each of the relay connection holes 31 are shared by a plurality of (e.g., two to twenty) photoelectric conversion devices, as has been explained with reference to FIGS. 15 and 16.

The rest of the structure is the same as that shown in FIG. 11, and the explanation for it will therefore be omitted.

The pulse timing for this photoelectric conversion apparatus (FIG. 19) is identical to that shown in FIG. 12 and, therefore, the timing chart and related explanation is omitted.

Seventh Illustrative Embodiment

Figure 20:
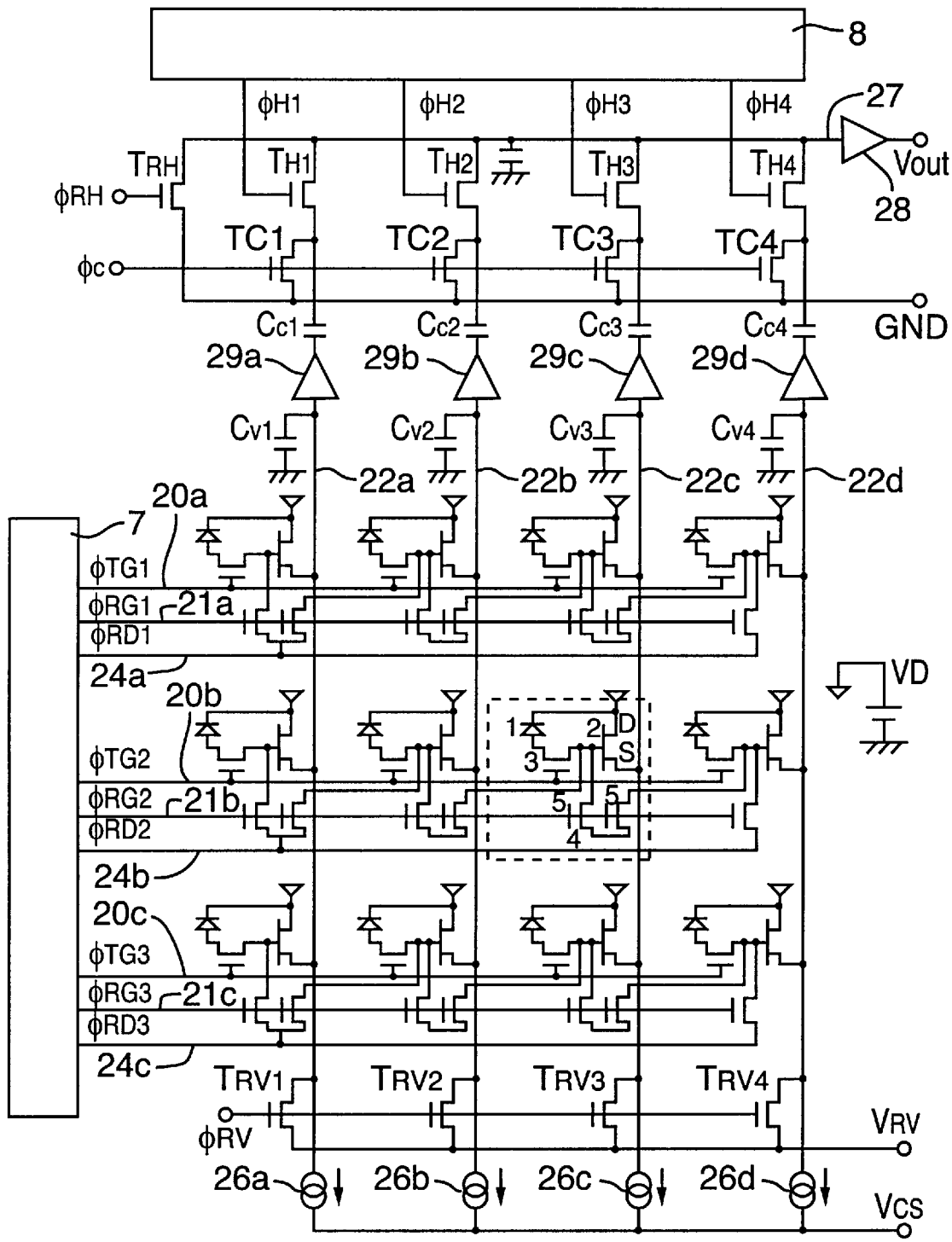
FIG. 20 is a circuit diagram of a photoelectric conversion apparatus of a seventh illustrative embodiment of the invention.

FIG. 20 is a circuit diagram of a photoelectric conversion apparatus according to a seventh illustrative embodiment.

The structure of each pixel of this apparatus is the same as that of the fifth and/or sixth illustrative embodiments (FIGS. 15 and 16, and 17 and 18, respectively). However, the readout circuit structure (the circuit structure at the end of vertical signal lines 22a–22d located at the top of FIG. 20) differs from that of the fifth and sixth illustrative embodiments (FIG. 19). The driving method of this apparatus also differs, in accordance with the operation of the differing circuit structure. Description of structure, operation, and advantages identical to that of the FIG. 19 embodiment will be omitted, as reference may be made to the description above relative to FIG. 19 (and to the description above relative to FIG. 11, as referenced above relative to FIG. 19).

In the seventh illustrative embodiment of FIG. 20, one end of each of the vertical signal lines 22a–22d (the upper end in the figure) is connected to a respective one of the vertical load capacitors Cv1–Cv4, and, via a respective one of the column buffer amplifiers 29a–29d, to a first terminal of a respective one of the clamp capacitors Cc1–Cc4. Each other terminal of the clamp capacitors Cc1–Cc4 is connected to a respective one of the clamp transistors TC1–TC4. The clamp transistors TC1–TC4 are connected to the horizontal signal line 27 via the horizontal selection MOS transistors TH1–TH4, respectively.

The clamp transistors TC1–TC4 are activated by a driving pulse φC, and the MOS transistors TH1–TH4 are successively and respectively activated by the driving pulses φH1–φH4, supplied by the horizontal scanning circuit 8.

The capacitances of vertical load capacitors Cv1–Cv4 act as loads on the source-follower action of the JFETs 2 of the associated columns, and they limit the operational bandwidth (by functioning as low-pass filters) in order to reduce noise. If the number of photoelectric conversion devices arranged in the vertical scanning direction is large, then the parasitic capacitances of the vertical signal lines 22a–22d may be substituted for the vertical load capacitances Cv1–Cv4.

An output buffer amplifier 28 and a horizontal-line reset MOS transistor TRH for the horizontal signal line are also connected to the horizontal signal line 27. The reset MOS transistor TRH is activated by a driving pulse φRH. A parasitic capacitance CH exists in the horizontal signal line 27.

The output buffer amplifier 28 used in this seventh illustrative embodiment may be, for example, one like those described with respect to the fourth illustrative embodiment. Thus, the output buffer amplifier 28 may be either a two-stage source-follower amplifier as shown in FIG. 12, or a source-follower-plus-emitter-follower type buffer amplifier shown in FIG. 13. The bipolar transistor 50 shown in FIG. 13 may use a portion of the high-density N-type semiconductor substrate 100 as a collector region.

Figure 21A:
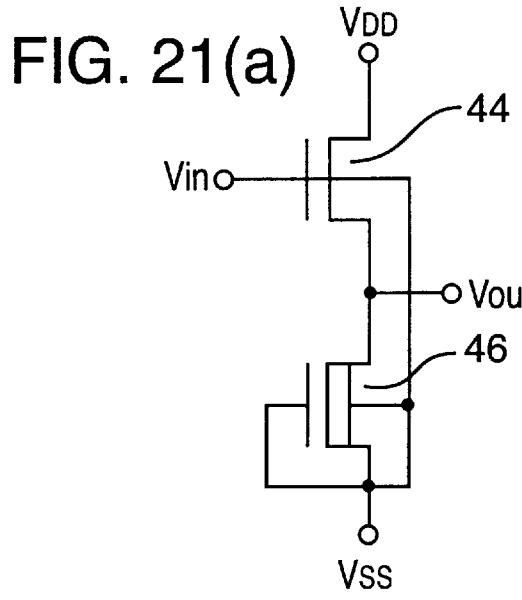
FIG. 21 is a circuit diagram showing an example of the column buffer amplifier shown in the circuit diagram of FIG. 20.
Figure 21B:
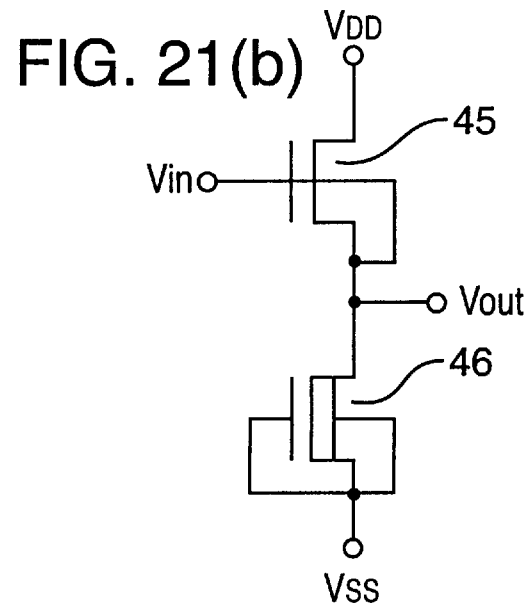
Figure 21C:
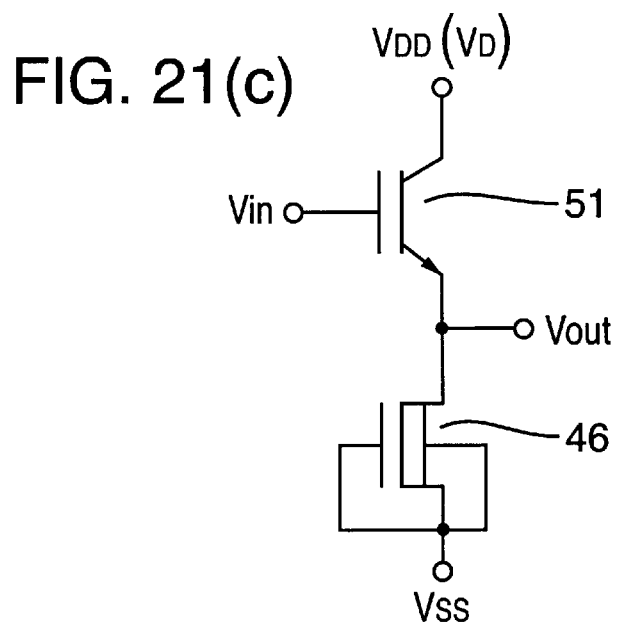

FIGS. 21(a)–21(c) illustrate three examples of the column buffer amplifier 29 used in the photoelectric conversion apparatus shown in FIG. 20. As shown in FIGS. 21(a) and 21(b), each of the column buffer amplifiers 29a–29d may be constructed as a source-follower amplifier using MOS transistors 44–46. The column buffer amplifier shown in FIG. 21(b) uses a well-type MOS transistor 45, in which the well and the source of the MOS transistor 45 are connected in common and, therefore, the substrate-bias effect does not occur. With this amplifier, the gain of the source-follower action increases, while the variation in the gain can be reduced, as compared with the column amplifier shown in FIG. 21(a).

Each of the column buffer amplifiers 29a–29d may be constructed as an emitter-follower amplifier using a bipolar transistor 51, as shown in FIG. 21(c).

Because the column buffer amplifiers 29a–29d operate in synchrony with each other in the horizontal scanning direction, high-speed operation with low noise is required for each amplifier. Furthermore, since a buffer amplifier is included in each column, low power consumption is desirable for each amplifier. Thus, it is preferable for the column buffer amplifier to be a device having a high transconductance Gm.

Because a bipolar transistor generally has a relatively high transconductance Gm, as compared with a MOS transistor, it is preferable for the column buffer amplifiers 29a–29d to have the structure shown in FIG. 21(c) using a bipolar transistor 51.

Figure 22:
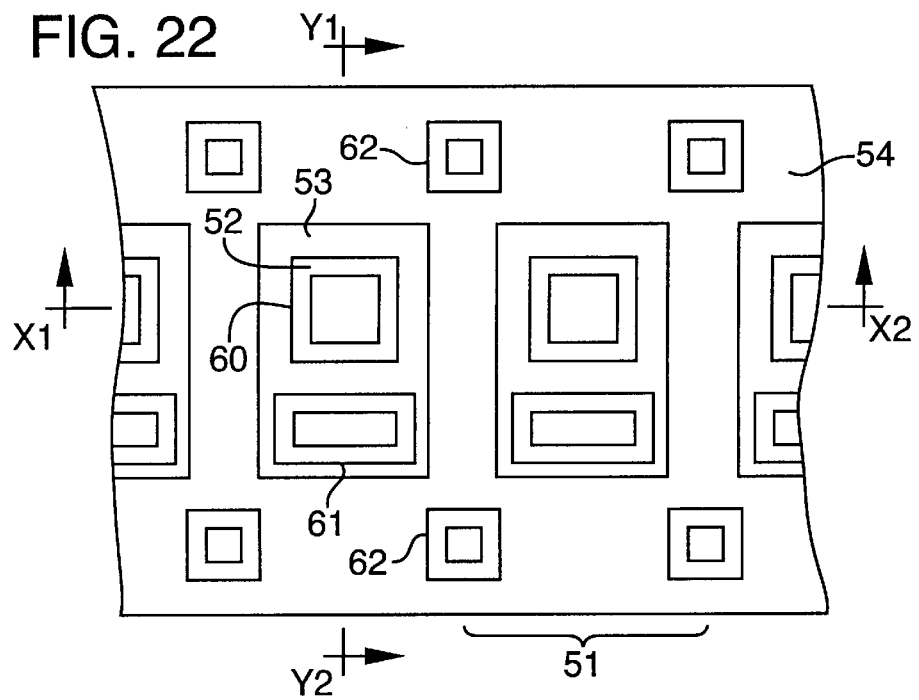
FIG. 22 is a plan view of a bipolar transistor for the column buffer amplifier shown in FIG. 21.
Figure 23:
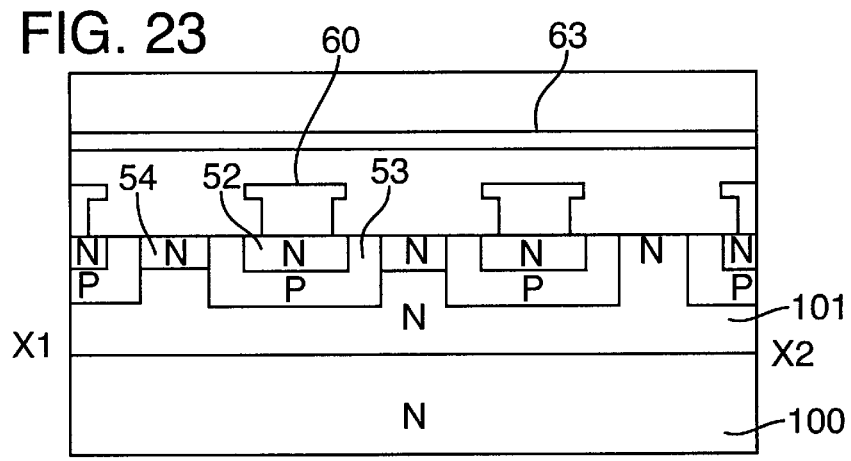
FIG. 23 is a cross-sectional view taken along the X1-X2 line shown in FIG. 22.
Figure 24:
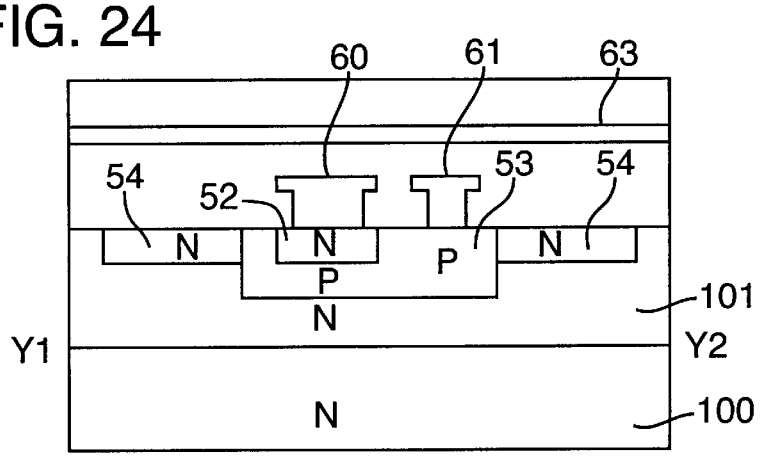
FIG. 24 is a cross-sectional view taken along the Y1-Y2 line shown in FIG. 22.

An example of the bipolar transistor 51 used in FIG. 21(c) is shown in FIGS. 22 through 24. FIG. 22 is a plan view. FIG. 23 is a cross-sectional view taken along the X1-X2 line of FIG. 22. FIG. 24 is a cross-sectional view taken along the Y1-Y2 line of FIG. 22.

As shown in FIGS. 22 through 24, the bipolar transistor 51 primarily comprises an N-type emitter region 52, a P-type base region 53, and a collector region which consists of a portion of the N-type semiconductor layer 101 and a portion of the high-density N-type semiconductor substrate 100. An N-type collector contact region 54 is electrically connected to the high-density N-type semiconductor substrate 100. Multiple bipolar transistors 51 are arranged in the horizontal scanning direction at the same pitch as the pixel columns.

An emitter electrode 60, a base electrode 61, and a collector electrode 62 are provided to the N-type emitter region 52, the P-type base region 53, and the N-type collector contact region 54, respectively. A light-blocking layer 63 shields the transistor components from incident light. Although not shown in FIGS. 22 through 24, the base electrode 61, which functions as an input terminal of the bipolar transistor 51, is connected to one end of one of the vertical signal lines 22a–22d, while the emitter electrode 60, which functions as an output terminal of the bipolar transistor 51, is connected to one end of one of the clamp capacitors Cc1–Cc4, and to a load MOS transistor 46. The collector electrode 62 and the drain of the pixel JFET 2 are connected in common to the drain-voltage source VD.

The N-type emitter region 52 and the P-type base region 53 of the bipolar transistor 52 shown in FIGS. 22 through 24 are formed during the same manufacturing step as the formation of the N-type source region 14 and the P-type gate region 15 of the JFET 2 (shown in FIGS. 1 through 4). Thus, the bipolar transistor 51 for the column buffer amplifier can be formed without additional manufacturing steps.

In the same manner as the examples of bipolar transistor 51 for a column buffer amplifier shown in FIG. 21(c), the bipolar transistor 50 for an output buffer amplifier shown in FIG. 13 can also be formed in the same manufacturing step as the formation of JFETs 2.

Figure 25:
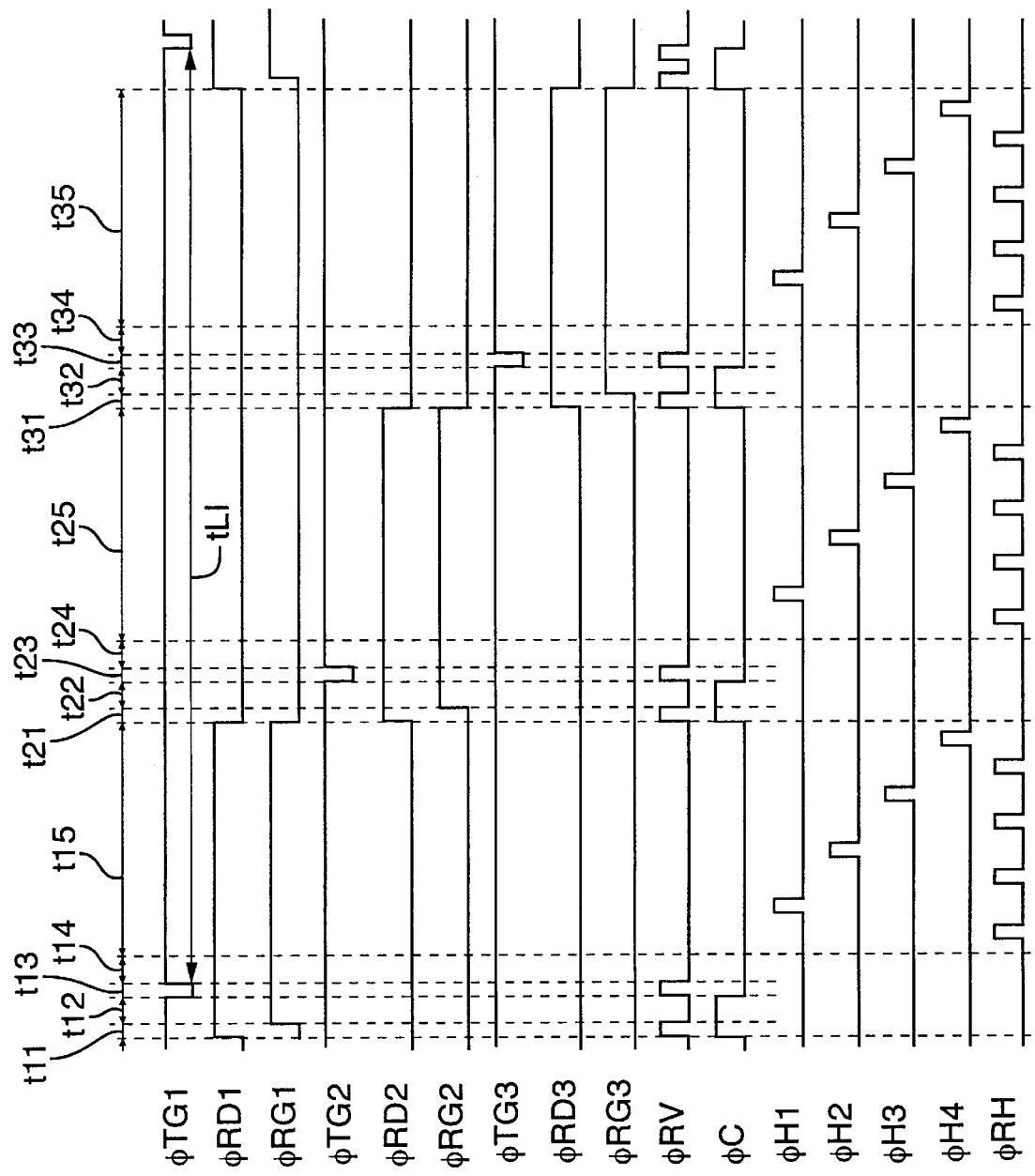
FIG. 25 is a timing chart illustrating the operation of the photoelectric conversion apparatus shown in FIG. 20.

FIG. 25 is a timing chart for the photoelectric conversion apparatus of the seventh illustrative embodiment shown in FIG. 20. Description of the operation of the seventh illustrative embodiment relative to this timing chart will be primarily limited to the features unique to the seventh illustrative embodiment.

In the timing chart of FIG. 25, the first-row pixels are read out in the periods t11 through t15. The second-row pixels and the third-row pixels are read out in the periods t21 through t25 and t31 through t35, respectively.

In interval t11, the current row (i.e., the first row) is selected and the JFETs 2 of the selected row are initialized. Interval t12 corresponds to the source-follower action and the clamp action of the first-row JFETs 2 after initialization, interval t13 corresponds to the transfer of the signal charges from the first-row photodiodes 1 to the JFETs 2, and interval t14 corresponds to the source-follower action of the first-row JFETs 2 after the signal-charge transfer. These four operations (in t11–t14) are performed within a period of a horizontal retrace line.

In interval t15, a video signal is output. The source-follower action performed in interval t14 continues in t15.

In the same manner as in the previously described illustrative embodiments, by the end of t11 the gate regions of the JFETs 2 of the selected row are initialized to the high-level voltage, while the gate regions of the JFETs 2 of the non-selected row are initialized to the low-level voltage.

At the beginning of t12, the driving pulse φRV is changed to the low level, and the reset transistors TRV1–TRV4 are turned off, and the JFETs 2 of the first pixel row begin source-follower action. Accordingly, a dark-output voltage, which corresponds to the electric potential of the gate region of each JFET 2 immediately after the initialization, is applied to the input terminal (the side of the vertical signal lined 22a–22d) of one of the clamp capacitors Cc1–Cc4 via one of the column buffer amplifiers 29a–29d. At this time, the driving pulse φC is to the high level, and the clamp transistors TC1–TC4 are in the ON state. The output terminals (the side of the capacitors toward the horizontal signal line 27) of the clamp capacitors Cc1–Cc4 are thus grounded.

At the end of t12, the driving pulse φC is changed to the low level, and the clamp transistors TC1–TC4 are turned off. The output terminals of the clamp capacitors Cc1–Cc4 are put into a floating state, while the dark-output voltage is maintained in the clamp capacitors Cc1–Cc4. This operation may be called clamping of the dark-output voltage.

As in the previously described illustrative embodiments, by the beginning of t14, the signal charges have been transfered to the gate regions of the first-row FETs 2. The driving pulse φRV is then changed to the low level, the reset transistors TRV1–TRV4 are turned off, as in t12, and the first-row JFETs 2 begin source-follower action. A photosignal-output voltage, which corresponds to the electric potential of the gate region of each JFET 2 immediately after the signal charge is transferred to this gate region, is then applied to the input terminal of one of the clamp capacitors Cc1–Cc4 via one of the buffer amplifiers 29a–29d. The driving pulse φC remains at the low level, and the output terminals of the clamp transistors TC1–TC4 are in a floating state.

The voltage appearing at this time at the output terminal of each of the clamp capacitors Cc1–Cc4 takes on a value obtained by subtracting the dark-output voltage from the photosignal-output voltage.

The photosignal output resulting from the source-follower action of the JFET 2 in interval t14 contains both a photosignal component and a dark component. The dark output resulting from the source-follower action of the JFET 2 in interval t12 contains only a dark component. Therefore, the voltage appearing at the output terminal of each of the clamp capacitors Cc1–Cc4 represents the photosignal component, from which the dark component is removed.

In interval t15, the first-row JFETs 2 continuously perform source-follower action, as in t14. The horizontal scanning circuit 8 successively outputs driving pulses φH1–φH4 in order to transfer the voltages appearing at the output terminals of the clamp capacitors Cc1–Cc4 to the horizontal signal line 27. These voltages, which represent only the photosignal component, are output as video signals from the output terminal Vout via the output buffer amplifier 28. Driving pulse φRH is triggered successively in order to reset the horizontal signal line 27 between output signals.

In interval t15, the column buffer amplifiers 29a–29d operate at a high speed. To be more precise, the column buffer amplifiers 29a–29d charge the clamp capacitors Cc1–Cc4 and the parasitic capacitor CH in the horizontal signal line connected in series with the clamp capacitors, in synchrony with the driving pulses φH1–φH4. Each of the column buffer amplifiers 29a–29d thus preferably uses the bipolar transistor shown in FIG. 21(c), which is superior in speed of operation, power consumption, and noise reduction.

The readout operation for the first-row pixels performed in the periods t11 through t15 is repeated in the periods t21 through t25 and t31 through t35 for the second-row and third-row pixels, respectively.

As with the previously described illustrative embodiments, the photoelectric conversion apparatus of the seventh illustrative embodiment shown in FIG. 20 uses a plurality of photoelectric conversion devices each having a buried photodiode having a lateral overflow drain structure, in order to reduce the dark current, after-image, reset noise and blooming or smear.

This seventh illustrative embodiment also employs narrow-bandwidth source-follower action of the JFET 2, with the vertical load capacitances Cv1–Cv4 as loads, to reduce amplification noise. In this illustrative embodiment, each of the vertical capacitors functions as an element of a low-pass filter.

Further, by taking the difference, via the clamp capacitors Cc1–Cc4, between the output voltages of the source-follower action before and after the signal-charge transfer, various noise components can be reduced. These include the fixed-pattern noise component due to the variation in the threshold voltage of each JFET 2, the reset noise component generated during the initialization of the gate region of the JFET 2, the 1/f noise component generated during the source-follower action, and the fixed-pattern noise component due to the variation in the offset voltages of the column buffer amplifiers 29a–29d.

In conclusion, a highly sensitive video signal with low noise (i.e., higher S/N ratio) can be obtained, as compared to the conventional photoelectric conversion apparatus (FIGS. 49 through 53).

Further, as in the previously described illustrative embodiments, because the drain interconnection 25 is eliminated from the photoelectric conversion apparatus of the seventh illustrative embodiment, short-circuit-mode defects between the drain interconnection 25 and the vertical signal line 22 can be avoided, and the production yield is increased.

Even if an open-mode defect occurs, causing a faulty connection between the reset drain 4 and the reset drain interconnection 24, the gate region of each JFET can be correctly controlled, whereby image defects consisting of blank vertical stripes in the resultant image are reduced, and the production yield is increased.

As in the fifth and sixth illustrative embodiments, each of the contact holes 30, each of the relay interconnections 23, and each of the relay connection holes 31 are shared by multiple (e.g., two to twenty) photoelectric conversion devices, which also results in increased production yield.

In the photoelectric conversion apparatus of this seventh illustrative embodiment, emitter-follower-type column buffer amplifiers as shown in FIG. 21(c), which allow high-speed operation with low power consumption and noise, are suitably used.

Furthermore, by using the bipolar transistor shown in FIGS. 22–24, the column buffer amplifier can be formed without requiring additional manufacturing steps. The bipolar transistor 50 for an output buffer amplifier can also be formed in the same manufacturing step by simply changing the two-dimensional pattern and the size of the transistor of FIGS. 22–24.

Eighth Illustrative Embodiment

Figure 26:
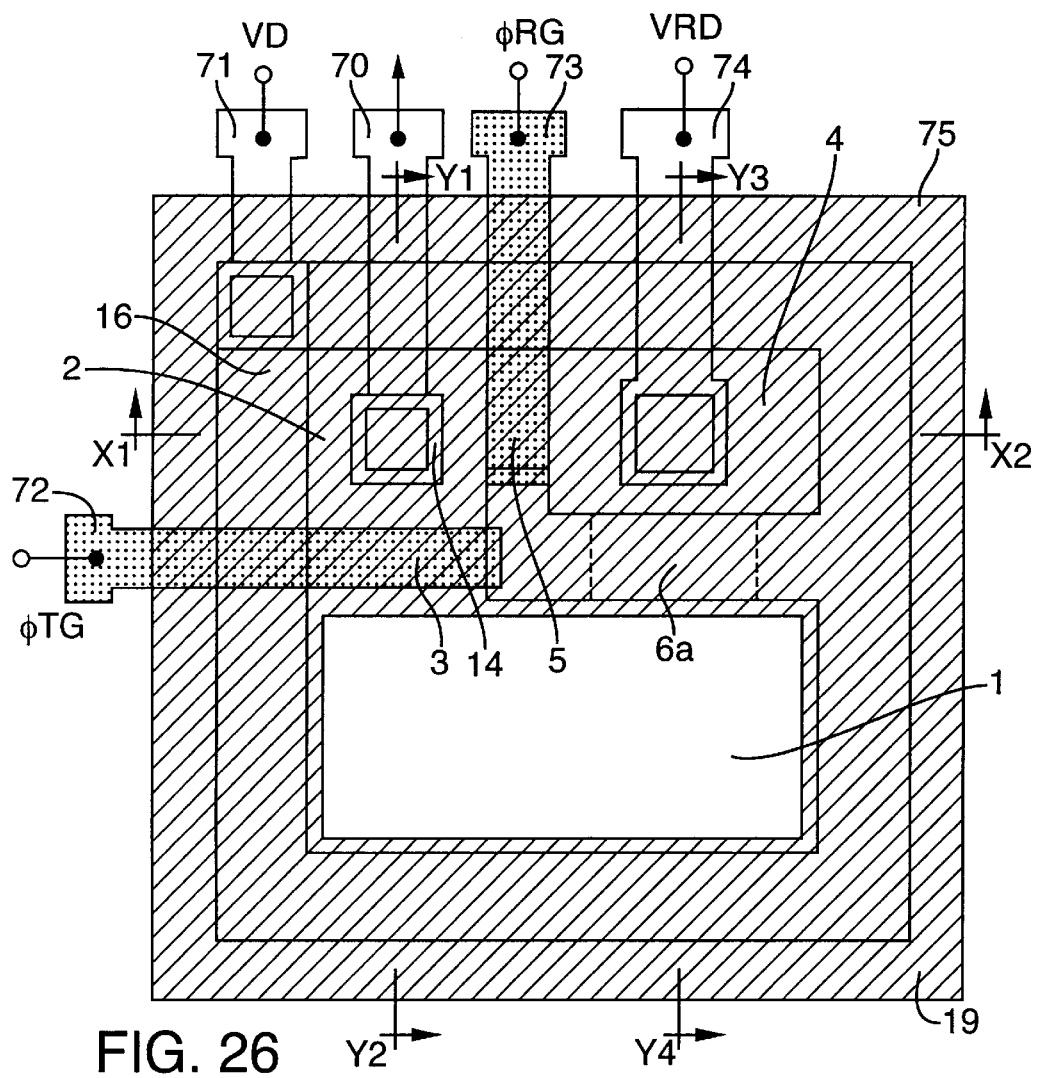
FIG. 26 is a plan view of a photoelectric conversion device of an eighth illustrative embodiment of the invention.
Figure 27:
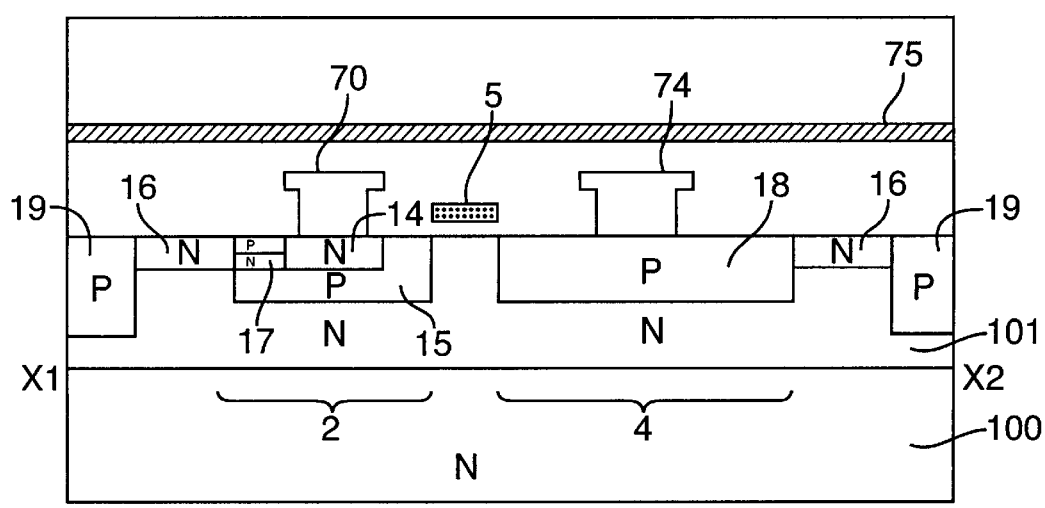
FIG. 27 is a cross-sectional view taken along the X1-X2 line shown in FIG. 26.
Figure 28:
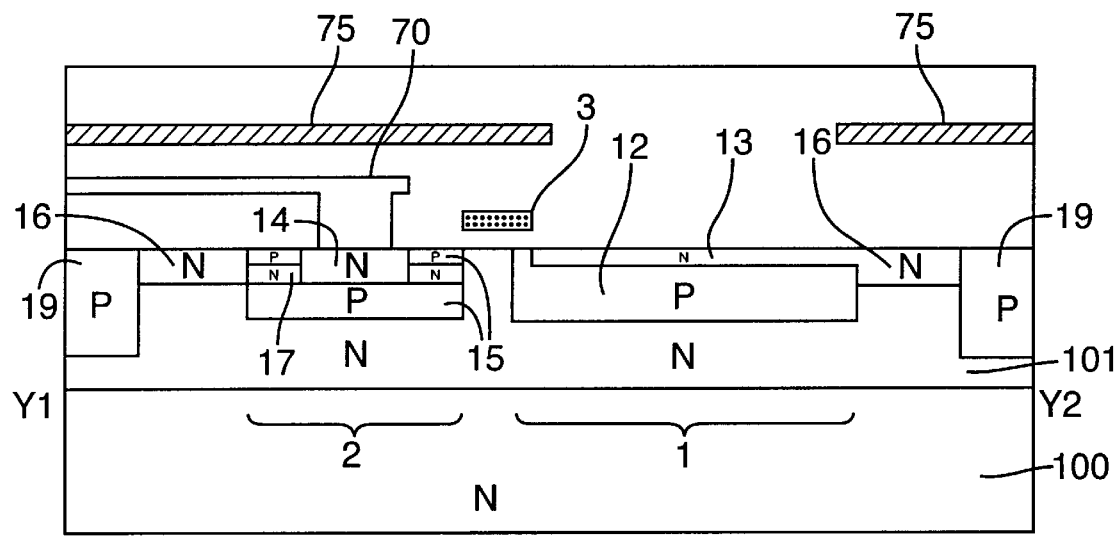
FIG. 28 is a cross-sectional view taken along the Y1-Y2 line shown in FIG. 26.
Figure 29:
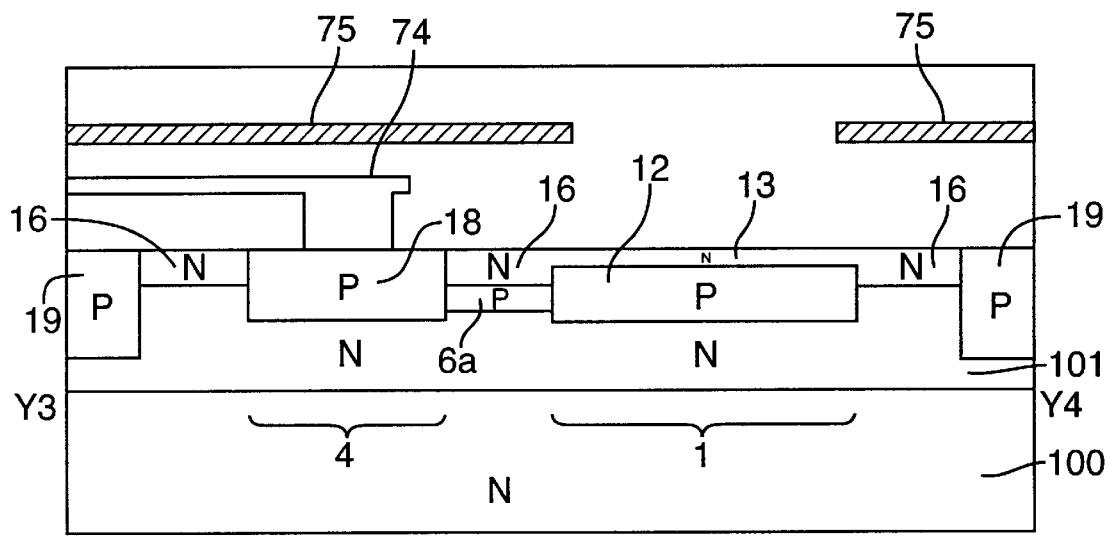
FIG. 29 is a cross-sectional view taken along the Y3-Y4 line shown in FIG. 26.
Figure 30:
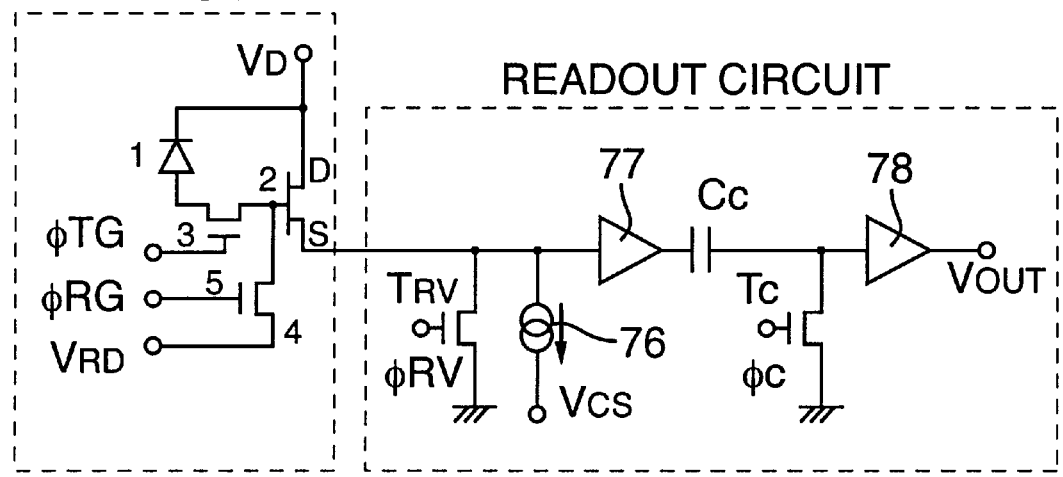
FIG. 30 is a circuit diagram showing the photoelectric conversion device shown in FIGS. 26 through 29 and a readout circuit formed in this device.
Figure 31:
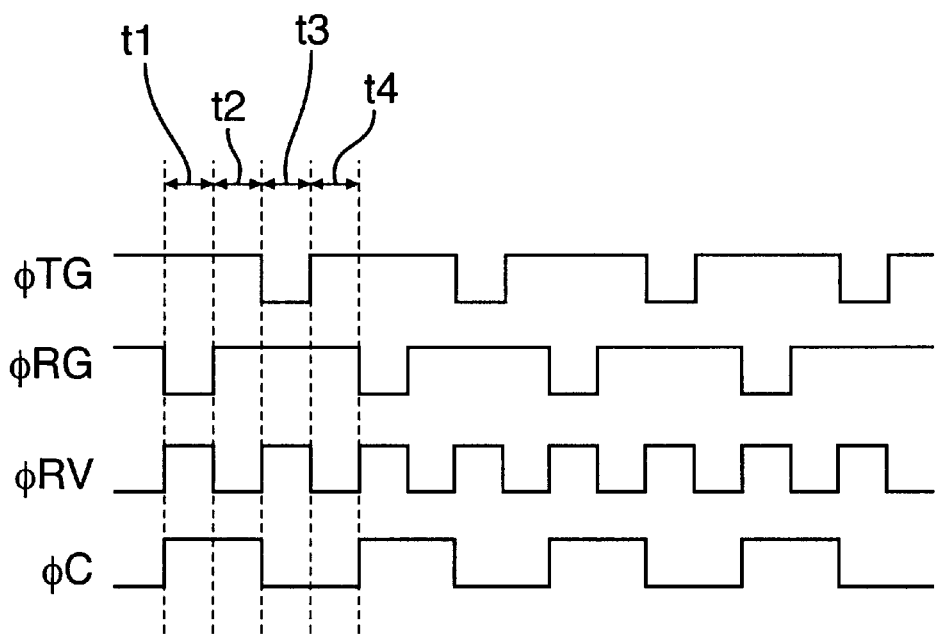
FIG. 31 is a timing chart illustrating the operation of the photoelectric conversion device shown in FIG. 26.

FIGS. 26 through 29 illustrate a photoelectric conversion device of an eighth illustrative embodiment of the invention. FIG. 26 is a plan view. FIG. 27 is a cross-sectional view taken along the X1-X2 line shown in FIG. 26. FIG. 28 is a cross-sectional view taken along the Y1-Y2 line of FIG. 26. FIG. 29 is a cross-sectional view taken along the Y3-Y4 line of FIG. 26. FIG. 30 is a circuit diagram showing the photoelectric conversion device shown in FIGS. 26–29, and an example of a readout circuit. FIG. 31 is a timing chart for the operation of the photoelectric conversion device and readout circuit shown in FIG. 30.

A single unit of this photoelectric conversion device, as shown in FIGS. 26 through 31, can be used as a photosensor.

The photoelectric conversion device of the eighth illustrative embodiment has a P-type guard-ring region 19 around the pixel, which differs from the device of the first illustrative embodiment shown in FIGS. 1–4. The method of forming the reset gate 5 and the overflow-control region 6a and the layout of the interconnections are also different from the first illustrative embodiment. The interconnections include a signal line 70, an interconnection 71 from the N-type drain region 16 to a drain voltage source, a transfer gate interconnection 72, a reset gate interconnection 73, and a reset drain interconnection 74 to a reset drain voltage VRD. A light blocking layer 75 is provided, separate from the reset drain interconnection 74. The rest of the structure is substantially the same as the photoelectric conversion device of the first illustrative embodiment.

In this eighth illustrative embodiment, the P-type guard-ring region 19 is provided in order to absorb and remove from the photodiode 1 undesirable charges generated by stray light.

As shown in FIG. 29, the overflow-control region 6a may be formed on the boundary between the photodiode 1 and the reset drain 4 in the semiconductor. As an alternative, the overflow-control region may be formed on the boundary between the photodiode 1 and the guard-ring region 19 inside the semiconductor (below the high-density N-type semiconductor region 16). In this alternative case, the excess charge is guided to the guard-ring region 19 by applying an appropriate voltage to the guard-ring region 19.

The readout circuit of this embodiment (FIG. 30) comprises a reset transistor TRV, a current source 76, a clamp capacitor Cc, a clamp transistor Tc, a buffer amplifier 77, and an output amplifier 78, as shown in FIG. 30.

If the required speed of operation is not particularly high, the buffer amplifier 77 may be omitted from the readout circuit of FIG. 30. By forming the readout circuit on the same semiconductor chip as the photoelectric conversion device, the S/N ratio of the output signal can be increased. Alternatively, the readout circuit may be formed separately from the photoelectric conversion device.

Because the transfer gate 3 and the reset gate 5 shown in FIGS. 30 and 31 are of the P-channel type, as in FIGS. 27 and 28, the driving pulses φTG and φRG are opposite to the rest of the pulses in polarity. When these pulses are at the low level, the transfer gate 3 and the reset gate 5 are in the ON state; when these pulses are at the high level, the transfer gate 3 and the reset gate 5 are in the OFF state.

In the timing chart shown in FIG. 31, interval t1 corresponds to the initialization of the gate region of the JFET 2; t2 corresponds to the source-follower action of the JFET 2 after the initialization and the clamping of the output by the clamp capacitor Cc and the clamp transistor Tc; t3 corresponds to transfer of the signal charges from the photodiode 1 to the JFET 2; and t4 corresponds to the source-follower action of the JFET 2 after the signal-charge transfer. In interval t4, the photosignal appearing at the output end (i.e., the right end of Cc shown in FIG. 30) of the clamp capacitor Cc is output from the output terminal Vout via the output buffer amplifier 78.

As in the previous illustrative embodiments, the photoelectric conversion device of the eighth illustrative embodiment employs a buried photodiode having a lateral overflow drain structure, whereby the dark current, after-image, and reset noise can be reduced. Furthermore, by taking the difference, via the clamp capacitor Cc, between the output voltages of the source-follower action before and after the signal-charge transfer, various noise components, including the reset noise component generated during the initialization of the gate region of the JFET 2, and the 1/f noise component generated during the source-follower action, can be reduced. A highly sensitive photosignal with low noise (i.e., higher S/N ratio) can thus be achieved.

The emitter-follower-type buffer amplifier shown in FIGS. 13 and 21(c), which is superior in speed of operation, power consumption, and noise reduction, is suitably used as the buffer amplifier 77 and the output buffer amplifier 78 shown in FIG. 30. Furthermore, by using the bipolar transistor shown in FIGS. 22 through 24, which can be formed in the same manufacturing step as the JFET 2 of the pixel, the emitter-follower-type buffer amplifier can be formed without requiring additional manufacturing steps.

Ninth Illustrative Embodiment

FIGS. 32 through 37 show a photoelectric conversion apparatus (solid-state image sensor) according to a ninth illustrative embodiment.

Figure 32:
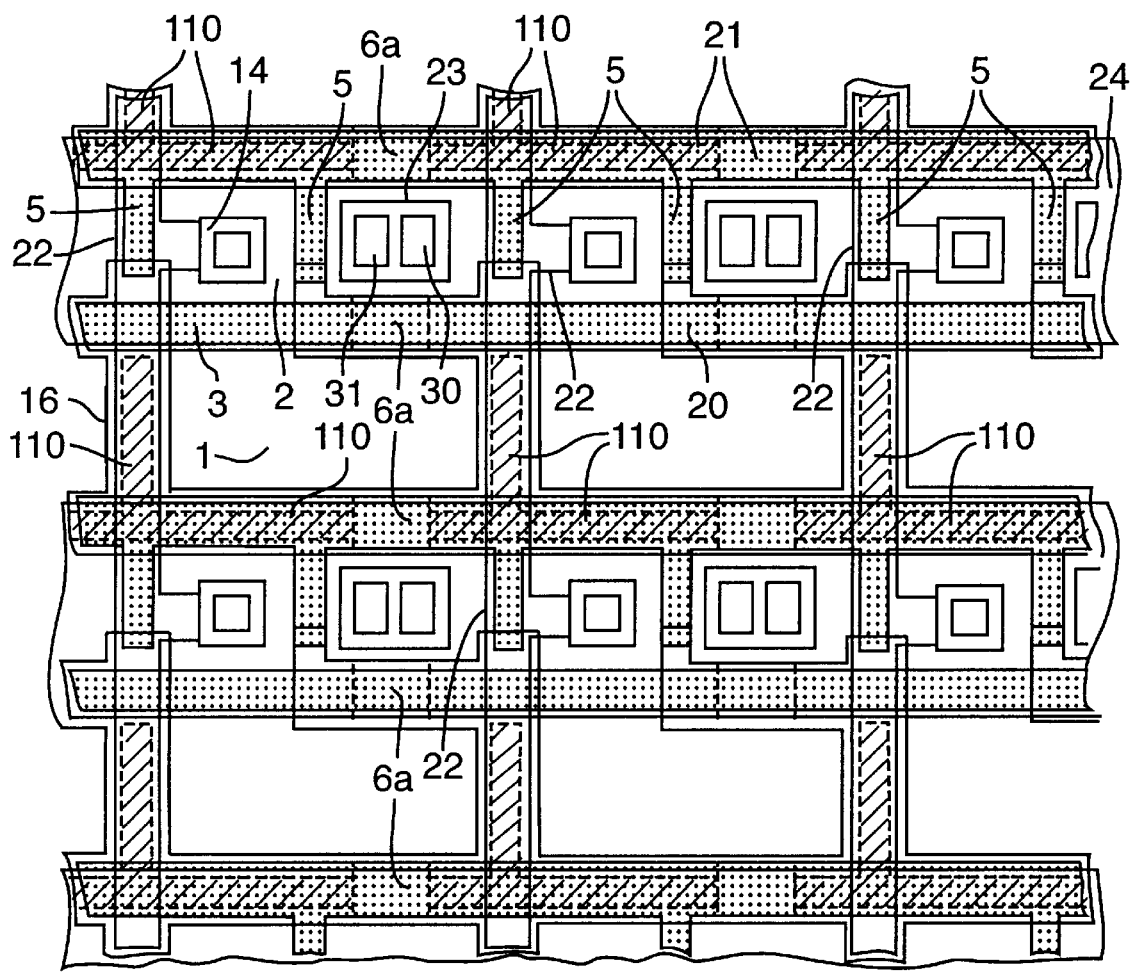
FIG. 32 is a plan view of a photoelectric conversion apparatus of a ninth illustrative embodiment of the invention.
Figure 33:
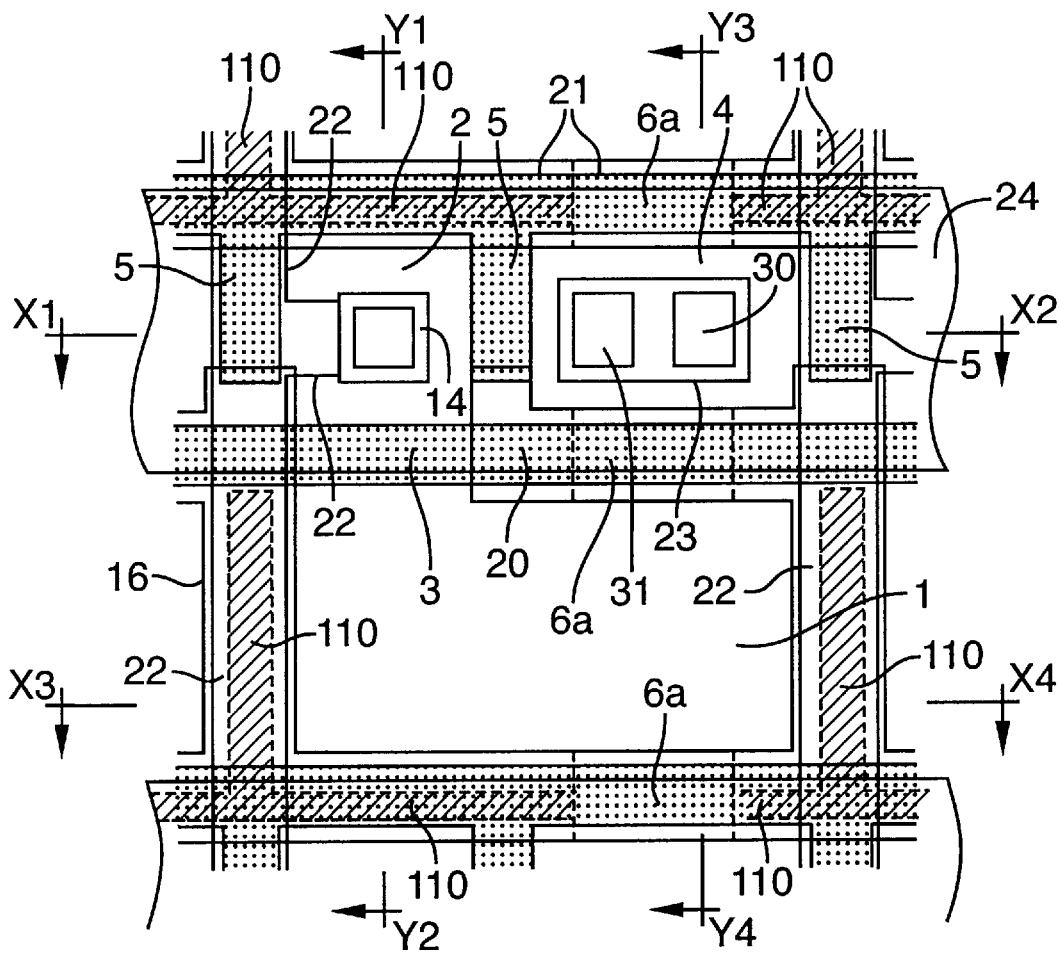
FIG. 33 is a plan view of a unit pixel and the pixel-separating region around the pixel of the apparatus of FIG. 32.
Figure 34:
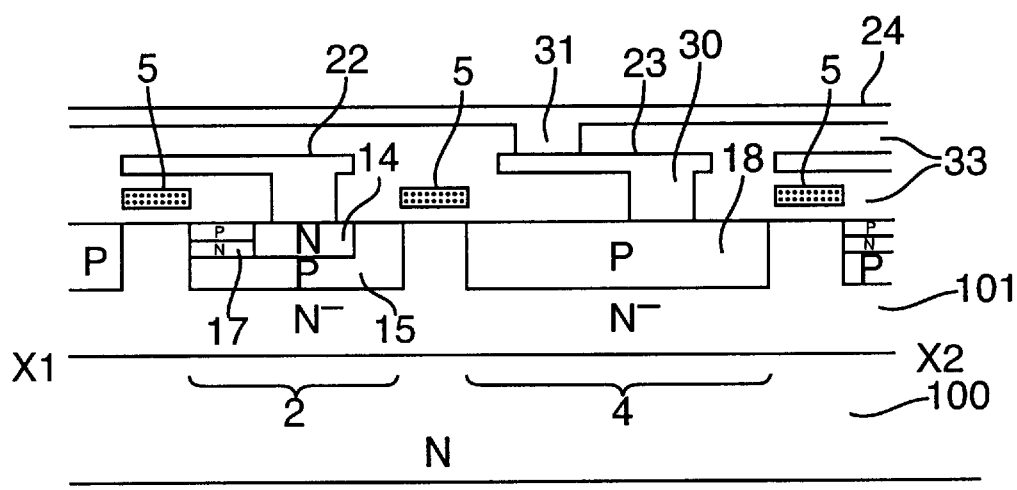
FIG. 34 is a cross-sectional view taken along the X1-X2 line shown in FIG. 33.
Figure 35:
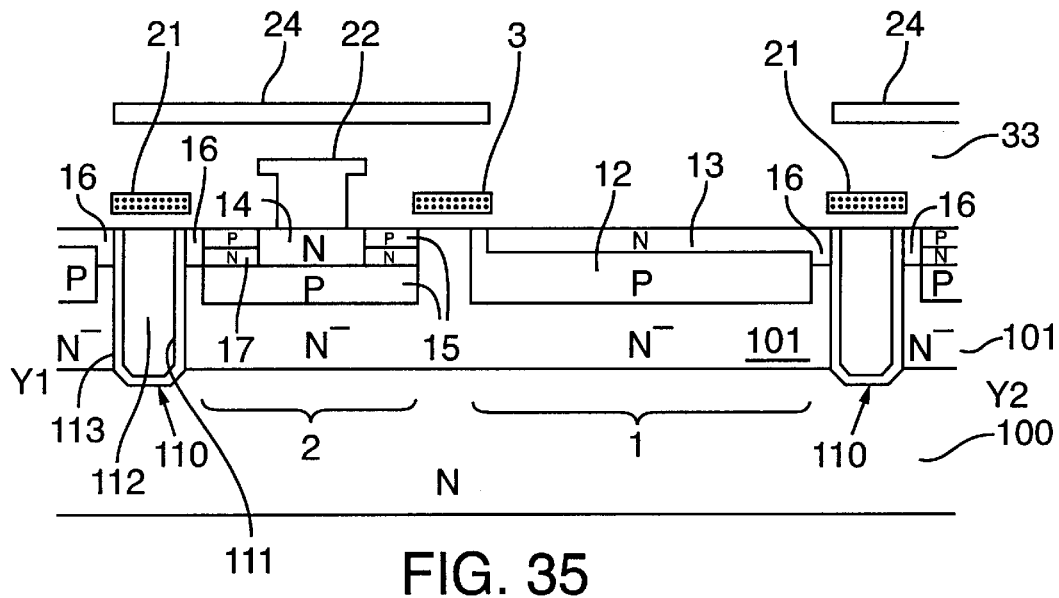
FIG. 35 is a cross-sectional view taken along the Y1-Y2 line shown in FIG. 33.
Figure 36:
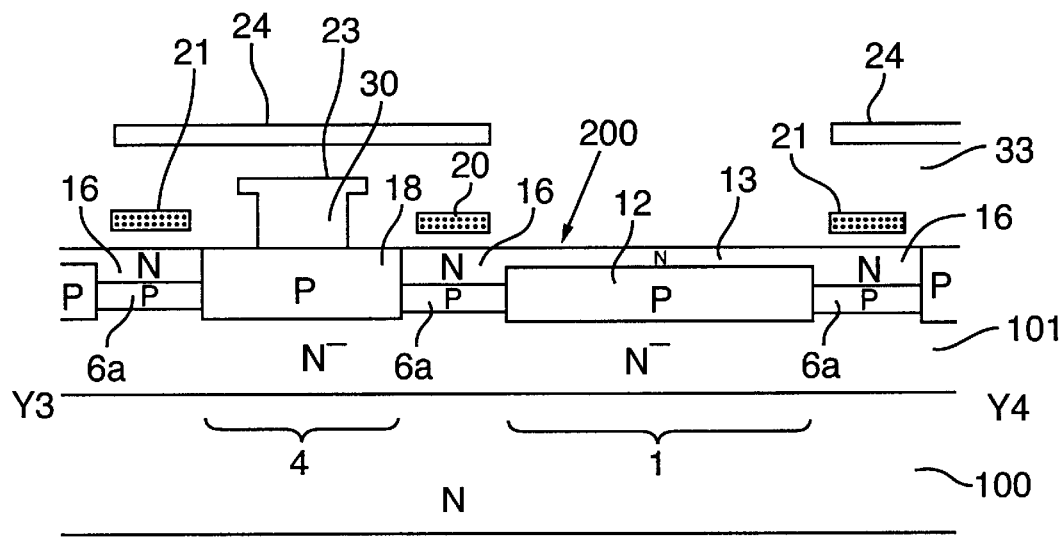
FIG. 36 is a cross-sectional view taken along the Y3-Y4 line shown in FIG. 33.

FIG. 32 is a plan view of the apparatus, in which a plurality of photoelectric conversion devices (pixels) are arranged in a two-dimensional matrix. FIG. 33 is a plan view of a unit pixel used in the solid-state image sensor, which is a partially enlarged view of FIG. 32. FIGS. 34, 35, 36, and 37 are cross-sectional views taken along the X1-X2 line, the Y1-Y2 line, the Y3-Y4 line, and the X3-X4 line, respectively, shown in FIG. 33. (For ease of illustration, the scale of FIG. 37 differs from that of FIGS. 34–36.)

As shown in FIGS. 32 through 37, the solid-state image sensor according to the ninth illustrative embodiment has a base consisting of a higher-density N-type semiconductor substrate 100, and a lower-density N-type semiconductor layer (N-type epitaxial layer in this case) 101 formed on the substrate 100. A plurality of pixels arranged in a two-dimensional matrix, and the associated readout circuits, are formed in and on the base. The plurality of pixels may also be arranged in a one-dimensional matrix (a line).

The structure of each pixel is shown in FIGS. 32–37. With the exception of pixel-separating regions 110 and associated structure and the lower relative impurity density in N-type semiconductor layer 101, each pixel of this ninth illustrative embodiment is substantially the same as that of the first and fourth illustrative embodiments, described above. FIG. 32 thus corresponds to FIG. 7, and FIGS. 33–36 correspond to FIGS. 1–4, as described above with respect to the first and fourth illustrative embodiments. Accordingly, only those aspects that are particularly relevant to an understanding of this ninth illustrative embodiment, or that differ from the first and fourth illustrative embodiments, will be described here.

In this ninth illustrative embodiment, the JFET 2 is a device that is activated by a voltage applied (to the drain of the JFET) via the N-type semiconductor substrate 100 and the N-type semiconductor layer 101, in this order. The impurity concentration of the N-type semiconductor layer 101 is set lower than that of the substrate 100 for the purpose of increasing the thickness of the depletion layer to improve the detection sensitivity to long wavelengths. This improves the sensitivity of the photodiode 1.

Trenches 111 are formed in the N-type drain/boundary regions 16, except for an area near the overflow-control region 6a. A portion of each N-type drain region 16 is removed in order to form a trench, while leaving both sides of the N-type drain region 16 intact along the edges of the pixels.

The trench 111 constitutes a pixel-separating region 110. The pixel-separating region 110 can reduce both the crosstalk between pixels and the resistance between the N-type semiconductor substrate 100 and the surface region (i.e., the drain region 16 of the JFET 2) of the N-type semiconductor layer 101.

The portion of material which is removed to form the trench 111 need not necessarily be a portion of drain region 16, so long as both sides of the boundary between pixels still include drain regions 16.

Although not shown in drawings, a drain voltage is supplied to the drain region 16 of the JFET 2 of each pixel from a drain electrode (not shown) formed on the top surface of the N-type semiconductor layer 101 around the pixel array. The voltage is transmitted via the higher-density N-type semiconductor substrate 100 and the N-type semiconductor layer 101, and via the pixel-separating region 110. The drain electrode may alternatively be formed on the rear face of the substrate 100, in order to supply a drain voltage to the JFET 2 of each pixel.

As in the first illustrative embodiment, the photodiode 1 is of a buried-type and has a JFET-type lateral overflow drain structure, with all of the attendant advantages mentioned above.

The transfer gate interconnection 20 and the reset gate interconnection 21 are preferably formed of polysilicon film. The relay interconnection 23, the reset drain interconnection 24, and the vertical signal line 22 are preferably formed of aluminum film. (Such composition is generally also preferred for the corresponding structures in the other illustrative embodiments above.)

The schematic structure of the circuitry of the solid-state image sensor of FIG. 32 is the same as that shown in FIG. 11 and described with respect to the fourth illustrative embodiment above, with the attendant advantages as described. Similarly, the operation of the solid-state image sensor of FIG. 32 proceeds in the same fashion as shown above in the timing chart of FIG. 14 and as described with respect to the fourth illustrative embodiment, with the attendant advantages. Further description is accordingly omitted here.

The trench 111 forming the pixel-separating region 110, and associated structures, will be described below with reference to FIGS. 32, 33, 35 and 37.

The pixel-separating region 110 extends along the N-type drain regions 16 surrounding the pixels, other than the areas near the overflow-control regions 6a, as shown in FIGS. 32 and 33. A portion of each of the N-type drain regions 16 is removed to form a trench 111, while leaving both sides of the drain region 16 along the edges of the pixels. The width of the trench 111 is thus less than that of the N-type drain region 16 between the pixels. It is not necessarily required to form the N-type drain region 16 in those areas that are to be removed to form the trench 111. That is, the pixel-separating region 110 may have no N-type drain region between it and the associated pixels. In this case, the area of the photodiode 1 can be expanded.

In this ninth illustrative embodiment, the pixel-separating region 110 comprises polysilicon 112 containing an N-type impurity, which is filled into the trench 111, and an N-type diffusion layer 113 surrounding the trench 111 inside the base.

The trench 111 is formed downward from the top surface of the N-type semiconductor layer 101, and it reaches the top surface of the N-type semiconductor substrate 100. The depth of the trench 111 may alternatively be increased so that the bottom of the trench 111 reaches inside the N-type semiconductor substrate 100.

In this particular embodiment of the pixel-separating region 110, the trench 111 is filled only with polysilicon 112 that contains an N-type impurity. The N-type diffusion layer 113 is formed by the N-type impurity originally contained in the polysilicon 112, and it is formed so as to surround the trench 111 inside the N-type semiconductor layer 101 and along the inner wall of the trench 111 filled with the polysilicon 112.

By forming the pixel-separating regions 110, the crosstalk between pixels can be reduced (that is, the pixels can be better separated from each other) and, at the same time, the resistance between the N-type semiconductor substrate 100 and the surface region (i.e., the drain region 16 of the JFET 2 in this embodiment), the resistance due to the N-type semiconductor layer 101, can also be reduced.

Because the carrier diffusion length is relatively short in the polysilicon 112, the photogenerated charge (that is, the carrier) generated in one pixel is prevented from migrating into the adjacent pixels, whereby crosstalk between pixels is greatly reduced. This is a significant advantage over the conventional pixel-separation technique, in which the N-type semiconductor layer 101 itself is used as the pixel-separating region.

In addition, the polysilicon 112 containing the N-type impurity functions as a channel for electrically connecting the higher-density N-type semiconductor substrate 100 with the N-type drain region 16 of the JFET 2. The resistance between them can thus be greatly reduced.

Accordingly, in this ninth illustrative embodiment, when a drain voltage is supplied to the drain region 16 from the N-type semiconductor substrate 100, the potential drop between the substrate 100 and the drain region 16 is reduced. Although the impurity concentration of the N-type semiconductor layer 101 is set relatively low in order to increase the thickness of the depletion layer to improve the sensitivity of the photodiode 1 (particularly to longer wavelengths), the electrical properties of the JFET remain stable.

The impurity concentration of the polysilicon 112 is preferably high. As an alternative, trench 111 may be filled with another conductive material having a conductivity with respect to the N-type semiconductor layer 101, such as a metal, instead of polysilicon 112.

Figure 37:
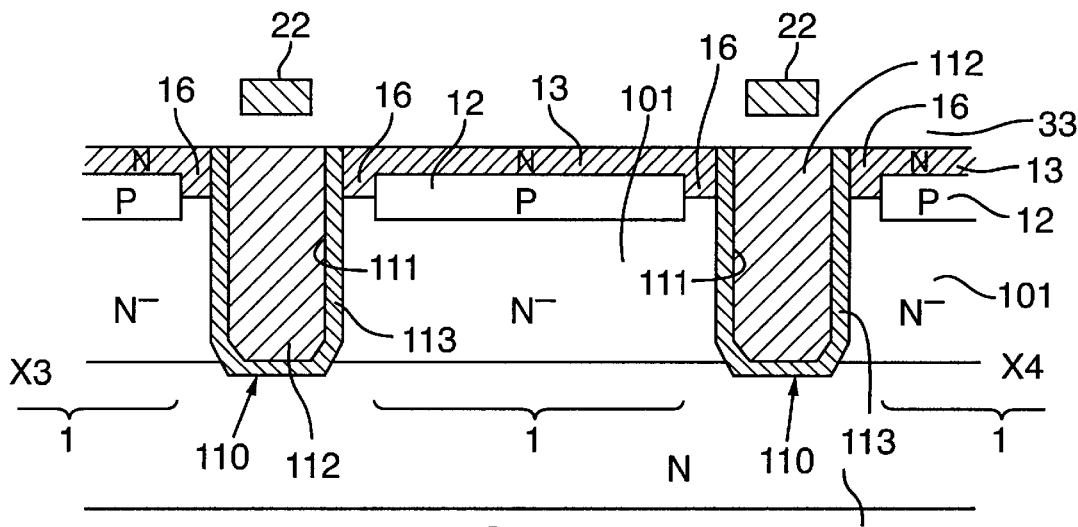
FIG. 37 is a cross-sectional view taken along the X3-X4 line shown in FIG. 33.
Figure 38:
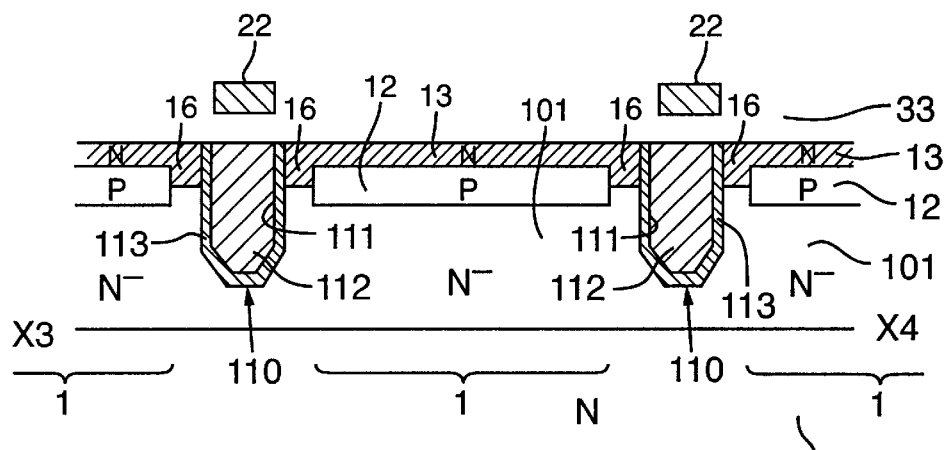
FIG. 38 is a cross-sectional view corresponding to that of FIG. 37, showing an alternative embodiment of the pixel-separating region.
Figure 39:
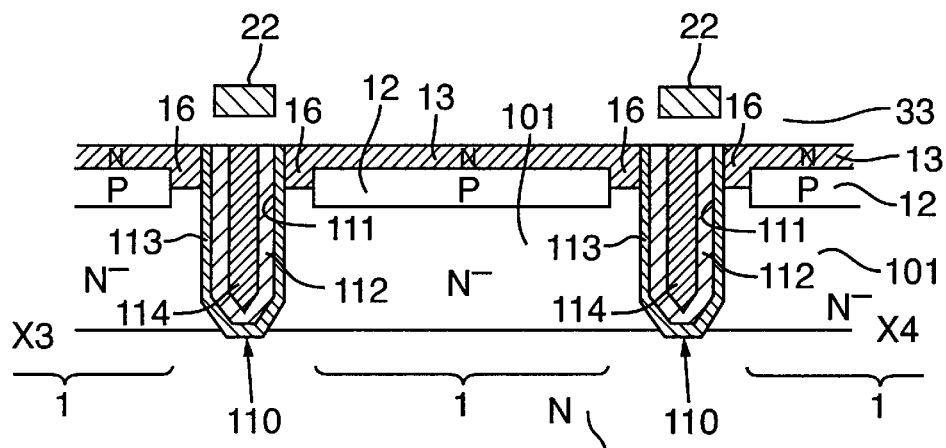
FIG. 39 is another cross-sectional view corresponding to that of FIG. 37, showing another alternative embodiment of the pixel-separating region.
Figure 40:
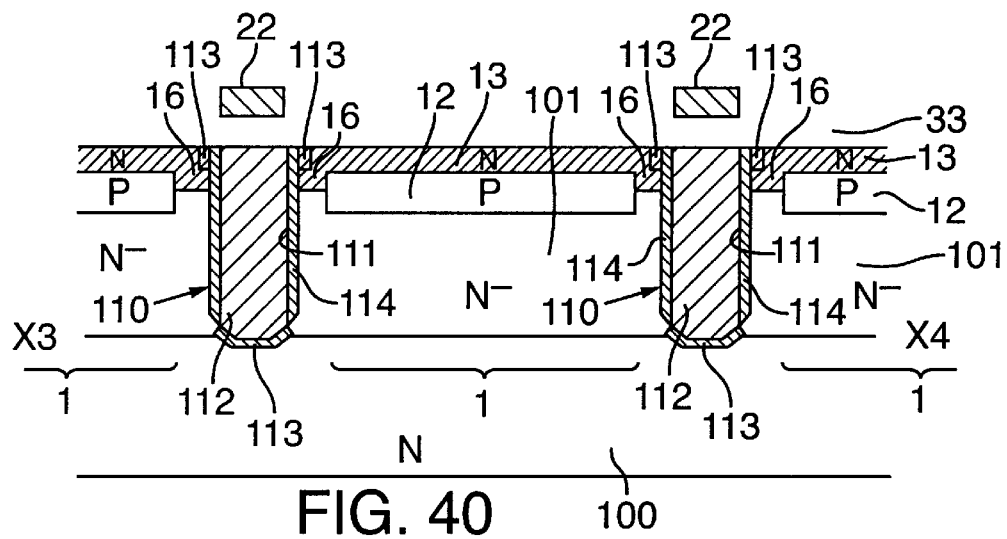
FIG. 40 is yet another cross-sectional view corresponding to that of FIG. 37, showing yet another alternative embodiment of the pixel-separating region.

The configuration of the pixel-separating region 110 may be modified as shown in FIGS. 38 through 40. The modifications are shown in cross-sectional views, as in FIG. 37. The same elements are denoted by the same reference characters. Description of these repeated elements is thus omitted.

In the modification shown in FIG. 38, the bottom of the trench 111 formed in the N-type semiconductor layer 101 does not reach the top surface of the N-type semiconductor substrate 100. This shallower trench can be formed more easily than the trench shown in FIG. 37, and the width of the trench can be readily decreased, while the crosstalk-reduction effect and the resistance-reduction effect can still be achieved, in degrees varying with the depth of the trench 111. With a shallower trench, fabrication difficulties are lessened and production yield is increased.

In another modification, shown in FIG. 39, polysilicon layer 112 is installed in the trench 111 along the inner wall of the trench 111, and the rest of the space in the trench is filled with an insulator 114, such as an oxide film or a nitride film. In this case, polysilicon 112 contributes to the reduction of the resistance, while the insulator 114 contributes to the reduction of crosstalk. A carrier generated in the depths of the higher-density N-type semiconductor substrate 100 is naturally absorbed into this substrate 100, and it does not function as a signal charge. A carrier generated at the relatively shallow level in the N-type semiconductor layer 101 is completely separated, from the carriers generated in adjacent pixels, by the insulator 114, and the carrier is efficiently prevented from migrating into adjacent pixels.

In still another modification, shown in FIG. 40, an insulating film 114 is formed in the trench 111 along the inner wall of the trench 111, except for the bottom and the area near the opening of the trench 111, and the rest of the space in the trench 111 is filled with polysilicon 112. The N-type impurity originally contained in the polysilicon 112 forms the N-type diffusion layer 113 along the inner wall of the trench 111, but only at those areas not shielded by the insulating film 114.

This pixel-separating region 110 achieves the same effect as that shown in FIG. 39, that is, the resistance is reduced by the polysilicon 112, and the crosstalk is reduced significantly by the insulator 114.

A method for manufacturing the solid-state image sensor of the ninth illustrative embodiment will be described below, mainly focusing on the formation of the pixel-separating region 110, with reference to FIGS. 41 and 42. This method will be explained using the example shown in FIG. 39, in which the bottom of the trench 111 reaches the top surface of the N-type semiconductor substrate 100, and the trench 111 is filled with polysilicon and an insulator.

First, a lower-density epitaxial layer is grown on the higher-density N-type semiconductor substrate 100. This epitaxial layer becomes the N-type semiconductor layer 101. Trenches 111 are formed in the epitaxial layer 101 by dry etching using an oxide film mask 201 as a trench-pattern mask. (FIG. 41(a))

Figure 41A:
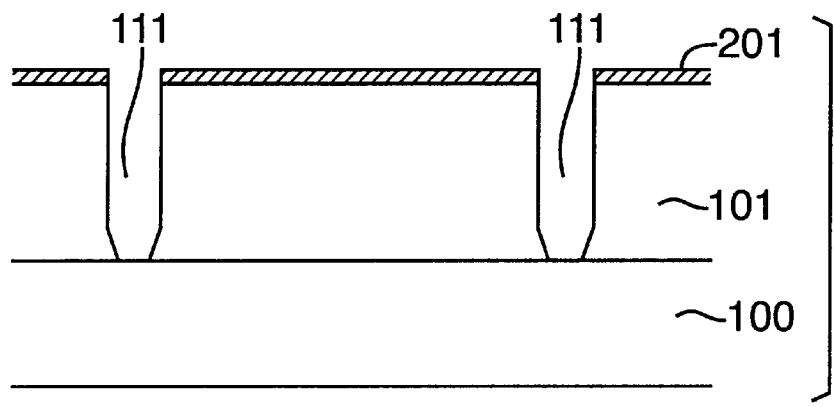
FIG. 41 comprises cross-sectional views similar to that of FIG. 37, illustrating certain steps of a manufacturing process for making the apparatus of FIG. 32.
Figure 41B:
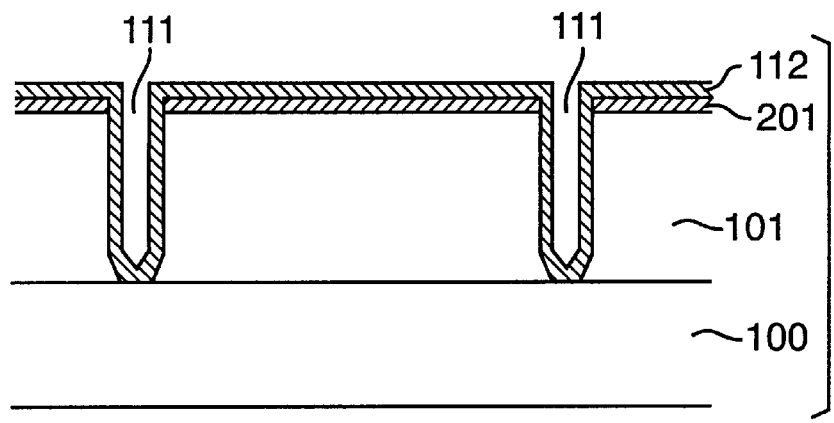
Figure 41C:
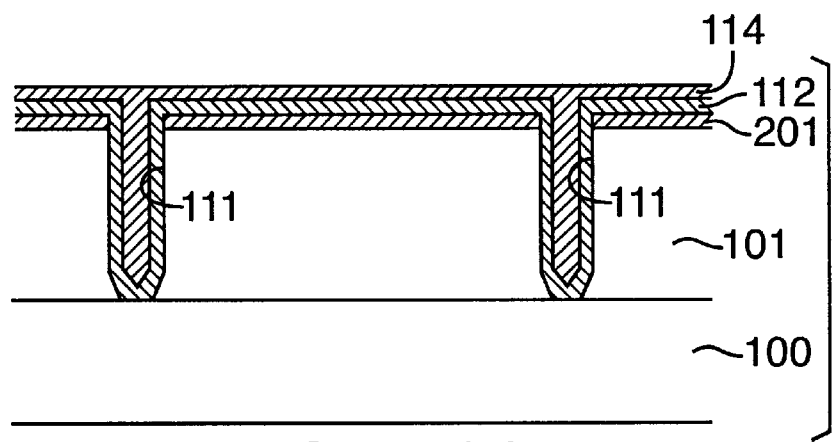

A polysilicon film 112 is then deposited by CVD, so as to cover the entire surface of the base shown in FIG. 41(a). The inner wall of each trench 111 is also covered with the polysilicon film 112, as shown in FIG. 41(b). At this stage, the trench 111 is not yet completely filled. An N-type impurity may be doped into the polysilicon film 112 during the deposition of the polysilicon film 111, or alternatively, it may be doped after the deposition through diffusion using a liquid source. (If the trench 111 is to be completely filled with the polysilicon film 112, as shown in the example in FIG. 37, it is preferable to dope the N-type impurity into the polysilicon film 112 during the deposition of the film.)

An oxide film 114 is then formed on the polysilicon film 112 so as to completely fill the trenches 111 with the oxide film 114. (FIG. 41(c)) The oxide film 114 can be formed either by direct deposition of the oxide film, using VD, or by dry oxidation of the polysilicon film 112. However, lengthy dry oxidation is undesirable because several defects may be generated.

Figure 42A:
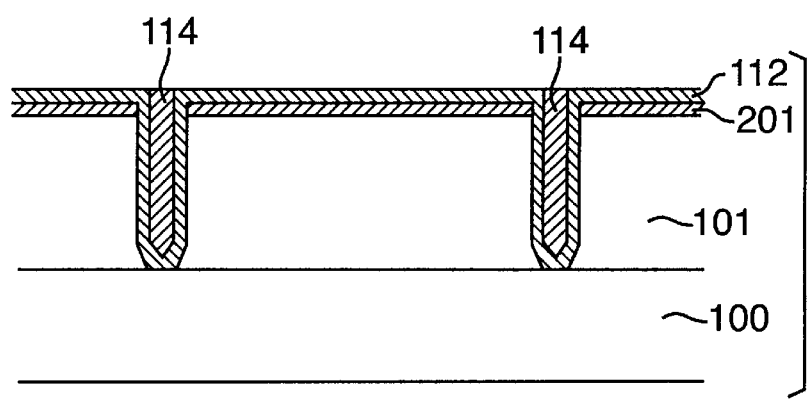
FIG. 42 comprises cross-sectional views illustrating steps subsequent to the steps illustrated in FIG. 41.
Figure 42B:
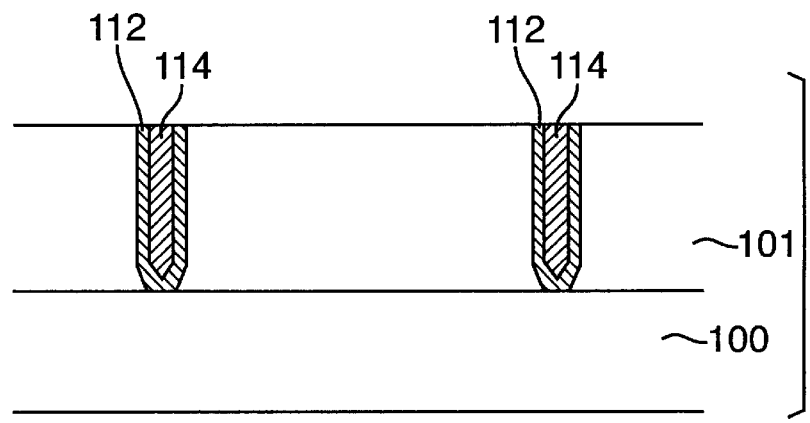

The oxide film 114 is then removed by CMP (FIG. 42(a)). Then the polysilicon film 112 and the oxide film 201 extending above the trenches 111 are simultaneously removed, also by CMP. (FIG. 42(b)) The CMP steps may consist of one CMP step with abrasion, under the same conditions, of all three of the layers to be removed. However, at least in the latter CMP step (or in the latter stages of a single CMP step), the abrasion rate for the oxide film 201 should be equal to or smaller than that for the polysilicon film 112.

The P-type charge-accumulation region 12 of the photodiode 1 described earlier (but not shown in FIG. 41) is formed by an ordinary process comprising photolithography, injection, rinsing, and annealing. During the annealing, the N-type impurity diffuses out of the polysilicon film 112 into the epitaxial layer 101 surrounding the trench 111. The N-type diffusion layer 113 shown in FIG. 39 is formed, by this out-diffusion, so as to surround the trench 111.

The remaining elements of the solid-state image sensor are then formed by ordinary semiconductor manufacturing processes, whereby the solid-state image sensor is completed. Some of the elements of the solid-state image sensor may be formed before or during the formation of the trench 111 and the pixel-separating region 110. For example, the P-type charge-accumulation region 12 and the N-type drain region 16 may be formed before the trench 111 is formed.

By using a CMP method for removing the polysilicon film 112 and the oxide films 114 and 201, these films extending above the trench 111 can be removed in the same step of the manufacturing process, without overetching the polysilicon film 112 and the oxide film 114 filled inside the trench 111. CMP makes the top surface of the pixel-separating region 110 flat and even, so that the (aluminum) interconnection 22 can be reliably formed in a later step. Production yield is thus increased.

The pixel-separating regions 110 shown in FIGS. 37, 38, and 40 can also be formed by this manufacturing method. For example, in forming the pixel-separating region 110 shown in FIG. 40, the oxide film 114 is formed along the inner wall of the trench 111. Then a portion of the oxide film 114 is removed, from the bottom of the trench 111 and from the area near the opening of the trench 111, by an anisotropic dry etch. Then a polysilicon film 112 is deposited by CVD so as to completely fill the trench 111.

Tenth Illustrative Embodiment

The tenth illustrative embodiment of the invention will be described below with reference to FIGS. 43 and 44.

Figure 43:
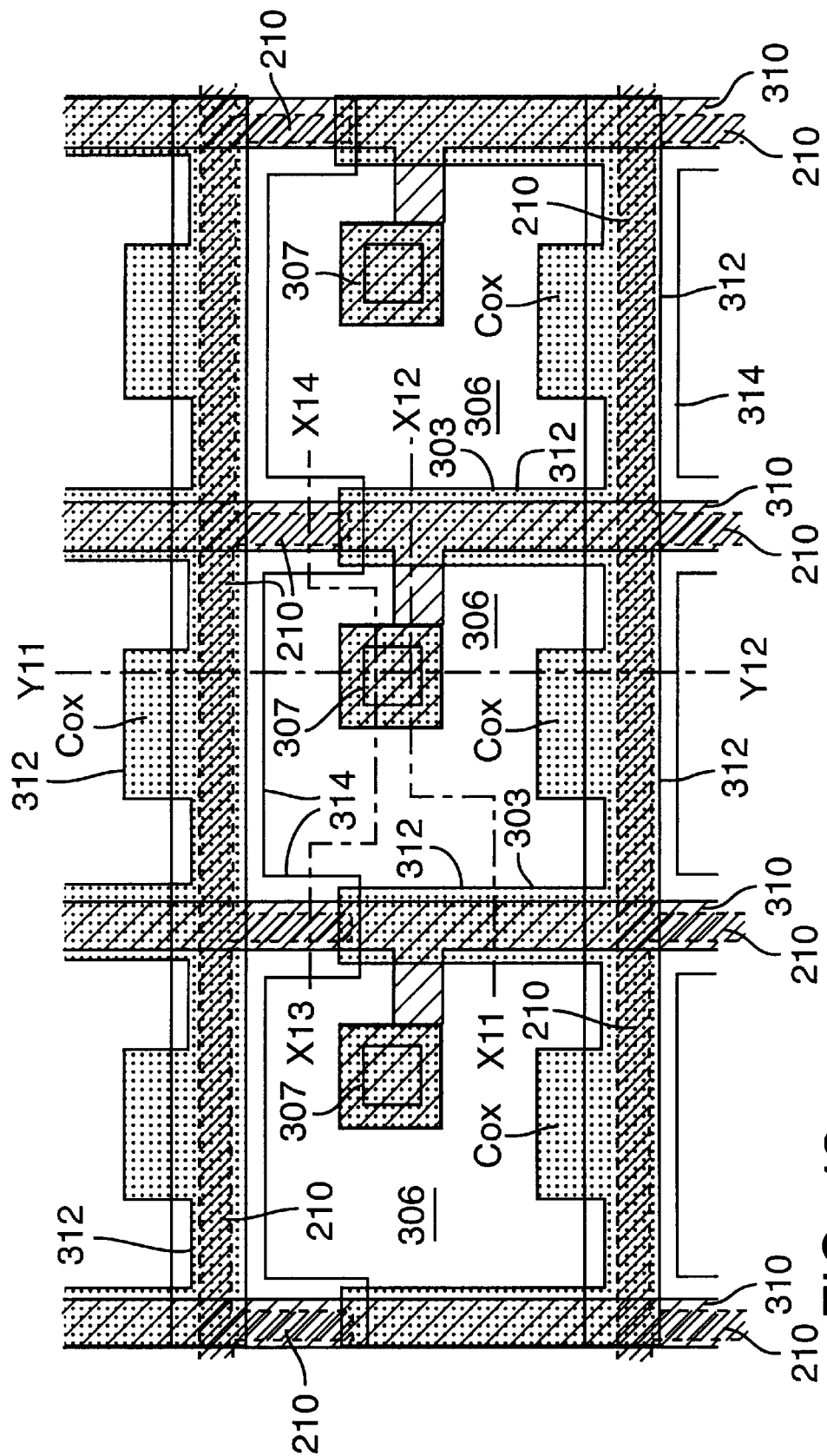
FIG. 43 is a plan view of a photoelectric conversion apparatus of a tenth illustrative embodiment of the invention.
Figure 44:
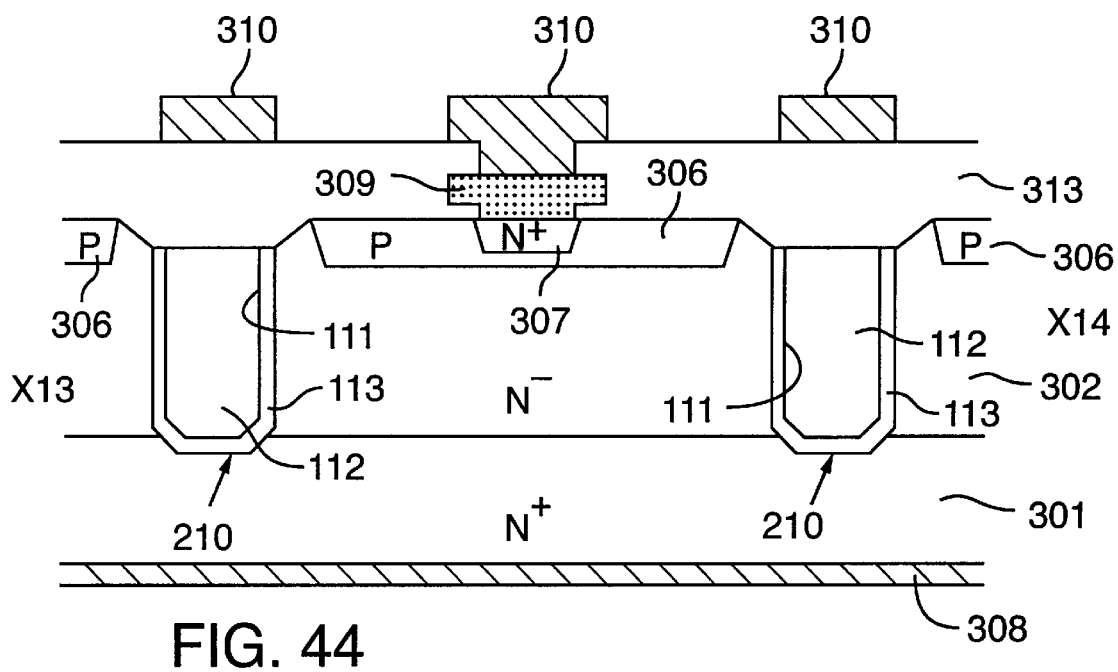
FIG. 44 is a cross-sectional view taken along the X13-X14 line shown in FIG. 43.
Figure 45:
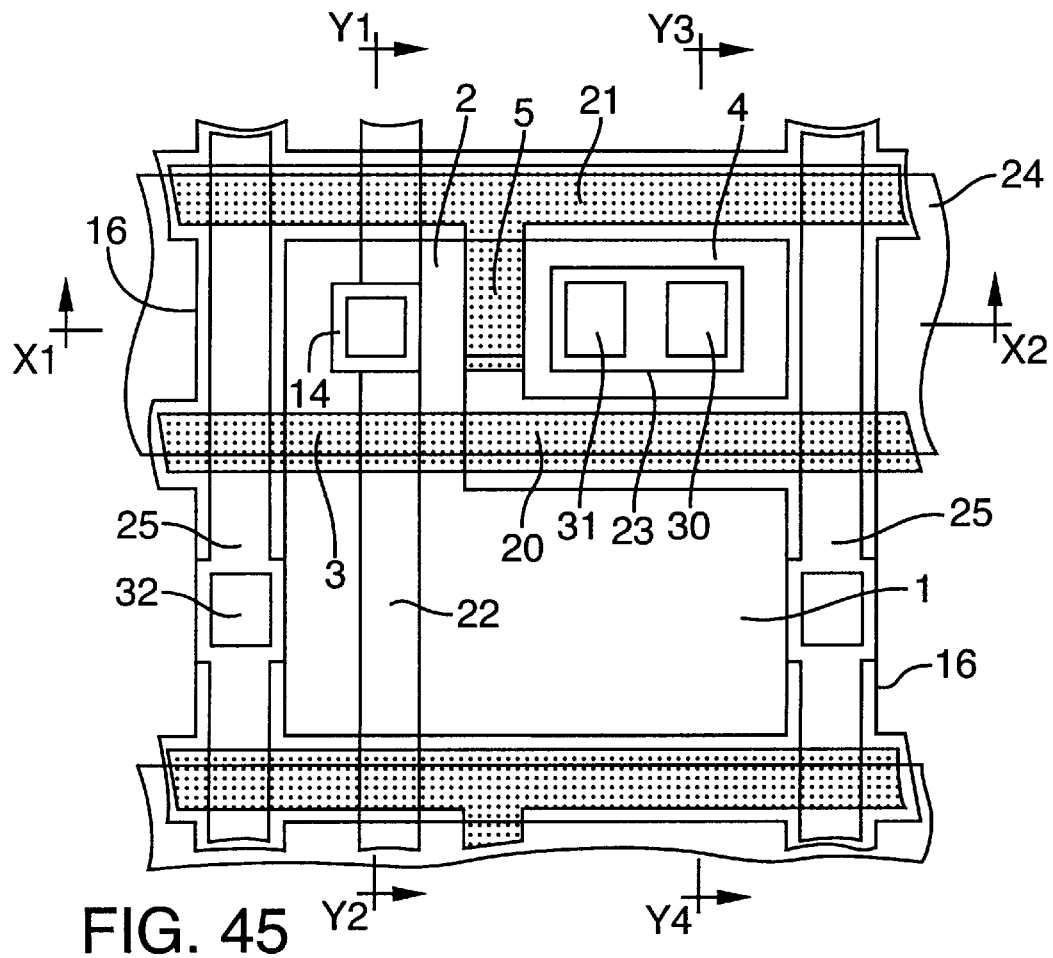
FIG. 45 (prior art) is a plan view of a conventional photoelectric conversion device.
Figure 46:
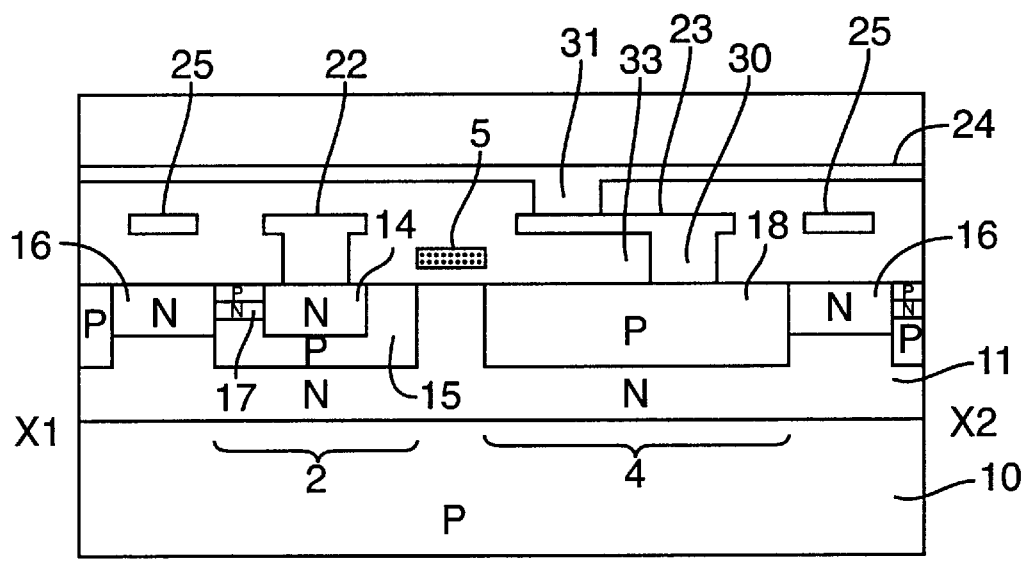
FIG. 46 (prior art) is a cross-sectional view taken along the X1-X2 line shown in FIG. 45.
Figure 47:
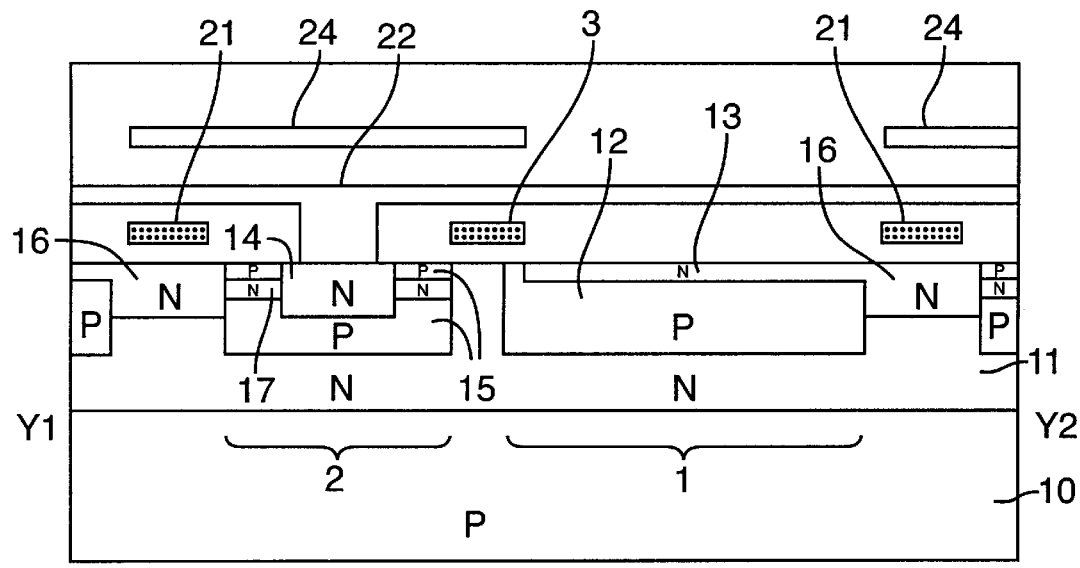
FIG. 47 (prior art) is a cross-sectional view taken along the Y1-Y2 line shown in FIG. 45.
Figure 48:
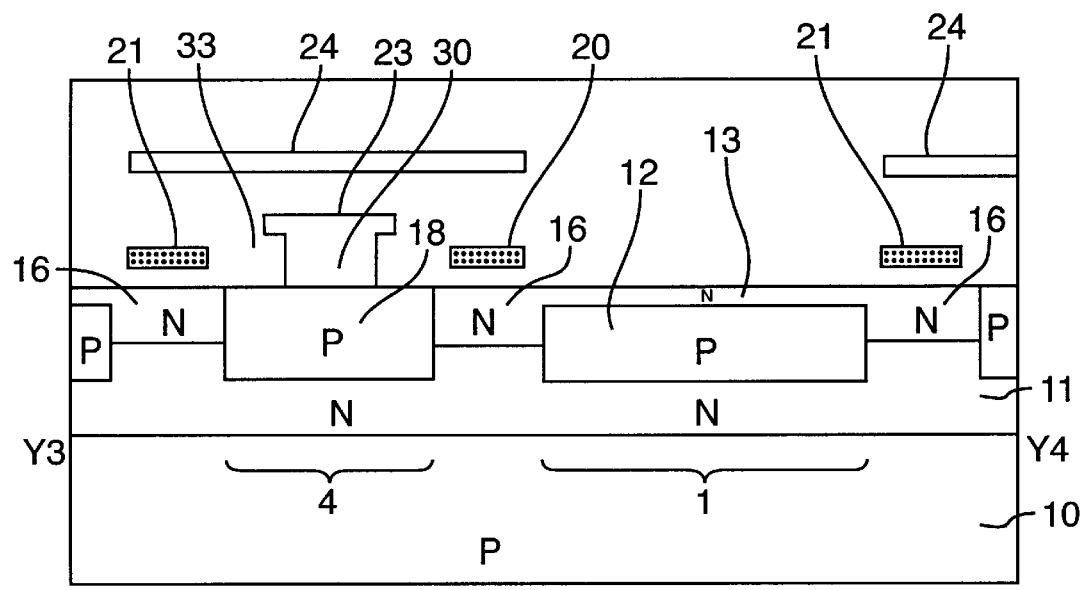
FIG. 48 (prior art) is a cross-sectional view taken along the Y3-Y4 line shown in FIG. 45.
Figure 49:
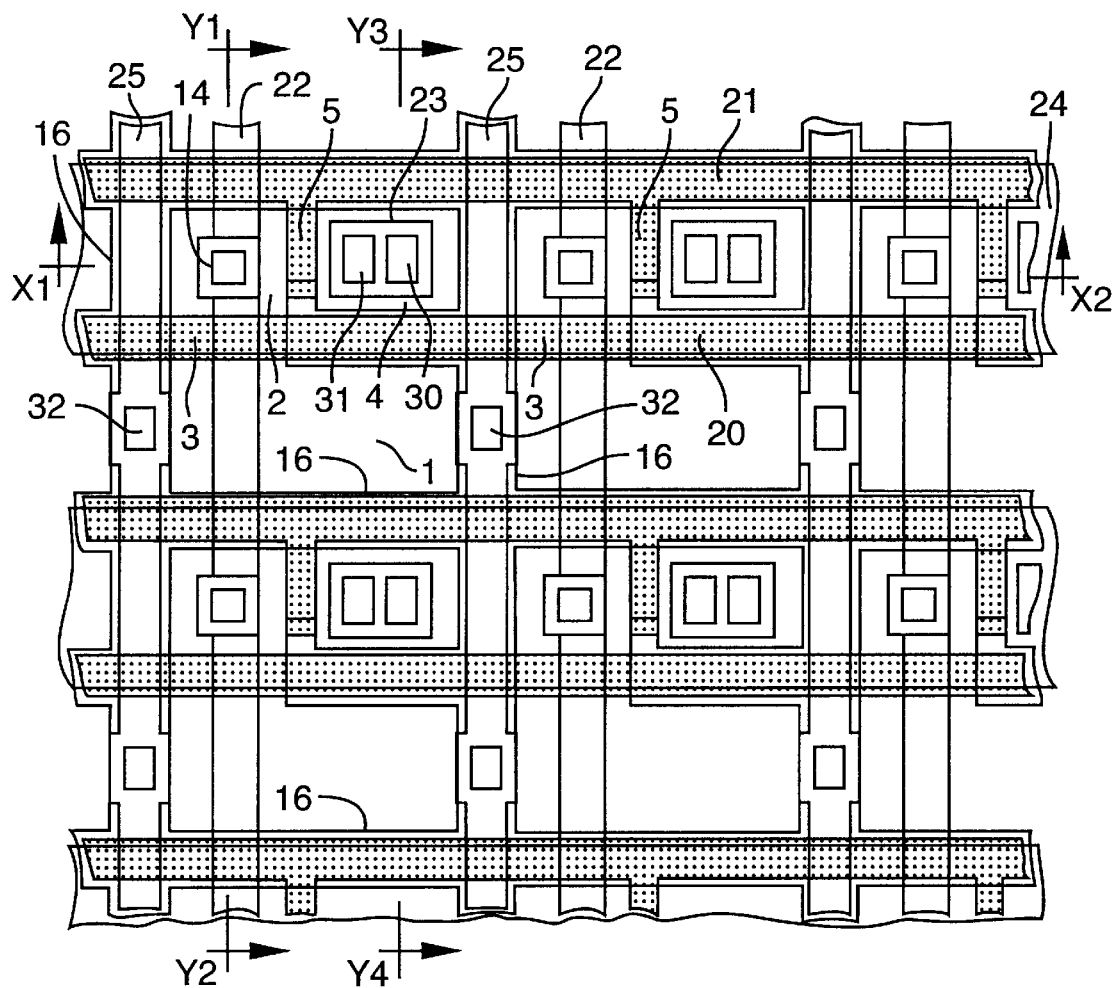
FIG. 49 (prior art) is a plan view of a conventional photoelectric conversion apparatus employing the photoelectric conversion device of FIGS. 45–48.
Figure 50:
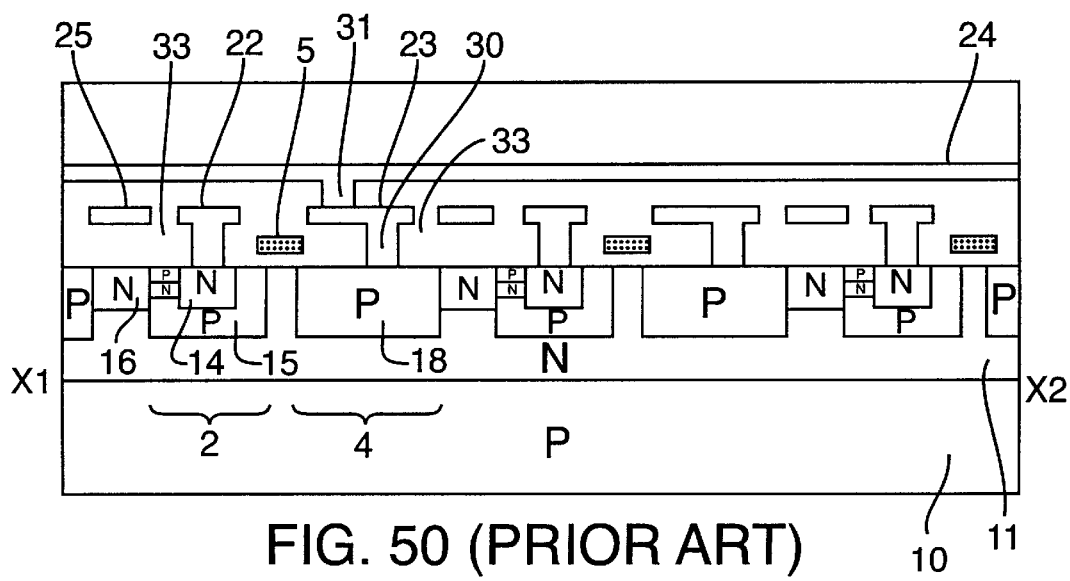
FIG. 50 (prior art) is a cross-sectional view taken along the X1-X2 line shown in FIG. 49.
Figure 51:
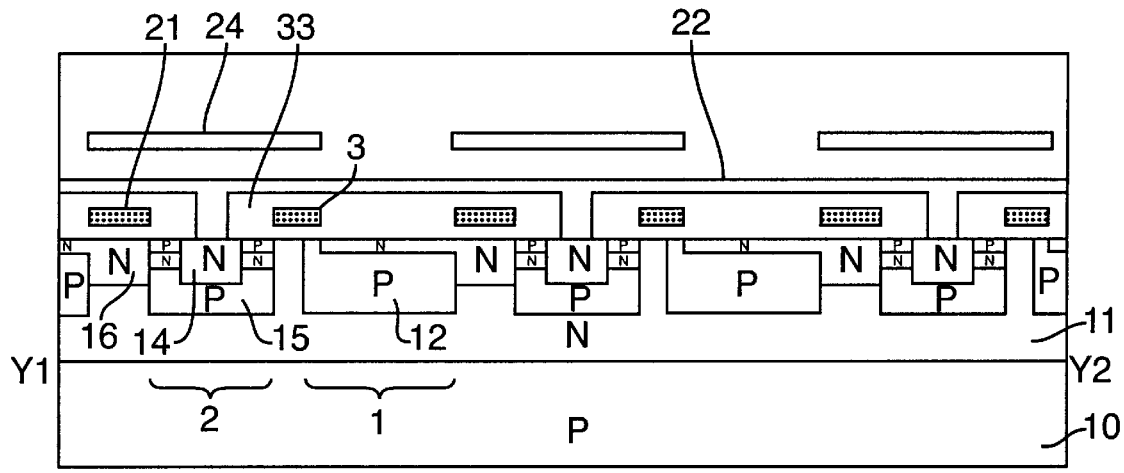
FIG. 51 (prior art) is a cross-sectional view taken along the Y1-Y2 line shown in FIG. 49.
Figure 52:
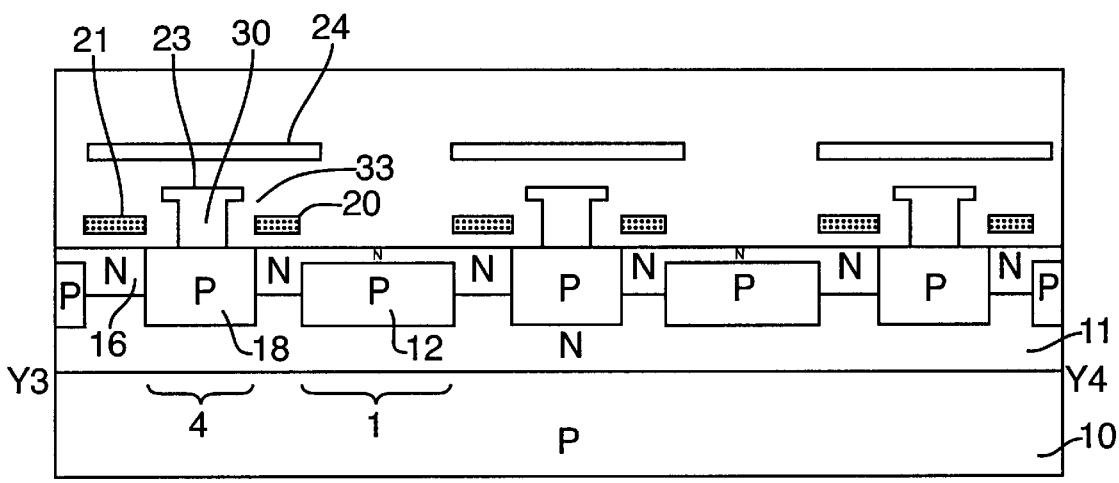
FIG. 52 (prior art) is a cross-sectional view taken along the Y3-Y4 line shown in FIG. 49.
Figure 53:
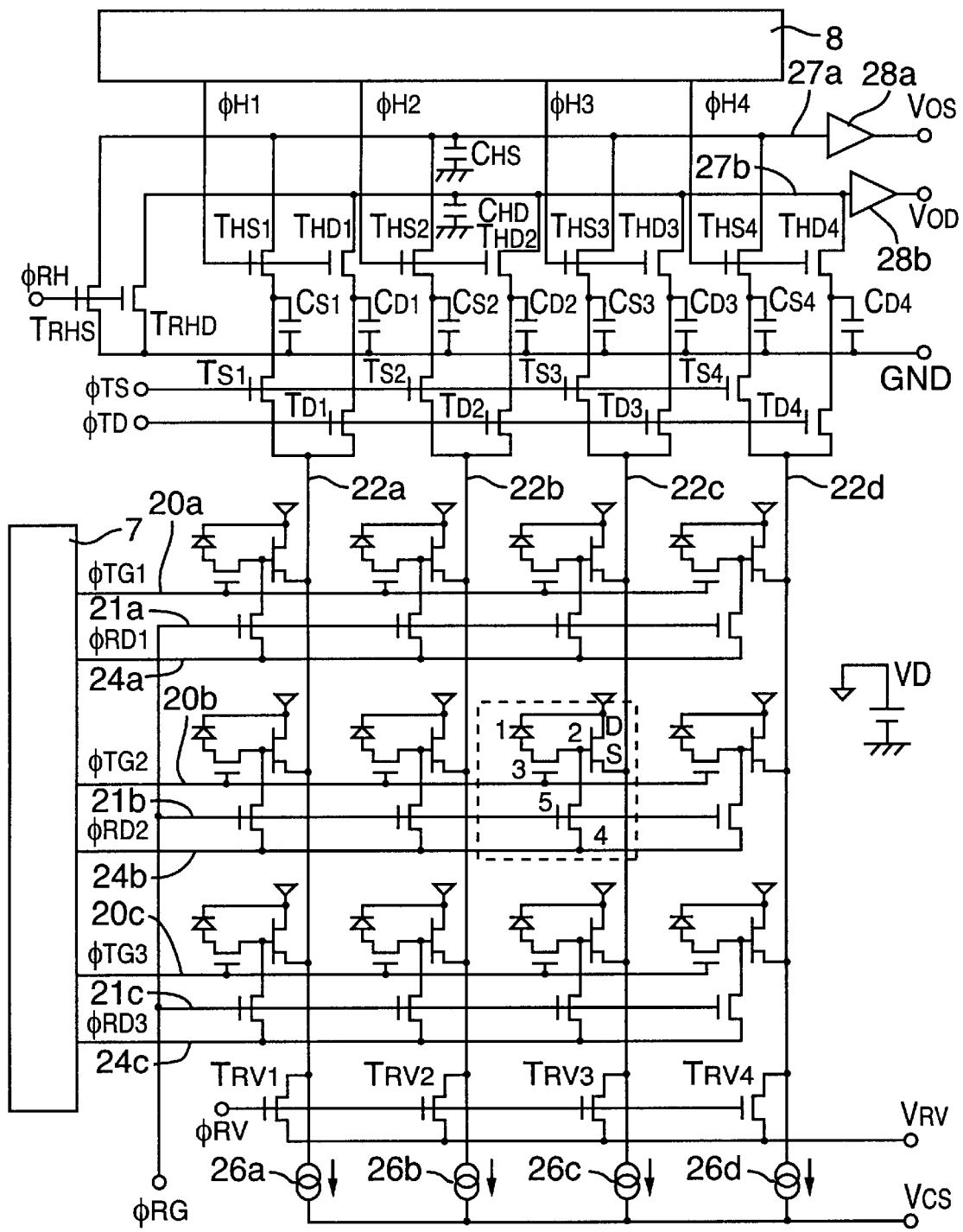
FIG. 53 (prior art) is a circuit diagram of the conventional photoelectric conversion apparatus of FIGS. 49–52.
Figure 54:
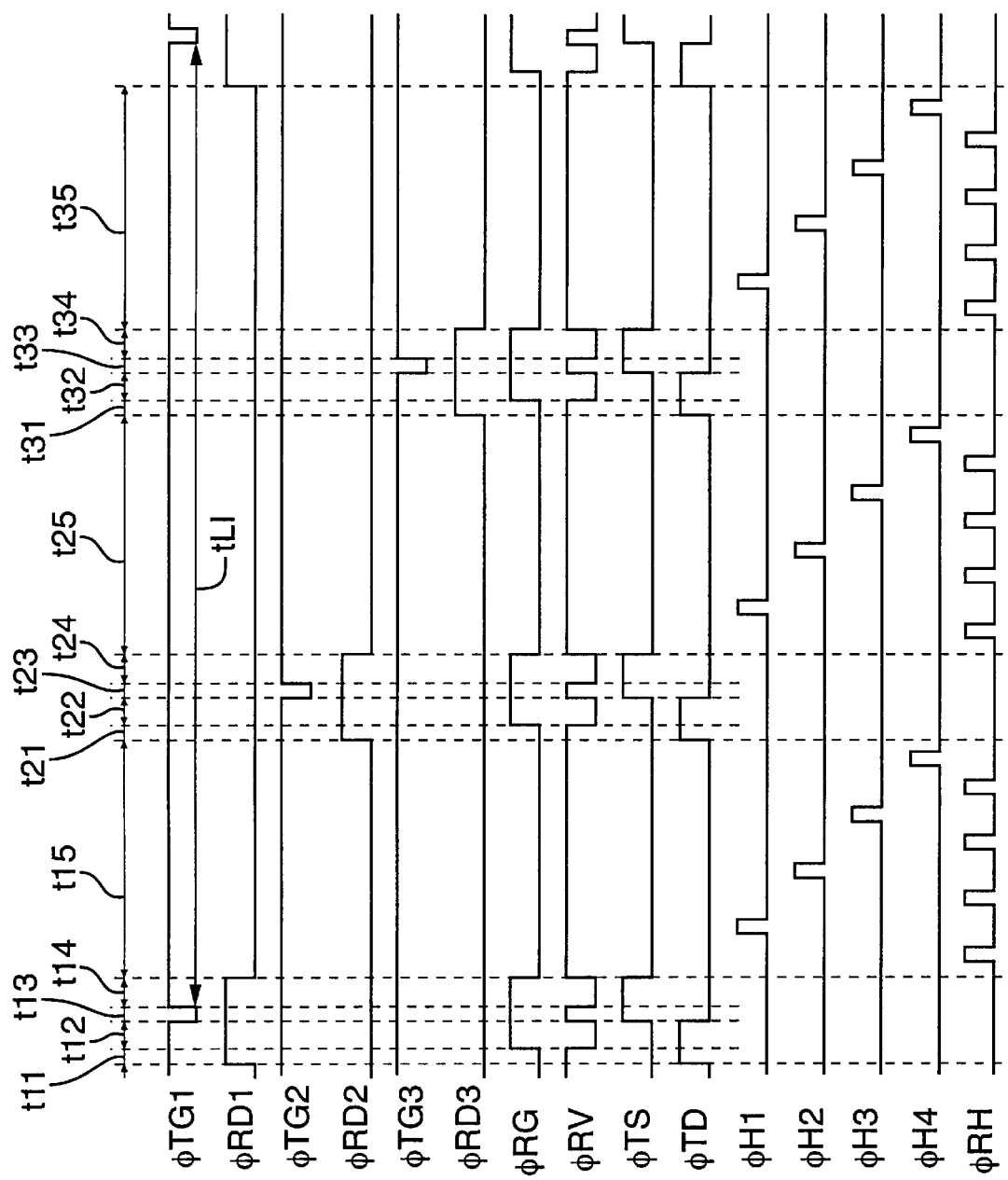
FIG. 54 (prior art) is a timing chart illustrating the operation of the conventional photoelectric conversion device shown in FIG. 53.
Figure 55:
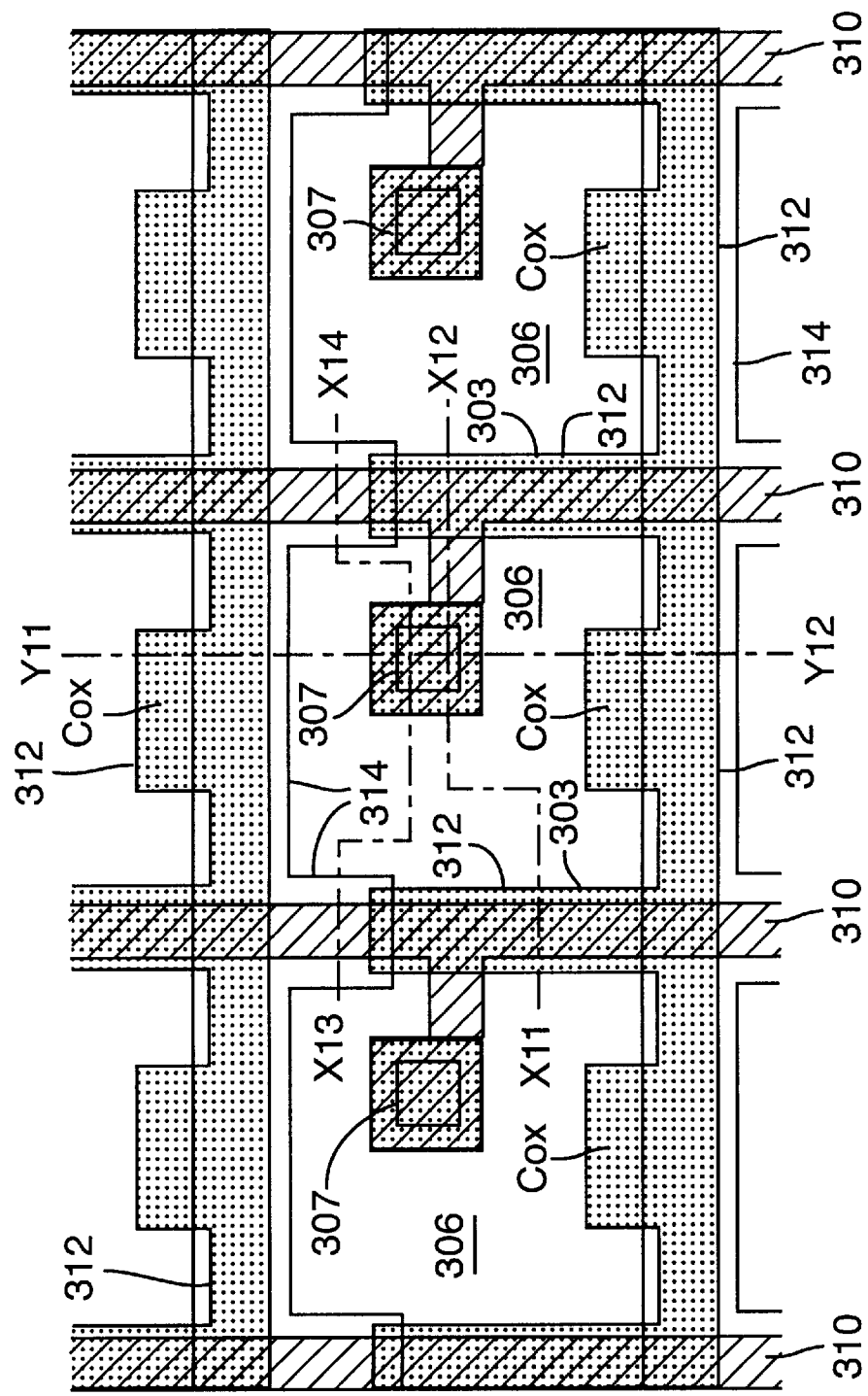
FIG. 55 (prior art) is a plan view of a conventional bipolar solid-state image sensor.

FIG. 43 is a plan view of a bipolar photoelectric conversion apparatus (solid-state image sensor) according to a tenth illustrative embodiment of the invention. FIG. 44 is a cross-sectional view taken along the X13-X14 line shown in FIG. 43. The same elements as those in the conventional example shown in FIGS. 55 through 58 are denoted by the same numerical symbols, and the explanation for them will be omitted.

Figure 56:
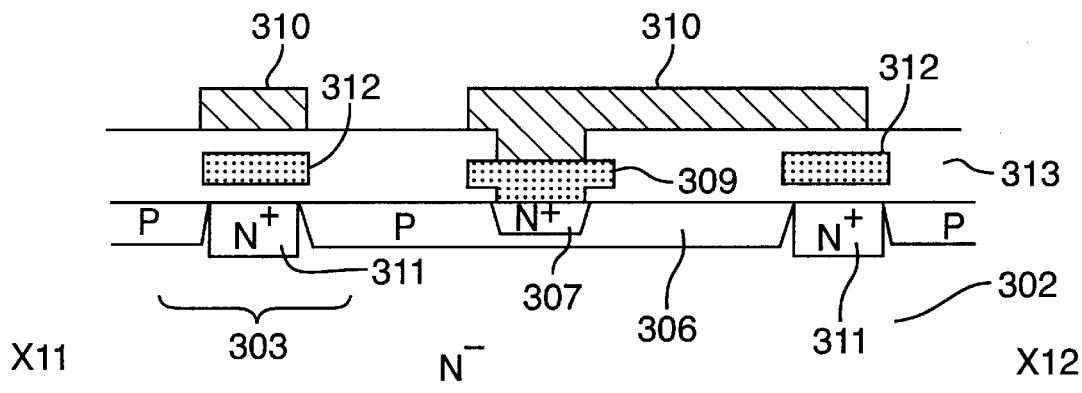
FIG. 56 (prior art) is a cross-sectional view taken along the X11-X12 line shown in FIG. 55.
Figure 57:
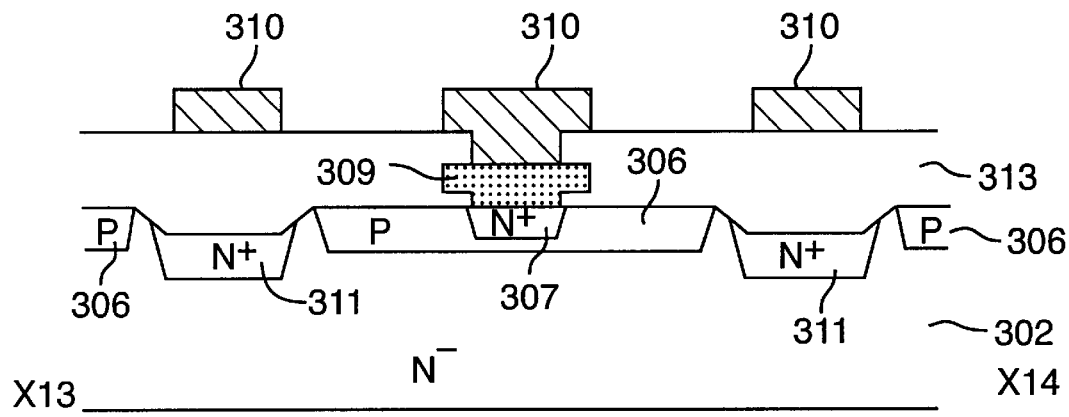
FIG. 57 (prior art) is a cross-sectional view taken along the X13-X14 line shown in FIG. 55.
Figure 58:
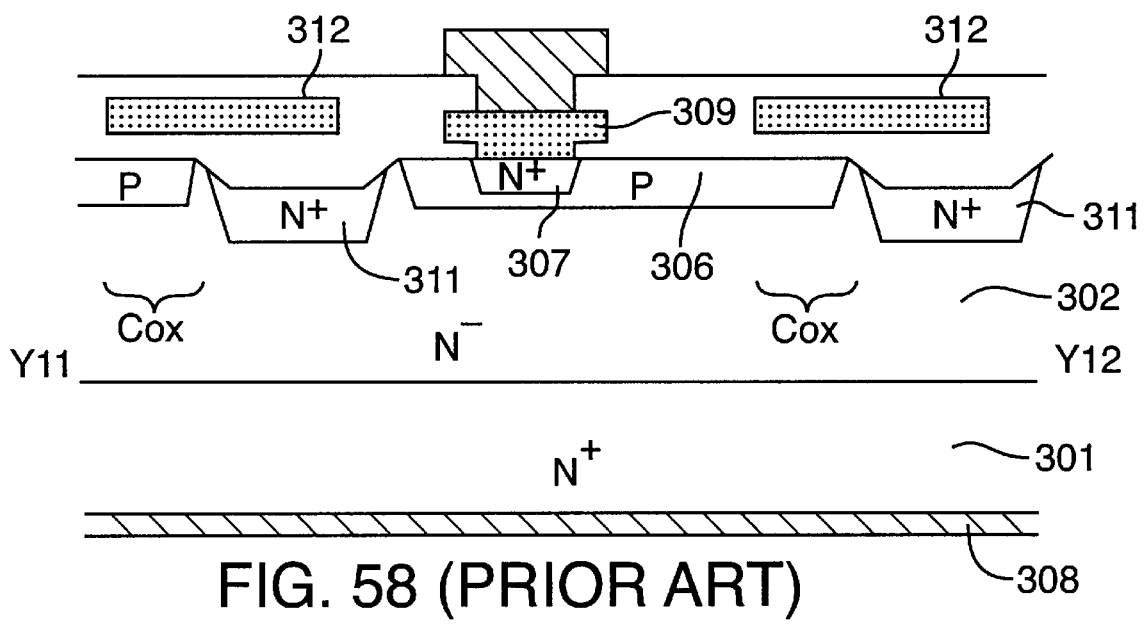
FIG. 58 (prior art) is a cross-sectional view taken along the Y11-Y12 line shown in FIG. 55.
Figure 59:
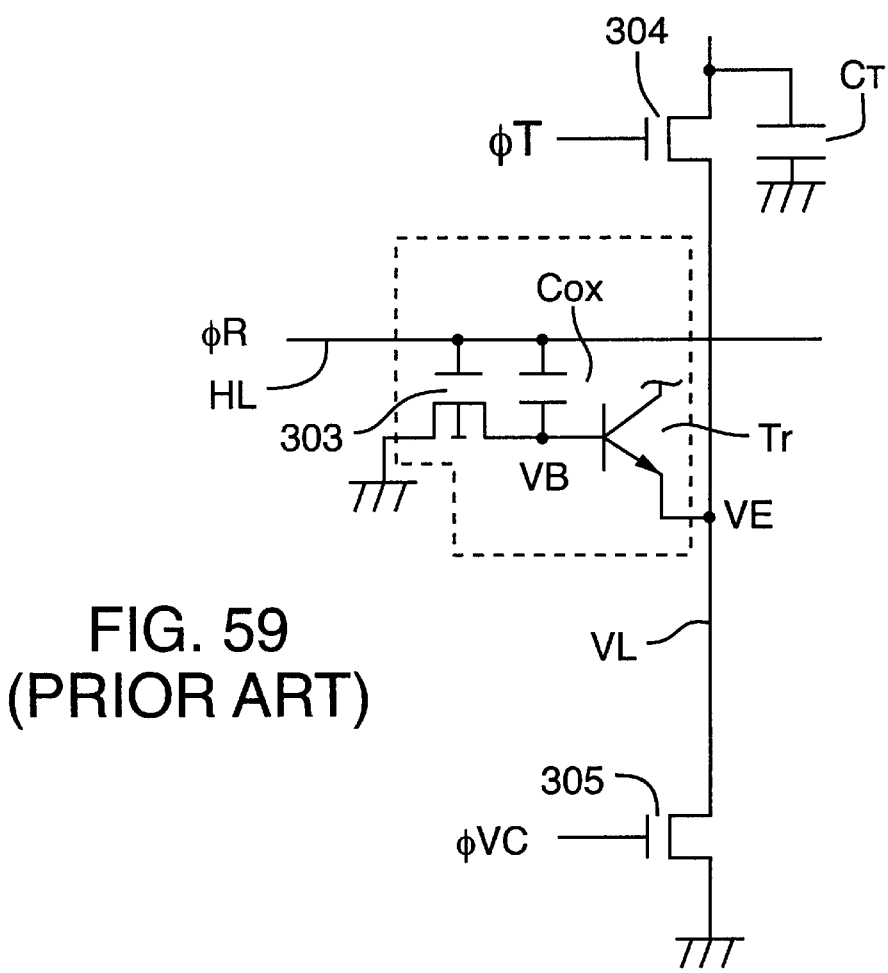
FIG. 59 (prior art) is a circuit diagram showing the basic structures of the pixel and the readout circuit of the conventional solid-state image sensor.

The cross-sectional view taken along the X11-X12 line shown in FIG. 43 is identical to FIG. 56. The cross-sectional view taken along the Y11-Y12 line shown in FIG. 43 is identical to FIG. 58 (except for the pixel-separating regions 210). The circuit diagram showing the basic structure of the pixel and the readout circuit used in the solid-state image sensor of this embodiment is identical to FIG. 59.

The distinctive feature of this embodiment is that pixel-separating regions 210 are formed between pixels so as to surround each pixel (except for in the area of PMOSFET 303), in place of the high-density N-type diffusion regions 311 which are used as pixel-separating regions in the conventional bipolar solid-state image sensor.

The pixel-separating region 210 consists of polysilicon 112 containing an N-type impurity, and an N-type diffusion layer 113, both of which are filled in the trench 111, similarly to the pixel-separating region 110 shown in FIG. 37. The pixel-separating region 210 may have the same structure as that shown in any of FIGS. 38, 39 and 40.

The pixel-separating region 210 can reduce the crosstalk between pixels (i.e., can achieve perfect pixel separation) and, at the same time, it can reduce the resistance between the N-type semiconductor substrate 301 and the surface area of the N-type semiconductor layer 302.

The bipolar transistor Tr is activated by a voltage supplied via the higher-density N-type semiconductor substrate 301 and the lower-density N-type semiconductor layer 302, in this order, as in the conventional bipolar solid-state image sensor shown in FIGS. 55–58. The resistance between the N-type semiconductor substrate 301 and the surface area of the N-type semiconductor layer 302 is reduced by the pixel-separating regions 210. The electric potential applied is thus sufficiently transferred to the N-type semiconductor layer 302 from the substrate 301, even if the impurity concentration of the N-type semiconductor layer 302 is lowered. Consequently, the bipolar transistor Tr achieves high performance without increased variation, giving both high performance and high quality (high production yield). The pixel-separating regions 210 also allow the impurity concentration of the N-type semiconductor layer 302 to be reliably decreased in order to increase the sensitivity to long wavelengths, while reducing the crosstalk between pixels.

Having illustrated and demonstrated the principles of the invention above, it should be apparent to those skilled in the art that the illustrative embodiments of the invention can be modified in arrangement and detail without departing from such principles. For example, the P-type and the N-type regions may be reversed. The invention is thus not limited to the illustrative embodiments, but includes all that comes within the literal or equivalence scope of the following claims.

What is claimed is:

1. A photoelectric conversion device, comprising:
    (a) a first conductive-type semiconductor substrate and a first conductive-type semiconductor layer formed on said substrate;
    (b) a photodiode having a second conductive-type charge-accumulation region formed in the first conductive-type semiconductor layer and structured and arranged to generate and accumulate an electric charge in response to incident light;
    (c) a junction field-effect transistor having
        (i) a second conductive-type gate region formed in the first conductive-type semiconductor layer,
        (ii) a first conductive-type source region formed in the gate region,
        (iii) a first conductive-type channel region formed in the gate region, and
        (iv) a first conductive-type drain region formed in the first conductive-type semiconductor layer and electrically connected to the first conductive-type semiconductor substrate,
    the junction field-effect transistor being structured and arranged so as to output a signal corresponding to the electric charge received by the gate region from the photodiode;
    (d) a transfer gate having a gate electrode formed above the first conductive-type semiconductor layer separated therefrom by an insulating film and structured and arranged so as to be able to transfer the electric charge generated and accumulated by the photodiode to the gate region of the junction field-effect transistor;
    (e) a reset drain having a second conductive-type charge-drain region formed in the first conductive-type semiconductor layer and structured and arranged so as both to drain an excess electric charge generated by the photodiode and to control an electric potential of the gate region of the junction field-effect transistor;
    (f) a first overflow-control region formed in a boundary region between the charge-accumulation region of the photodiode and the charge-drain region of the reset drain in the first conductive-type semiconductor layer and structured and arranged so as to guide the excess electric charge generated by the photodiode to the charge-drain region of the reset drain; and
    (g) a first reset gate having a gate electrode formed above the first conductive-type semiconductor layer, separated therefrom by an insulating film, and structured and arranged so as to control the electric connection between the gate region of the junction field-effect transistor and the charge-drain region of the reset drain.

2. The photoelectric conversion device of claim 1, wherein said first conductive-type semiconductor substrate is a high-density first conductive-type semiconductor substrate.

3. The photoelectric conversion device of claim 1, wherein the photodiode is a buried photodiode, the device further comprising a high-density first conductive-type semiconductor layer extending so as to cover the top surface of the second conductive-type charge-accumulation region of the photodiode and the top surface of an area of the first conductive-type semiconductor layer surrounding the photodiode, and wherein the overflow-control region is a first or second conductive-type semiconductor region positioned within the first conductive-type semiconductor layer.

4. A photoelectric conversion apparatus, comprising a plurality of the photoelectric conversion devices of claim 3, arranged in a two-dimensional pixel matrix comprising rows extending in a horizontal scanning direction and columns extending in a vertical scanning direction, each device being a pixel in the pixel matrix, the apparatus further comprising:
    (a) a plurality of vertical signal lines, each being connected to the pixels in one of the columns of the pixel matrix so as to receive, from each pixel in the one of the columns, the signal output from the junction field-effect transistor of the respective pixel;
    (b) a vertical scanning circuit, electrically connected to each pixel of the pixel matrix and structured and arranged so as to
        (i) select any one specific row of the pixel matrix and
        (ii) cause the respective pixels in the specific row to output the signal from the respective junction field-effect transistor to the respective vertical signal line; and
    (c) a horizontal scanning circuit electrically connected to the vertical signal lines and structured and arranged so as to successively scan the vertical signal lines in the horizontal direction and to transfer each signal from the scanned vertical lines to an associated horizontal signal line.

5. The photoelectric conversion apparatus of claim 4, wherein (a) the first conductive-type semiconductor substrate is a first conductive-type higher-density semiconductor substrate,
    (b) the first conductive-type semiconductor layer is a first conductive-type lower-density semiconductor layer formed on the first-conductive type higher-density semiconductor substrate, the first conductive-type lower-density semiconductor layer together with the first-conductive type higher-density semiconductor substrate constituting a base,
    (c) the junction field-effect transistor included in each pixel is activated by a voltage applied to the first conductive type drain region via the first conductive-type higher-density semiconductor substrate and the first conductive type lower-density semiconductor layer, in this order, and
    (d) the apparatus further comprises filled trenches between any two adjacent pixels, the trenches extending downward into the base from the top surface of the first conductive-type lower-density semiconductor layer, each of the filled trenches being filled with one or more materials so as both to reduce a resistance between the first conductive-type higher-density semiconductor substrate and the first conductive-type drain region of the junction field-effect transistor, and to reduce crosstalk between pixels.

6. The photoelectric conversion apparatus of claim 4, wherein
(a) each pixel further comprises a second overflow-control region,
(b) the charge-accumulation regions of the photodiodes and the charge-drain regions of the reset drains of the photoelectric conversion devices in each column of the pixel matrix alternate in the vertical scanning direction, with a boundary region between each charge-accumulation region and adjacent charge-drain region, and
(c) each first overflow-control region is positioned, within its respective pixel, in the boundary region located between the charge-accumulation region of its respective pixel and the charge-drain region of its respective pixel, and each second overflow-control region is positioned in the boundary region between the charge-accumulation region of one pixel and the charge-drain region of another pixel.

7. A photoelectric conversion apparatus, comprising a plurality of the photoelectric conversion devices of claim 3, arranged in a two-dimensional pixel matrix comprising rows extending in a horizontal scanning direction and columns extending in a vertical scanning direction, each device being a pixel in the pixel matrix, each device further comprising a second reset gate, wherein:
(a) the gate regions of the junction field-effect transistors and the charge-drain regions of the reset drains of the photoelectric conversion devices in each row of the pixel matrix alternate in the horizontal scanning direction, with boundary regions between each of the gate regions and the adjacent charge-drain regions;
(b) each first reset gate is positioned, within its respective pixel, above the boundary region located between the gate region of the junction field-effect transistor of its respective pixel and the charge-drain region of the reset drain of its respective pixel, and each second reset gate is positioned above the boundary region between the gate region of the junction field-effect transistor of one pixel and the charge-drain region of the reset drain of another pixel;
(c) the first and second reset gates in each row are connected in common by a reset gate interconnection in at least the horizontal scanning direction; and
(d) at least some of the charge-drain regions of the reset drains in each row are connected in common by a reset drain interconnection in the horizontal scanning direction.

8. The photoelectric conversion apparatus of claim 7, further comprising an insulating film extending over the reset drains of the pixels, and wherein contact holes are formed in the insulating film over the reset drains, the contact holes being formed over less than all of the reset drains in each row, the less than all reset drains being connected in common to the reset drain interconnection via the contact holes.

9. The photoelectric conversion apparatus of claim 8, wherein the total number of the less than all reset drains in each row is in the range of about ½ to about 1/20 of the reset drains in each row.

10. The photoelectric conversion apparatus of claim 7, wherein
(a) each pixel further comprises a second overflow-control region,
(b) the charge-accumulation regions of the photodiodes and the charge-drain regions of the reset drains of the photoelectric conversion devices in each column of the pixel matrix alternate in the vertical scanning direction, with a boundary region between each charge-accumulation region and adjacent charge-drain region, and
(c) each first overflow-control region is positioned, within its respective pixel, in the boundary region located between the charge-accumulation region of its respective pixel and the charge-drain region of its respective pixel, and each second overflow-control region is positioned in the boundary region between the charge-accumulation region of one pixel and the charge-drain region of another pixel.

11. A photoelectric conversion apparatus, comprising a plurality of the photoelectric conversion devices of claim 1, arranged in a two-dimensional pixel matrix having rows extending in a horizontal scanning direction and columns extending in a vertical scanning direction, each device being a pixel in the pixel matrix, the apparatus further comprising:
(a) a plurality of vertical signal lines, each being connected to the pixels in one of the columns of the pixel matrix so as to receive, from each pixel in the one of the columns, the signal output from the junction field effect transistor of the respective pixel;
(b) a vertical scanning circuit, electrically connected to each pixel of the pixel matrix and structured and arranged so as to
  (i) select any one specific row of the pixel matrix and
  (ii) cause the respective pixels in the specific row to output the signal from the junction field-effect transistor to the respective vertical signal line; and
(c) a horizontal scanning circuit electrically connected to the vertical signal lines and structured and arranged so as to be able to successively scan the vertical signal lines in the horizontal direction and to transfer each signal from the scanned vertical lines to an associated horizontal signal line.

12. The photoelectric conversion apparatus of claim 11, wherein
(a) the first conductive-type semiconductor substrate is a first conductive-type higher-density semiconductor substrate,
(b) the first conductive-type semiconductor layer is a first conductive-type lower-density semiconductor layer formed on the first-conductive type higher-density semiconductor substrate, the first conductive-type lower-density semiconductor layer together with the first-conductive type higher-density semiconductor substrate constituting a base,
(c) the junction field-effect transistor included in each pixel is activated by a voltage applied to the first conductive-type drain region via the first conductive-type higher-density semiconductor substrate and the first conductive type lower-density semiconductor layer, in this order, and
(d) the apparatus further comprises filled trenches between any two adjacent pixels, the trenches extending downward into the base from the top surface of the first conductive-type lower-density semiconductor layer, each of the filled trenches being filled with one or more materials so as both to reduce the resistance between the first conductive-type higher-density semiconductor substrate and the first conductive-type drain region of the junction field-effect transistor, and to reduce crosstalk between pixels.

13. The photoelectric conversion apparatus of claim 11, wherein
   (a) each pixel further comprises a second overflow-control region,
   (b) the charge-accumulation regions of the photodiodes and the charge-drain regions of the reset drains of the photoelectric conversion devices in each column of the pixel matrix alternate in the vertical scanning direction, with a boundary region between each charge-accumulation region and adjacent charge-drain region, and
   (c) each first overflow-control region is positioned, within its respective pixel, in the boundary region located between the charge-accumulation region of its respective pixel and the charge-drain region of its respective pixel, and each second overflow-control region is positioned in the boundary region between the charge-accumulation region of one pixel and the charge-drain region of another pixel.

14. A photoelectric conversion apparatus, comprising a plurality of the photoelectric conversion devices of claim 1, arranged in a two-dimensional pixel matrix having rows extending in a horizontal scanning direction and columns extending in a vertical scanning direction, each device being a pixel in the pixel matrix, each device further comprising a second reset gate, wherein:
   (a) the gate regions of the junction field-effect transistors and the charge-drain regions of the reset drains of the photoelectric conversion devices in each row of the pixel matrix alternate in the horizontal scanning direction, with boundary regions between each of the gate regions and the adjacent charge-drain regions;
   (b) each first reset gate is positioned, within its respective pixel, above the boundary region located between the gate region of the junction field-effect transistor of its respective pixel and the charge-drain region of the reset drain of its respective pixel, and each second reset gate is positioned above the boundary region between the gate region of the junction field-effect transistor of one pixel and the charge-drain region of the reset drain of another pixel;
   (c) the first and second reset gates in each row are connected in common by a reset gate interconnection in at least the horizontal scanning direction; and
   (d) at least some of the charge-drain regions of the reset drains in each row are connected in common by a reset drain interconnection in the horizontal scanning direction.

15. The photoelectric conversion apparatus of claim 14, further comprising an insulating film extending over the reset drains of the pixels, and wherein contact holes are formed in the insulating film over the reset drains, the contact holes being formed over less than all of the reset drains in each row, the less than all reset drains being connected in common to the reset drain interconnection via the contact holes.

16. The photoelectric conversion apparatus of claim 15, wherein the total number of the less than all reset drains in each row is in a range of about ½ to about 1/20 of the reset drains in each row.

17. The photoelectric conversion apparatus of claim 14, wherein
   (a) each pixel further comprises a second overflow-control region,
   (b) the charge-accumulation regions of the photodiodes and the charge-drain regions of the reset drains of the photoelectric conversion devices in each column of the pixel matrix alternate in the vertical scanning direction, with a boundary region between each charge-accumulation region and adjacent charge-drain region, and
   (c) each first overflow-control region is positioned, within its respective pixel, in the boundary region located between the charge-accumulation region of its respective pixel and the charge-drain region of its respective pixel, and each second overflow-control region is positioned in the boundary region between the charge-accumulation region of one pixel and the charge-drain region of another pixel.

* * * * *

UNITED STATES PATENT AND TRADEMARK OFFICE
CERTIFICATE OF CORRECTION

PATENT NO. : 6,188,093 B1
DATED : February 13, 2001
INVENTOR(S) : Tadao Isogai and Satoshi Suzuki It is certified that error appears in the above-identified patent and that said Letters Patent is hereby corrected as shown below:

<u>Column 5,</u>
Line 62, change "ϕTGL" to -- ϕTG1 --.

<u>Column 6,</u>
Line 54, change "substraction" to -- subtraction --.

<u>Column 9,</u>
Line 43, change "PMOSPET" to -- PMOSFET --

<u>Column 11,</u>
Line 38, change "rest" to -- reset --
Line 47, change "will described " to -- will be described --.

<u>Column 18,</u>
Line 19, change "higher density" to -- higher-density --.

<u>Column 20,</u>
Line 49, change "rain" to -- drain --.

<u>Column 28,</u>
Line 53, change "till" to -- t11 --.

<u>Column 29,</u>
Line 49, change "tLI" to -- t11 --.

<u>Column 36</u>
Line 67, change "FETs 2." to -- JFETs 2. --.

UNITED STATES PATENT AND TRADEMARK OFFICE
CERTIFICATE OF CORRECTION

PATENT NO. : 6,188,093 B1
DATED : February 13, 2001
INVENTOR(S) : Tadao Isogai and Satoshi Suzuki It is certified that error appears in the above-identified patent and that said Letters Patent is hereby corrected as shown below:

Column 43,
Line 24, change "mask. (FIG. 41(a))" to -- mask (FIG. 41(a)). --.
Line 38, change "114. (FIG. 41(c))" to -- 114 (FIG. 41(c)). --.
Line 39, change "VD" to -- CVD --.
Line 47, change CMP. (FIG. 42(b))" to -- CMP (FIG. 42(b)). --.

Signed and Sealed this

Eleventh Day of June, 2002

*Attest:*

JAMES E. ROGAN
*Attesting Officer*        Director of the United States Patent and Trademark Office